United States Patent
Ishibashi et al.

(10) Patent No.: US 11,430,961 B2
(45) Date of Patent: Aug. 30, 2022

(54) IRIDIUM COMPLEX COMPOUND, AND COMPOSITION, ORGANIC ELECTROLUMINESCENT ELEMENT, DISPLAY DEVICE, AND LIGHTING DEVICE EACH CONTAINING THE COMPOUND

(71) Applicant: MITSUBISHI CHEMICAL CORPORATION, Chiyoda-ku (JP)

(72) Inventors: Koichi Ishibashi, Kanagawa (JP); Kazuhiro Nagayama, Kanagawa (JP); Hideji Komatsu, Kanagawa (JP); Koichiro Iida, Kanagawa (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 173 days.

(21) Appl. No.: 14/616,810

(22) Filed: Feb. 9, 2015

(65) Prior Publication Data

US 2015/0155502 A1  Jun. 4, 2015

Related U.S. Application Data

(63) Continuation of application No. PCT/JP2013/071277, filed on Aug. 6, 2013.

(30) Foreign Application Priority Data

Aug. 8, 2012 (JP) .............................. JP2012-176097
Sep. 6, 2012 (JP) .............................. JP2012-196543

(51) Int. Cl.
*H01L 51/00* (2006.01)
*C09K 11/06* (2006.01)
(Continued)

(52) U.S. Cl.
CPC ...... *H01L 51/0085* (2013.01); *C07F 15/0033* (2013.01); *C09K 11/025* (2013.01);
(Continued)

(58) Field of Classification Search
CPC ... C07F 15/0033; C09K 11/06; C09K 11/025; H01L 27/32; H01L 51/5012; H01L 51/0085
See application file for complete search history.

(56) References Cited

U.S. PATENT DOCUMENTS

2006/0127696 A1  6/2006  Stossel et al.
2007/0122655 A1*  5/2007  Deaton ................. C09K 11/06
                                                            428/690
(Continued)

FOREIGN PATENT DOCUMENTS

CN  101679468   3/2010
CN  101899296   12/2010
(Continued)

OTHER PUBLICATIONS

Japanese Office Action dated Apr. 7, 2015 in Patent Application No. 2014-529515 (with English Translation).
(Continued)

*Primary Examiner* — Alexander C Kollias
(74) *Attorney, Agent, or Firm* — Oblon, McClelland, Maier & Neustadt, L.L.P.

(57) ABSTRACT

The object of the present invention is to provide an iridium complex compound emitting red light, a composition comprising the iridium complex compound and a solvent, an organic electroluminescent element which is produced using the compound or the composition and has a long driving life and an excellent electronic durability, and a display device and lighting device using the organic electroluminescent element. The present invention relates to an iridium complex compound solvent having a 2-phenyl quinazoline framework and a specific substituent.

14 Claims, 1 Drawing Sheet

(51) Int. Cl.
*C07F 15/00* (2006.01)
*C09K 11/02* (2006.01)
*H01L 27/32* (2006.01)
*H01L 51/50* (2006.01)

(52) U.S. Cl.
CPC .............. *C09K 11/06* (2013.01); *H01L 27/32* (2013.01); *H01L 51/5012* (2013.01); *C09K 2211/1007* (2013.01); *C09K 2211/1029* (2013.01); *C09K 2211/1033* (2013.01); *C09K 2211/1037* (2013.01); *C09K 2211/1044* (2013.01); *C09K 2211/185* (2013.01); *H01L 51/5016* (2013.01)

(56) References Cited

U.S. PATENT DOCUMENTS

| | | | |
|---|---|---|---|
| 2008/0280163 A1 | 11/2008 | Kwong et al. | |
| 2009/0039776 A1 | 2/2009 | Yamada et al. | |
| 2009/0134785 A1 | 5/2009 | Kamatani et al. | |
| 2013/0116755 A1 | 5/2013 | Anemian et al. | |
| 2014/0319505 A1 | 10/2014 | Nagayama et al. | |
| 2014/0350642 A1* | 11/2014 | Anemian | C07F 15/0033 607/88 |
| 2015/0171348 A1* | 6/2015 | Stoessel | H05B 33/10 252/301.16 |
| 2015/0232749 A1* | 8/2015 | Anemain | C09K 11/06 604/20 |

FOREIGN PATENT DOCUMENTS

| | | |
|---|---|---|
| CN | 101899296 A | 12/2010 |
| CN | 102498121 | 6/2012 |
| CN | 102503986 A | 6/2012 |
| CN | 104053664 | 9/2014 |
| JP | 2006-290781 A | 10/2006 |
| JP | 2006-306807 A | 11/2006 |
| JP | 2009-23938 A | 2/2009 |
| JP | 2009-132627 A | 6/2009 |
| JP | 2010-526902 A | 8/2010 |
| JP | 2010-202644 A | 9/2010 |
| JP | 2011-136947 A | 7/2011 |
| JP | 2012-6878 A | 1/2012 |
| JP | 2012-77043 A | 4/2012 |
| JP | 5459447 B2 | 4/2014 |
| WO | WO 2004/026886 A2 | 4/2004 |
| WO | WO 2009/011447 A2 | 1/2009 |
| WO | WO 2011/032626 A1 | 3/2011 |
| WO | WO 2012/007103 A1 | 1/2012 |

OTHER PUBLICATIONS

Office Action dated May 7, 2015 in Japanese Patent Application No. 2014-250917 (with English language translation).
Notification of Reasons for Refusal dated Jul. 7, 2015 in Japanese Patent Application No. 2014-529515 (with English language translation).
Extended European Search Report dated Jul. 2, 2015 in Patent Application No. 13827851.0.
Combined Chinese Office Action and Search Report dated Apr. 22, 2016 in Patent Application No. 201380042037.4 (with English language translation).
Ling-Xia Wang, et al., "Application of Fused-Heterocyclic Compounds in Red Phosphorescent Iridium(III) Complexes", Acta Phys.— Chim. Sin., vol. 28, No. 7, 2012, pp. 1556-1569, with English Abstract.
Combined Office Action and Search Report dated Dec. 13, 2016 in Taiwanese Patent Application No. 102128440 (with English language translation).
Office Action dated Dec. 23, 2016 in Chinese Patent Application No. 201380042037.4 (with English language translation).
U.S. Appl. No. 14/330,442, filed Jul. 14, 2014, US2014/0319505 A1, Nagayama, et al.
International Search Report dated Nov. 12, 2013 in PCT/JP2013/071277 (with English Translation).
Qunbo Mei et al., "A Highly Efficient Red Electrophosphorescent Iridium(III) Complex Containing Phenyl Quinazoline Ligand in Polymer Light-Emitting Diodes", Journal of Materials Chemistry, vol. 22, 2012, pp. 6878-6884.
Nai-Mu Hsu et al., "Accelerated Discovery of Red-Phosphorescent Emitters through Combinatorial Organometallic Synthesis and Screening", Angew. Chem. Int. Ed., 45, 2006, pp. 4138-4142.
Office Action dated May 25, 2018 in corresponding Chinese Patent Application No. 201380042037.4 (with English Translation), 20 pages.
A Reexamination Decision dated Dec. 6, 2019 in the corresponding Chinese application or patent No. 201380042037.4 with English translation.
Office Action dated Mar. 11, 2019 in Chinese Patent Application No. 201710736388.5 (with English translation), filed Aug. 6, 2013.
Office Action dated Nov. 20, 2019 in Korean Patent Application No. 10-2015-7003126 (with unedited computer generated English translation).
Office Action dated Dec. 26, 2019 in Chinese Patent Application No. 201710736388.5 (with unedited computer generated English translation), 15 pages.
Office Action as received in the corresponding Chinese Patent Application No. 201710736388.5 w/Computer generated English Translation dated Jun. 2, 2020, 17 pages.
Office Action as received in the corresponding CN patent application No. 201710736888.5 dated Nov. 25, 2020 w/English Translation, 17 pages.

* cited by examiner

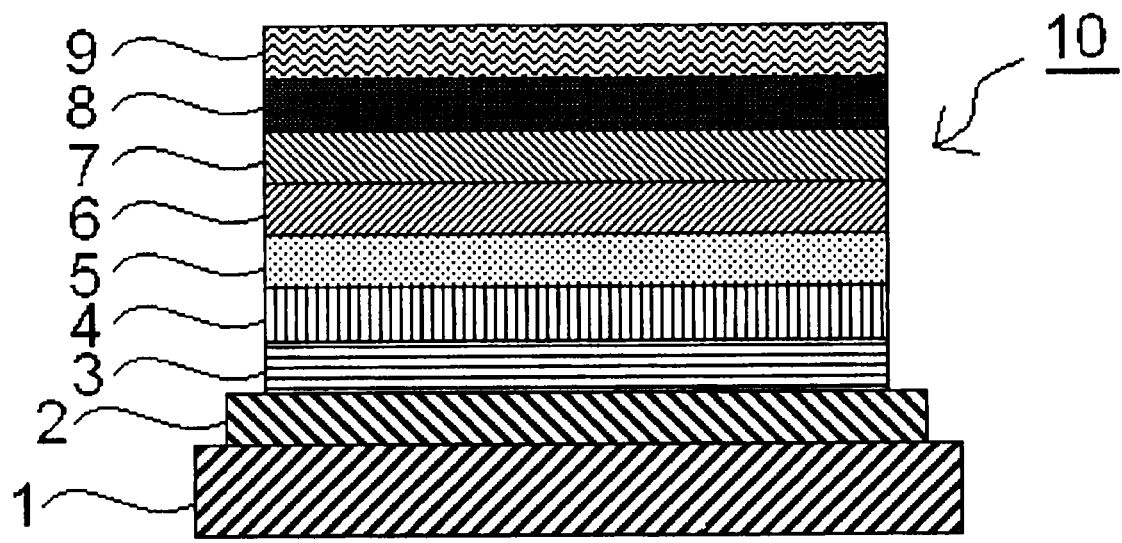

IRIDIUM COMPLEX COMPOUND, AND COMPOSITION, ORGANIC ELECTROLUMINESCENT ELEMENT, DISPLAY DEVICE, AND LIGHTING DEVICE EACH CONTAINING THE COMPOUND

CROSS-REFERENCE TO RELATED APPLICATIONS

This application is a Continuation of PCT/JP2013/071277, which was filed on Aug. 6, 2013. This application is based upon and claims the benefit of priority to Japanese Application No. 2012-176097, which was filed on Aug. 8, 2012, and to Japanese Application No. 2012-196543, which was filed on Sep. 6, 2012, the contents of which are incorporated herein by reference.

TECHNICAL FIELD

The present invention relates to an iridium complex compound. The invention relates to an iridium complex compound which emits red light, a composition and an organic electroluminescent element which each contain the compound, and a display device and a lighting device which each include the organic electroluminescent element.

BACKGROUND ART

In recent years, various electronic devices which utilize organic electroluminescent elements (hereinafter often referred to as "organic EL elements"), such as organic-EL illuminators and organic-EL displays, are being put to practical use. Organic EL elements not only can work at a low applied voltage to show a small electrical consumption, but also emit light areally and can be made to emit light of the three primary colors. Application thereof to illuminators and displays is hence being investigated enthusiastically. Improvements in luminescent efficiency are desired also for this purpose.

As a means for improving the luminescent efficiency, it has been proposed, for example, to utilize the phenomenon wherein the recombination of holes with electrons yields singlet excitons and triplet excitons in a ratio of 1:3 and to utilize a phosphorescent material in the luminescent layer of an organic EL element. Widely known as phosphorescent materials are, for example, ortho-metalated iridium complex compounds including bis(2-phenylpyridinato-N,C2')iridium acetylacetonate ($Ir(ppy)_2(acac)$) and tris(2-phenylpyridinato-N,C2')iridium ($Ir(ppy)_3$).

As a method for forming an organic EL element using such a phosphorescent material, a vacuum deposition method is mainly utilized. However, since the element is produced usually by superposing a plurality of layers such as a luminescent layer, a charge injection layer, and a charge transport layer, the vacuum deposition method is disadvantageous in that the deposition process is troublesome and the production efficiency is poor. In addition, it has been extremely difficult, with the vacuum deposition method, to increase the size of the panels of illuminators or displays which include such elements.

Meanwhile, it is also possible to produce an organic EL element by using a coating fluid application method for film formation to successively form layers. The coating fluid application method is capable of easily forming stable layers as compared with the vacuum deposition method, and hence is expected to be applied to the mass-production of displays or lighting devices and to large devices.

In order that a film be formed by a coating fluid application method, the organic materials to be contained in the layer must be easy to dissolve in an organic solvent. Usually, a solvent having a low boiling point and a low viscosity, such as, for example, toluene, is used as the organic solvent. By using a composition including such a solvent and organic materials, a film can be easily formed by spin coating or the like. With respect to organic solvents, it is industrially more preferred to use an organic solvent having low volatility and a high flash point, such as phenylcyclohexane, from the standpoints of evenness of the coating film and operational safety.

PRIOR ART DOCUMENTS

Patent Documents

Patent Document 1: JP-A-2006-290781
Patent Document 2: International Publication WO 2004/026886
Patent Document 3: U.S. Patent Application Publication No. 2007/0122655
Patent Document 4: Chinese Patent Application Publication No. 101899296

Non-Patent Document

Non-Patent Document 1: *Journal of Materials Chemistry*, No. 22, pp. 6878-6884, 2012

SUMMARY OF THE INVENTION

Problems that the Invention is to Solve

However, the phenyl(iso)quinoline-based red-luminescence phosphorescent materials which have conventionally been used in the vapor deposition method, such as, for example, the compounds $Ir(piq)_3$ and $Ir(pq)_3$, which are shown in patent document 1, and $Ir(FMpiq)_3$, which is shown in patent document 2, have low solubility in organic solvents, and $Ir(nHexpiq)_3$, which is shown in patent document 2, is poor in the stability of the compounds after wet-process film formation. It has hence been difficult to use these phosphorescent materials in wet film-formation methods. Meanwhile, phenylquinazoline-based red-luminescence phosphorescent materials also have been disclosed. However, the solubility in organic solvents of the compounds shown in patent documents 3 and 4 is not mentioned therein, while the compound shown in non-patent document 1 has a short working life and has been required to be improved in electrical durability.

Subjects for the present invention are to provide an iridium complex compound which emits red light and is free from the problems described above and to provide an organic electroluminescent element having a long working life and high electrical durability and a display device and a lighting device both employing the organic electroluminescent element.

Means for Solving the Problems

The present inventors diligently made investigations in view of the problems described above. As a result, the inventors have found that an iridium complex compound which includes a 2-phenylquinazoline ligand and specific substituents emits red light and that an organic electroluminescent element employing the iridium complex compound has a prolonged working life. The invention has been thus completed.

Namely, essential points of the invention reside in the following [1] to [14]. [1] An iridium complex compound represented by the following formula (1):

[Chem. 1]

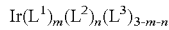

$$\text{Ir}(L^1)_m(L^2)_n(L^3)_{3-m-n} \quad (1)$$

[In formula (1), Ir represents an iridium atom; $L^1$ to $L^3$ each represent an organic ligand and are bonded to the Ir; m is an integer of 1-3 and n is an integer of 0-2, m+n being 3 or less; at least one of $L^1$ to $L^3$ includes at least one partial structure represented by the following formula (2); $L^1$ represents a ligand represented by the following formula (3); and in the case where at least one of $L^1$ to $L^3$ is present in plural number, these may be the same or different.],

[Chem. 2]

$$Ar^1-X \quad (2)$$

[In formula (2), $Ar^1$ represents a (hetero)aryl group having 3-20 carbon atoms, and X represents an alkyl group having 5-20 carbon atoms, a (hetero)aralkyl group having 7-40 carbon atoms, an alkoxy group having 4-20 carbon atoms, a (hetero)aryloxy group having 3-20 carbon atoms, or a substituent represented by the following formula (2-1).],

[Chem. 3]

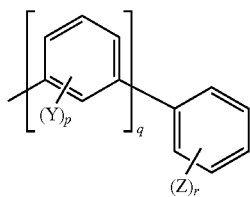

(2-1)

[In formula (2-1), Y represents a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, or a (hetero)aryl group having 3-20 carbon atoms, and in the case where Y is present in plural number, these may be the same or different; Z represents a fluorine atom, a chlorine atom, a bromine atom, an alkyl group having 1-20 carbon atoms, a (hetero)aralkyl group having 7-40 carbon atoms, an alkoxy group having 1-20 carbon atoms, or a (hetero)aryloxy group having 3-20 carbon atoms, and in the case where Z is present in plural number, these may be the same or different; and p represents an integer of 0-4, q represents an integer of 2-10, and r represents an integer of 0-5.],

[Chem. 4]

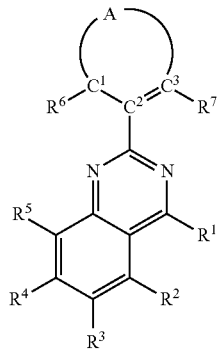

(3)

[In formula (3), ring A represents a 6-membered aromatic hydrocarbon ring or aromatic heterocyclic ring which includes the carbon atoms $C^1$, $C^2$, and $C^3$; the hydrogen atoms on the ring A may each independently be substituted with a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms; any adjacent substituents bonded to the ring A may be bonded to each other to form a ring;

$R^1$ to $R^7$ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms; these groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms; and the Ir in formula (1) and the $R^6$ or $R^7$ form a bond.].

[2] The iridium complex compound according to the item [1] above, wherein the mode of bonding between the $L^1$ and the iridium atom in formula (1) is represented by the following formula (3-1) or (3-2):

[Chem. 5]

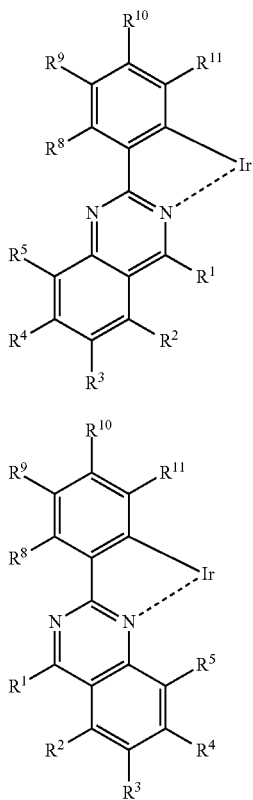

(3-1)

(3-2)

[In formulae (3-1) and (3-2), $R^1$ to $R^5$ respectively have the same meanings as the $R^1$ to $R^5$ contained in formula (3); $R^8$ to $R^{11}$ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms; these groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms; and the $R^8$ to $R^{11}$ each may be bonded to any adjacent one of the $R^8$ to $R^{11}$ through an alkylene group having 3-12 carbon atoms or alkenylene group having 3-12 carbon atoms to form a ring, and these rings may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms.].

[3] The iridium complex compound according to the item [2] above, wherein the mode of bonding between the $L^1$ and the iridium atom in formula (1) is represented by the formula (3-1).

[4] The iridium complex compound according to the item [2] above, wherein the mode of bonding between the $L^1$ and the iridium atom in formula (1) is represented by the formula (3-2).

[5] The iridium complex compound according to any one of the items [1] to [4] above, wherein the $R^1$ in formula (3) represents a substituted or unsubstituted alkyl group having 1-20 carbon atoms, a substituted or unsubstituted (hetero)aralkyl group having 7-40 carbon atoms, a substituted or unsubstituted alkylamino group having 2-20 carbon atoms, a substituted or unsubstituted arylamino group having 6-20 carbon atoms, or a substituted or unsubstituted (hetero)aryl group having 3-20 carbon atoms.

[6] The iridium complex compound according to any one of the items [1] to [5] above, wherein the $R^5$ in formula (3) represents a substituted or unsubstituted alkyl group having 1-20 carbon atoms, a substituted or unsubstituted (hetero)aralkyl group having 7-40 carbon atoms, a substituted or unsubstituted alkylamino group having 2-20 carbon atoms, a substituted or unsubstituted arylamino group having 6-20 carbon atoms, or a substituted or unsubstituted (hetero)aryl group having 3-20 carbon atoms.

[Claim 7]

The iridium complex compound according to any one of the items [1] to [6] above, wherein the $L^2$ in formula (1) is a ligand represented by the following formula (4), and n is 1 or 2:

[Chem. 6]

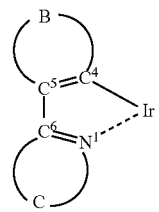

(4)

[In formula (4), ring B represents a 6-membered or 5-membered, aromatic hydrocarbon ring or aromatic heterocyclic ring which includes the carbon atoms $C^4$ and $C^5$; ring C represents a 6-membered or 5-membered aromatic heterocyclic ring which includes the carbon atom $C^6$ and the nitrogen atom $N^1$; the hydrogen atoms on the ring B and ring C may each independently be substituted with a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms; and any adjacent substituents bonded to the ring B or ring C may be bonded to each other to form a ring.].

[8] The iridium complex compound according to the item [7] above, wherein the $L^2$ in formula (1) is a ligand represented by the following formula (4-1):

[Chem. 7]

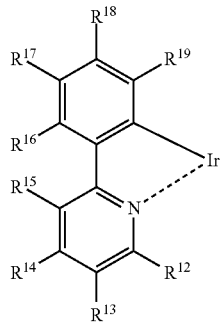

(4-1)

[In formula (4-1), $R^{12}$ to $R^{19}$ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, or a (hetero)aryl group having 3-20 carbon atoms; these groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms;

the $R^{12}$ to $R^{15}$ each may be bonded to any adjacent one of the $R^{12}$ to $R^{15}$ and the $R^{16}$ to $R^{19}$ each may be bonded to any adjacent one of the $R^{16}$ to $R^{19}$, through an alkylene group having 3-12 carbon atoms or alkenylene group having 3-12 carbon atoms to form a ring; the $R^{15}$ and the $R^{16}$ may be bonded to each other through an alkylene group having 3-12 carbon atoms or alkenylene group having 3-12 carbon atoms to form a ring; and these rings may be substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms.].

[9] The iridium complex compound according to the item [7] or [8] above, wherein the $L^2$ in formula (1) includes a partial structure represented by the formula (2).

[10] A composition which comprises the iridium complex compound according to any one of the items [1] to [9] above and a solvent.

[11] An organic electroluminescent element which comprises an anode, a cathode, and one or more organic layers disposed between the anode and the cathode, at least one of the organic layers comprising the iridium complex compound according to any one of the items [1] to [9] above.

[12] The organic electroluminescent element according to the item [11] above, wherein the organic layer comprising the iridium complex compound is a layer formed using the composition according to claim 10.

[13] A display device which comprises the organic electroluminescent element according to the item [11] or [12] above.

[14] A lighting device which comprises the organic electroluminescent element according to the item [11] or [12] above.

Effects of the Invention

The iridium complex compound of the invention emits red light, and the composition containing the iridium complex compound has a long pot life. The organic electroluminescent element produced using either the complex compound or the composition has a long working life and high electrical durability and is useful. The organic electroluminescent element is useful as display devices and lighting devices.

BRIEF DESCRIPTION OF THE DRAWING

FIG. 1 is a cross-sectional view which schematically shows an example of the structure of an organic electroluminescent element of the invention.

MODES FOR CARRYING OUT THE INVENTION

Embodiments of the invention are explained below in detail. However, the invention should not be construed as being limited to the following embodiments, and can be variously modified within the spirit of the invention.

<Iridium Complex Compound>

The iridium complex compound of the invention is characterized by being represented by the following formula (1).

[Chem. 8]

$$Ir(L^1)_m(L^2)_n(L^3)_{3-m-n} \quad (1)$$

In formula (1), Ir represents an iridium atom, and $L^1$ to $L^3$ each represent an organic ligand and are bonded to the Ir. Symbol m is an integer of 1-3, and n is an integer of 0-2, m+n being 3 or less. However, at least one of $L^1$ to $L^3$ includes at least one partial structure represented by the following formula (2), and $L^1$ represents a ligand represented by the following formula (3). In the case where there at least one of $L^1$ to $L^3$ is present in plural number, these may be the same or different.

Although the partial structure represented by formula (2) may be possessed by any of the ligands $L^1$ to $L^3$, it is more preferable from the standpoint of durability that $L^2$ should have the partial structure. Namely, it is preferable that n should be 1 or larger.

[Chem. 9]

$$Ar^1—X \qquad (2)$$

In formula (2), $Ar^1$ represents a (hetero)aryl group having 3-20 carbon atoms, and X represents an alkyl group having 5-20 carbon atoms, a (hetero)aralkyl group having 7-40 carbon atoms, an alkoxy group having 4-20 carbon atoms, a (hetero)aryloxy group having 3-20 carbon atoms, or a substituent represented by the following formula (2-1).

In this description, the terms (hetero)aryl group, (hetero)aralkyl group, and (hetero)aryloxy group respectively mean an aryl group which may contain one or more heteroatoms, an aralkyl group which may contain one or more heteroatoms, and an aryloxy group which may contain one or more heteroatoms. The expression "may contain one or more heteroatoms" means that one or more of the carbon atoms which constitute the main framework of the aryl group, aralkyl group, or aryloxy group each be substituted with a heteroatom. Examples of the heteroatom include nitrogen, oxygen, sulfur, phosphorus, and silicon atoms. Of these, nitrogen atom is preferred from the standpoint of durability.

[Chem. 10]

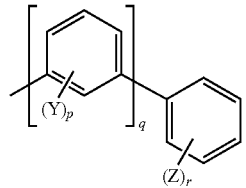

(2-1)

In formula (2-1), Y represents a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, or a (hetero)aryl group having 3-20 carbon atoms, and in the case where Y is present in plural number, these may be the same or different. Z represents a fluorine atom, a chlorine atom, a bromine atom, an alkyl group having 1-20 carbon atoms, a (hetero)aralkyl group having 7-40 carbon atoms, an alkoxy group having 1-20 carbon atoms, or a (hetero)aryloxy group having 3-20 carbon atoms, and in the case where Z is present in plural number, these may be the same or different. Symbol p represents an integer of 0-4, q represents an integer of 2-10, and r represents an integer of 0-5.

Symbols p and r each represent the number of substituents by which hydrogen atoms have been replaced. From the standpoint of synthesis simplicity, p and r each preferably are 0 or 1, more preferably 0. Symbol q represents the number of m-phenylene moieties, and is preferably 2-10, more preferably 2-5, from the standpoints of solubility in organic solvents and durability.

[Chem. 11]

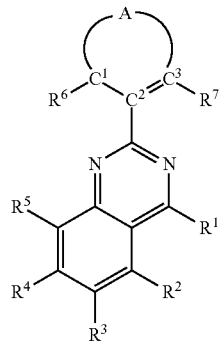

(3)

In formula (3), ring A represents a 6-membered aromatic hydrocarbon ring or aromatic heterocyclic ring which includes the carbon atoms $C^1$, $C^2$, and $C^3$.

Examples of the 6-membered aromatic hydrocarbon ring or aromatic heterocyclic ring include a benzene ring, pyridine ring, and pyrimidine ring. Preferred from the standpoints of durability and synthesis are a benzene ring, pyridine ring, and pyrimidine ring. More preferred of these are a benzene ring and a pyridine ring. Even more preferred is a benzene ring.

The hydrogen atoms on the ring A may each independently be substituted with a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms.

Any adjacent substituents bonded to the ring A may be bonded to each other to form a ring.

Examples of such rings include a fluorene ring, naphthalene ring, phenanthrene ring, triphenylene ring, chrysene ring, benzofuran ring, dibenzofuran ring, benzothiophene ring, dibenzothiophene ring, carbazole ring, carboline ring, diazacarbazole ring, tetrahydronaphthalene ring, quinoline ring, quinazoline ring, quinoxaline ring, azaphenanthrene ring, and azatriphenylene ring. Preferred of these are a fluorene ring, naphthalene ring, carbazole ring, carboline ring, quinoline ring, quinazoline ring, quinoxaline ring, and azatriphenylene ring.

$R^1$ to $R^7$ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms. These groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms.

The Ir in formula (1) and the $R^6$ or $R^7$ form a bond.

<$Ar^1$>

$Ar^1$ represents a (hetero)aryl group having 3-20 carbon atoms. The term "(hetero)aryl group having 3-20 carbon atoms" means either an aromatic hydrocarbon group having a free valence of 1 or an aromatic heterocyclic group having a free valence of 1.

Examples thereof include the following groups each having a free valence of 1: a benzene ring, naphthalene ring, anthracene ring, phenanthrene ring, perylene ring, tetracene ring, pyrene ring, benzpyrene ring, chrysene ring, triphenylene ring, fluoranthene ring, furan ring, benzofuran ring, dibenzofuran ring, thiophene ring, benzothiophene ring, dibenzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzoisoxaole ring, benzoisothiazole ring, benzimidazole ring, pyridine ring, pyrazine ring, pyridazine ring, pyrimidine ring, triazine ring, quinoline ring, isoquinoline ring, cinnoline ring, quinoxaline ring, perimidine ring, quinazoline ring, quinazolinone ring, and azulene ring.

Preferred from the standpoints of quantum yield and durability are a benzene ring, naphthalene ring, dibenzofuran ring, dibenzothiophene ring, carbazole ring, pyridine ring, pyrimidine ring, and triazine ring which each have a free valence of 1. More preferred of these are a benzene ring and a pyridine ring which each have a free valence of 1.

In the invention, the term free valence means the number of sites each capable of forming a bond with another free-valence site, as described in Yūki-kagaku/Sei-kagaku Meimei-hō (jō) (revised second edition, Nankodo Co., Ltd., published in 1992). For example, the term "benzene ring having a free valence of 1" means a phenyl group, and the term "benzene ring having a free valence of 2" means a phenylene group.

<X>

X represents an alkyl group having 5-20 carbon atoms, a (hetero)aralkyl group having 7-40 carbon atoms, an alkoxy group having 4-20 carbon atoms, a (hetero)aryloxy group having 3-20 carbon atoms, or a substituent represented by the formula (2-1).

From the standpoint of durability, X preferably is any of an alkyl group having 5-20 carbon atoms, a (hetero)aralkyl group having 7-40 carbon atoms, and a substituent represented by formula (2-1), and more preferably is a (hetero)aralkyl group having 7-40 carbon atoms or a substituent represented by formula (2-1).

Examples of the alkyl group having 5-20 carbon atoms include linear alkyl groups, branched alkyl groups, and cyclic alkyl groups. More specific examples thereof include n-pentyl, n-hexyl, n-octyl, isopentyl, and cyclohexyl. Preferred of these are linear alkyl groups such as n-pentyl, n-hexyl, and n-octyl.

With respect to examples of the (hetero)aralkyl group having 7-40 carbon atoms, this term means, for example, a linear alkyl group, branched alkyl group, or cyclic alkyl group in which the hydrogen atoms as components thereof have been partly replaced by one or more (hetero)aryl groups. Specific examples thereof include 1-phenyl-1-ethyl, cumyl, 5-phenyl-1-pentyl, 6-phenyl-1-hexyl, 7-phenyl-1-heptyl, and tetrahydronaphthyl. Preferred of these are 5-phenyl-1-pentyl, 6-phenyl-1-hexyl, and 7-phenyl-1-heptyl.

Examples of the alkoxy group having 4-20 carbon atoms include hexyloxy, cyclohexyloxy, and octadecyloxy. Preferred of these is hexyloxy.

Examples of the (hetero)aryloxy group having 3-20 carbon atoms include phenoxy and 4-methylphenyloxy. Preferred of these is phenoxy.

<Y and Z>

Y, which is a substituent by which a hydrogen atom has been replaced, represents a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, or a (hetero)aryl group having 3-20 carbon atoms. In the case where Y is present in plural number, these may be the same or different.

Z, which is a substituent by which a hydrogen atom has been replaced, represents a fluorine atom, a chlorine atom, a bromine atom, an alkyl group having 1-20 carbon atoms, a (hetero)aralkyl group having 7-40 carbon atoms, an alkoxy group having 1-20 carbon atoms, or a (hetero)aryloxy group having 3-20 carbon atoms. In the case where Z is present in plural number, these may be the same or different.

Examples of the alkyl groups having 1-20 carbon atoms, in Y and Z, include linear alkyl groups, branched alkyl groups, and cyclic alkyl groups. Specific examples thereof include methyl, ethyl, n-propyl, n-butyl, n-pentyl, n-hexyl, n-octyl, isopropyl, isobutyl, isopentyl, t-butyl, and cyclohexyl. Preferred of these are linear alkyl groups such as methyl, ethyl, n-butyl, and n-hexyl.

With respect to examples of the (hetero)aralkyl group having 7-40 carbon atoms, in Y and Z, the term means, for example, a linear alkyl group, branched alkyl group, or cyclic alkyl group in which the hydrogen atoms as components thereof have been partly replaced by one or more (hetero)aryl groups. Specific examples thereof include 1-phenyl-1-ethyl, cumyl, 3-phenyl-1-propyl, 4-phenyl-1-butyl, 5-phenyl-1-pentyl, 6-phenyl-1-hexyl, 7-phenyl-1-heptyl, 4-phenyl-1-cyclohexyl, and tetrahydronaphthyl. Preferred of these are 5-phenyl-1-pentyl, 6-phenyl-1-hexyl, and 7-phenyl-1-heptyl.

Examples of the alkoxy group having 1-20 carbon atoms, in Y and Z, include methoxy, ethoxy, propyloxy, isopropyloxy, hexyloxy, cyclohexyloxy, and octadecyloxy. Preferred of these is hexyloxy.

Examples of the (hetero)aryloxy group having 3-20 carbon atoms, in Y and Z, include phenoxy and 4-methylphenyloxy. Preferred of these is phenoxy.

Examples of the (hetero)aryl group having 3-20 carbon atoms, in Y, are the same as those explained above in the section <$Ar^1$>.

<$L^1$>

The iridium complex compound of the invention contains a ligand represented by formula (3) as $L^1$ contained in formula (1).

$R^1$ to $R^7$ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms.

From the standpoint of durability, $R^1$ to $R^7$ each preferably are a hydrogen atom, a fluorine atom, an alkyl group having 1-20 carbon atoms, an arylamino group having 6-20 carbon atoms, or a (hetero)aryl group having 3-20 carbon atoms, and even more preferably are a hydrogen atom, a fluorine atom, an alkyl group having 1-20 carbon atoms, or a (hetero)aryl group having 3-20 carbon atoms.

With respect to $R^1$, from the standpoint of durability, $R^1$ more preferably is an alkyl group having 1-20 carbon atoms, a (hetero)aralkyl group having 7-40 carbon atoms, an alkylamino group having 2-20 carbon atoms, an arylamino group having 6-20 carbon atoms, or a substituted or unsubstituted (hetero)aryl group having 3-20 carbon atoms, and even more preferably is an alkyl group having 1-20 carbon atoms or a substituted or unsubstituted (hetero)aryl group having 3-20 carbon atoms. With respect to $R^5$, from the standpoint of enabling the desired complex compound to be easily obtained on the basis of steric hindrance, $R^5$ more preferably is an alkyl group having 1-20 carbon atoms, a (hetero)aralkyl group having 7-40 carbon atoms, an alkylamino group having 2-20 carbon atoms, an arylamino group having 6-20 carbon atoms, or a substituted or unsubstituted (hetero)aryl group having 3-20 carbon atoms, and even more preferably is an alkyl group having 1-20 carbon atoms or a substituted or unsubstituted (hetero)aryl group having 3-20 carbon atoms.

Examples of the alkyl group having 1-20 carbon atoms, (hetero)aralkyl group having 7-40 carbon atoms, alkoxy group having 1-20 carbon atoms, (hetero)aryloxy group having 3-20 carbon atoms, and (hetero)aryl group having 3-20 carbon atoms are the same as those explained above in the section <Y and Z> and section <$Ar^1$>.

Examples of the alkylsilyl group in which the alkyl group has 1-20 carbon atoms include trimethylsilyl, triethylsilyl, triisopropylsilyl, dimethylphenylsilyl, t-butyldimethylsilyl, and t-butyldiphenylsilyl. Preferred of these are triisopropylsilyl, t-butyldimethylsilyl, and t-butyldiphenylsilyl.

Examples of the arylsilyl group in which the aryl group has 6-20 carbon atoms include diphenylmethylsilyl and triphenylsilyl. Preferred of these is triphenylsilyl.

Examples of the alkylcarbonyl group having 2-20 carbon atoms include acetyl, propionyl, pivaloyl, caproyl, decanoyl, and cyclohexylcarbonyl. Preferred of these are acetyl and pivaloyl.

Examples of the arylcarbonyl group having 7-20 carbon atoms include benzoyl, naphthoyl, and anthrayl. Preferred of these is benzoyl.

Examples of the alkylamino group having 2-20 carbon atoms include methylamino, dimethylamino, diethylamino, ethylmethylamino, dihexylamino, dioctylamino, and dicyclohexylamino. Preferred of these are dimethylamino and dicyclohexylamino.

Examples of the arylamino group having 6-20 carbon atoms include phenylamino, diphenylamino, di(4-tolyl)amino, and di(2,6-dimethylphenyl)amino. Preferred of these are diphenylamino and di(4-tolyl)amino.

These $R^1$ to $R^7$ groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms. Examples of these substituents are the same as those explained above.

In formula (1), it is preferable that $L^1$, which is represented by formula (3), should be a ligand that has been bonded to the Ir and is represented by the following formula (3-1) or (3-2).

[Chem. 12]

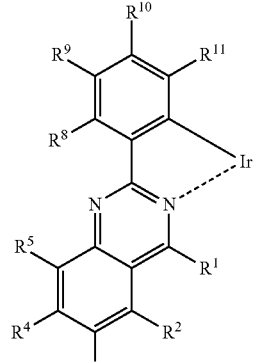

(3-1)

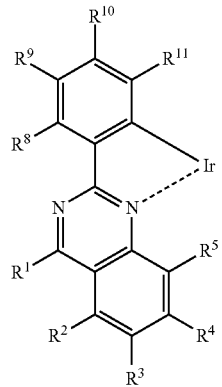

(3-2)

$R^1$ to $R^5$ respectively have the same meanings as the $R^1$ to $R^5$ contained in formula (3).

$R^8$ to $R^{11}$ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms. Examples of these substituents are the same as those explained above.

These groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms. Examples of these substituents are the same as those explained above.

Furthermore, the $R^8$ to $R^{11}$ each may be bonded to any adjacent one of the $R^8$ to $R^{11}$ through an alkylene group having 3-12 carbon atoms or alkenylene group having 3-12 carbon atoms to form a ring.

Examples of such rings include a fluorene ring, naphthalene ring, and tetrahydronaphthalene ring. Preferred of these are a fluorene ring and a naphthalene ring.

These rings may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms.

Examples of these substituents are the same as those explained above.

<$L^2$ and $L^3$>

The organic ligands $L^2$ and $L^3$ in the iridium complex compound of the invention are not particularly limited. However, these ligands preferably are a monovalent bidentate ligand, and more preferably are represented by the following formula (4).

[Chem. 13]

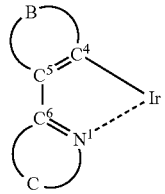

(4)

In formula (4), ring B represents a 6-membered or 5-membered, aromatic hydrocarbon ring or aromatic heterocyclic ring which includes the carbon atoms $C^4$ and $C^5$; ring C represents a 6-membered or 5-membered aromatic heterocyclic ring which includes the carbon atom $C^6$ and the nitrogen atom $N^1$.

Examples of the 6-membered or 5-membered, aromatic hydrocarbon ring or aromatic heterocyclic ring include a benzene ring, pyridine ring, furan ring, thiophene ring, and pyrrole ring. Preferred of these are a benzene ring and a pyridine ring. More preferred is a benzene ring. Examples of the 6-membered or 5-membered aromatic heterocyclic ring include a pyridine ring, pyrazine ring, pyrimidine ring, triazine ring, imidazole ring, oxazole ring, and thiazole ring.

Preferred of these are a pyridine ring, pyrazine ring, pyrimidine ring, oxazole ring, and thiazole ring. More preferred are a pyridine ring, oxazole ring, and thiazole ring.

The hydrogen atoms on the ring B and ring C may each independently be substituted with a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-20 carbon atoms. It is preferable that the hydrogen atoms each independently be substituted with a fluorine atom, an alkyl group having 1-20 carbon atoms, or a (hetero)aryl group having 3-20 carbon atoms, among those substituents. Examples of those substituents are the same as those explained above.

Furthermore, any adjacent substituents bonded to the ring B or ring C may be bonded to each other to form a ring. Examples of such rings include a fluorene ring, naphthalene ring, phenanthrene ring, triphenylene ring, chrysene ring, benzofuran ring, dibenzofuran ring, benzothiophene ring, dibenzothiophene ring, carbazole ring, carboline ring, diazacarbazole ring, tetrahydronaphthalene ring, quinoline ring, isoquinoline ring, quinazoline ring, quinoxaline ring, azaphenanthrene ring, azatriphenylene ring, benzimidazole ring, benzoxazole ring, and benzthiazole ring. Preferred of these are a fluorene ring, naphthalene ring, carbazole ring, carboline ring, quinoline ring, quinazoline ring, quinoxaline ring, azatriphenylene ring, benzoxazole ring, and benzthiazole ring.

It is preferable that $L^2$ should be a ligand represented by the following formula (4-1).

[Chem. 14]

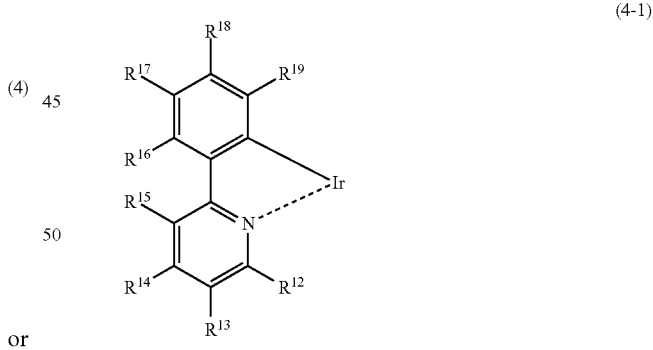

(4-1)

In formula (4-1), $R^{12}$ to $R^{19}$ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, or a (hetero)aryl group having 3-20 carbon atoms.

It is preferable that $R^{12}$ to $R^{19}$ each should be a hydrogen atom, a fluorine atom, an alkyl group having 1-20 carbon atoms, or a (hetero)aryl group having 3-20 carbon atoms, among those atoms and groups. Examples of these substituents are the same as those explained above.

These groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms. Examples of these substituents are the same as those explained above.

The $R^{12}$ to $R^{15}$ each may be bonded to any adjacent one of the $R^{12}$ to $R^{15}$ and the $R^{16}$ to $R^{19}$ each may be bonded to any adjacent one of the $R^{16}$ to $R^{19}$, through an alkylene group having 3-12 carbon atoms or alkenylene group having 3-12 carbon atoms to form a ring. Furthermore, the $R^{15}$ and the $R^{16}$ may be bonded to each other through an alkylene group having 3-12 carbon atoms or alkenylene group having 3-12 carbon atoms to form a ring.

Examples of such rings include a carboline ring, diazacarbazole ring, quinoline ring, isoquinoline ring, azaphenanthrene ring, and azatriphenylene ring. Preferred of these are a quinoline ring, isoquinoline ring, azaphenanthrene ring, and azatriphenylene ring.

These rings may be substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms. Examples of these substituents are the same as those explained above.

<Molecular Weight>

The molecular weight of the iridium complex compound of the invention is usually 600 or higher, preferably 900 or higher, and is usually 3,000 or less, preferably 2,000 or less, from the standpoint of the high stability of the complex. However, the iridium complex compound of the invention is suitable also for high-molecular-weight compounds which contain the iridium complex compound as a side chain.

SPECIFIC EXAMPLES

Preferred specific examples of the iridium complex compound of the invention are shown below. However, the invention should not be construed as being limited to the following examples. In this description, Me represents methyl, Et represents ethyl, and Ph represents phenyl.

[Chem. 15]

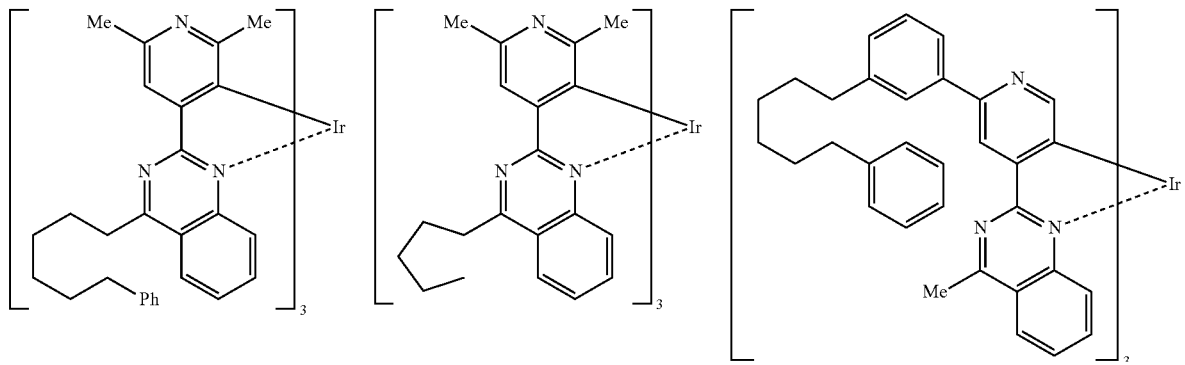

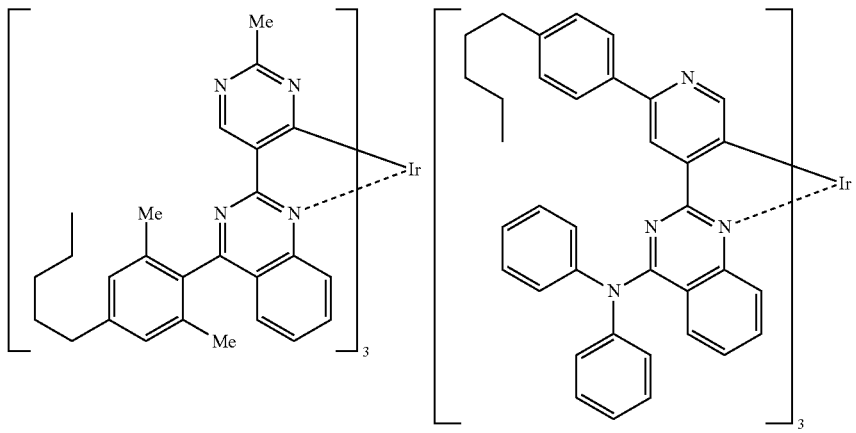

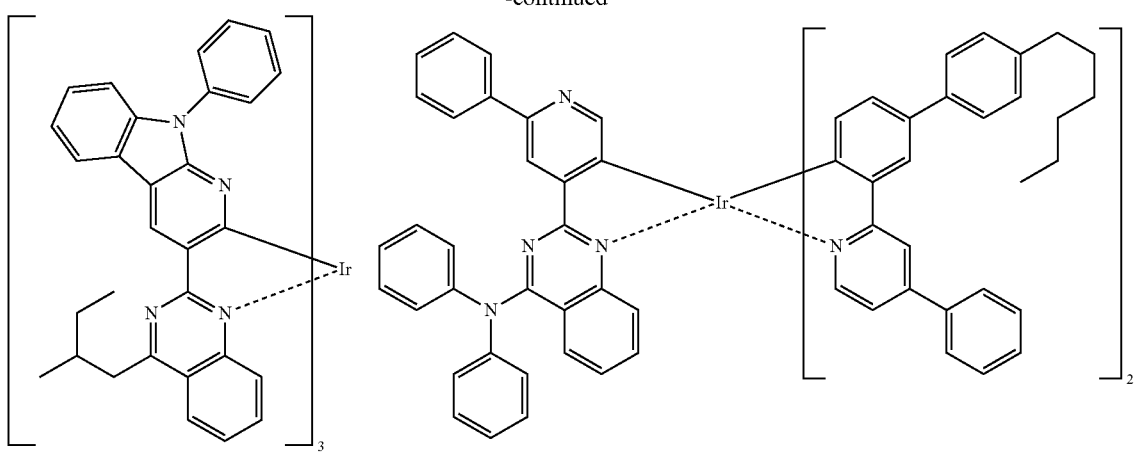
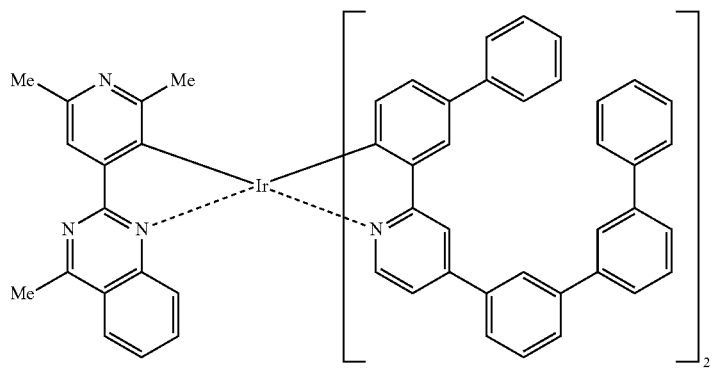
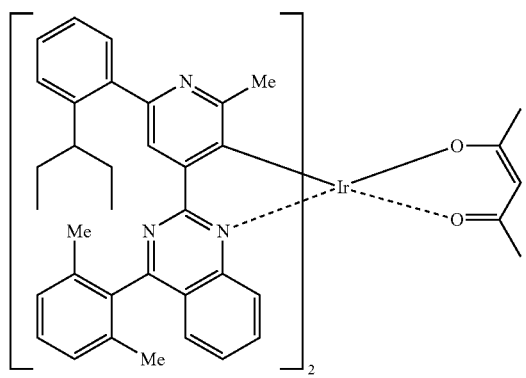
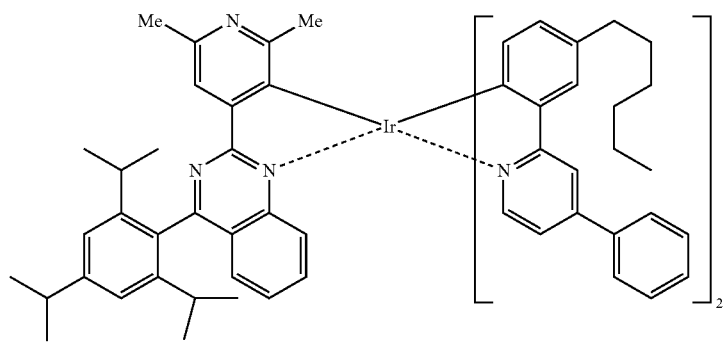

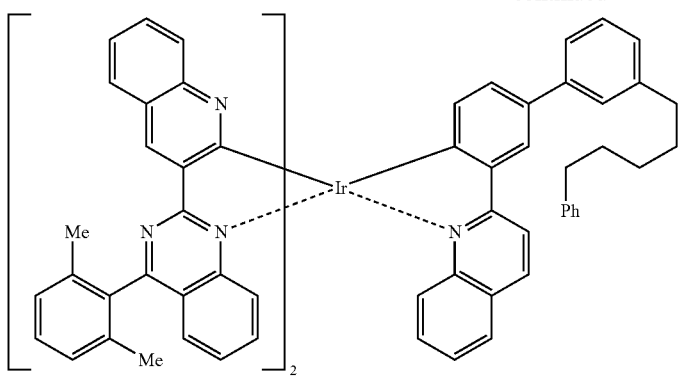
-continued
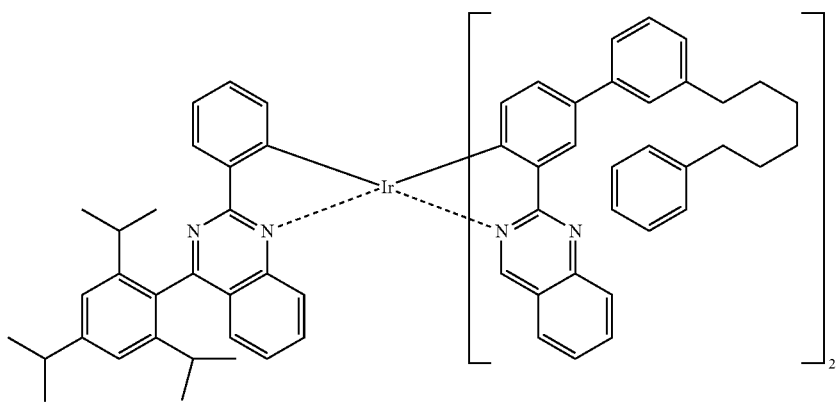
[Chem. 16]
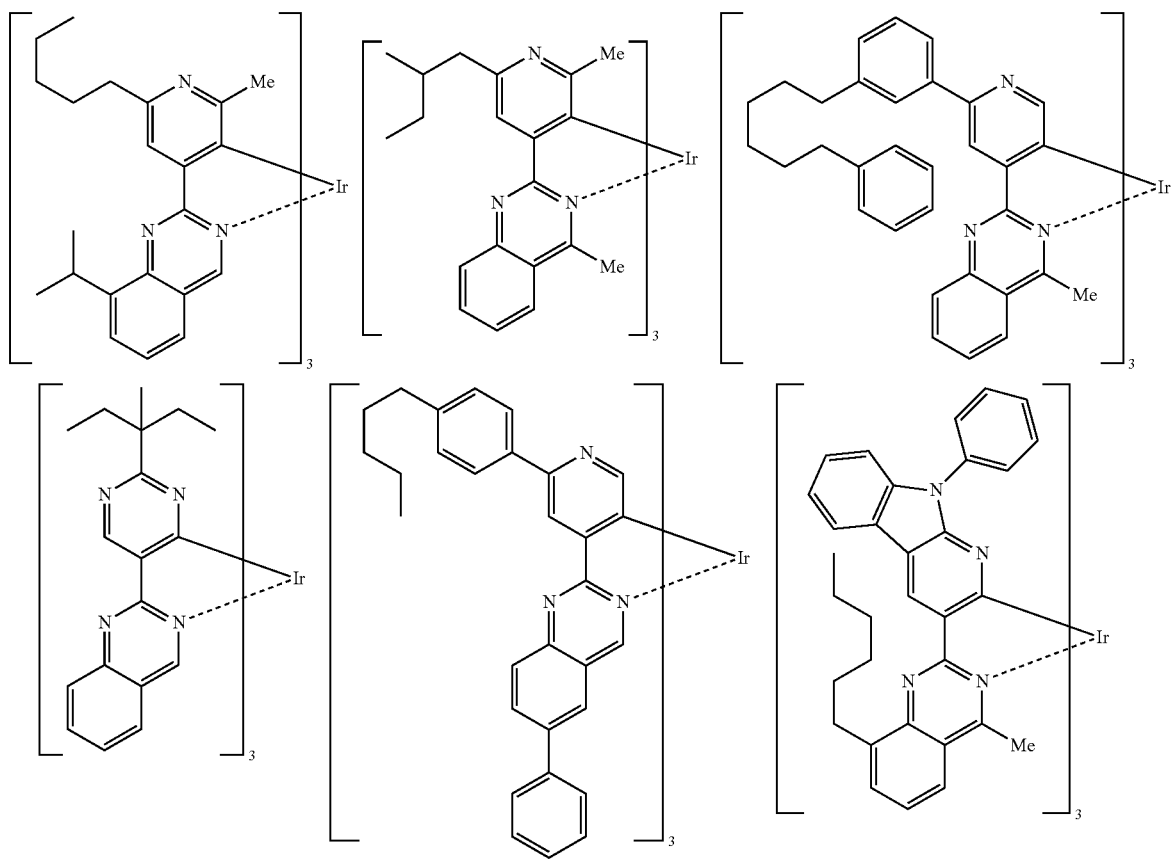

-continued
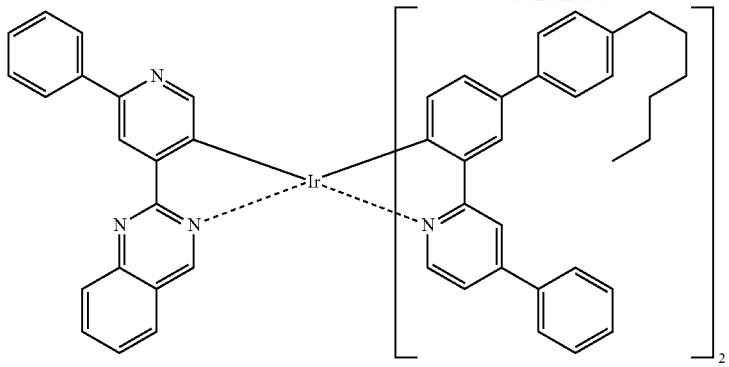
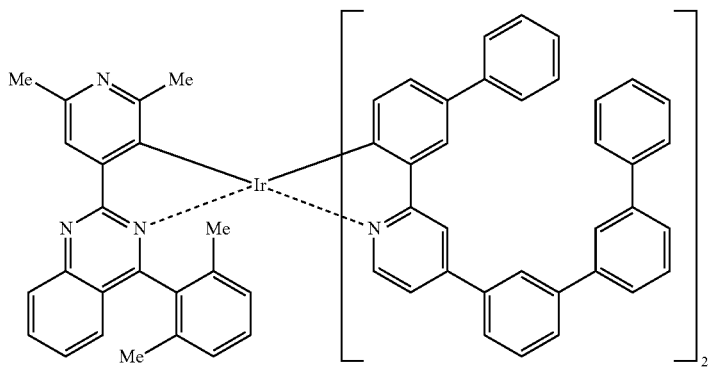
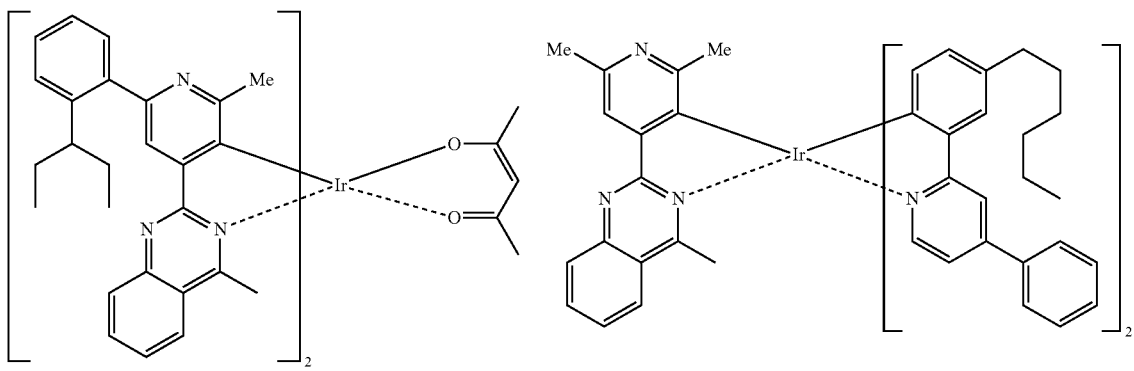
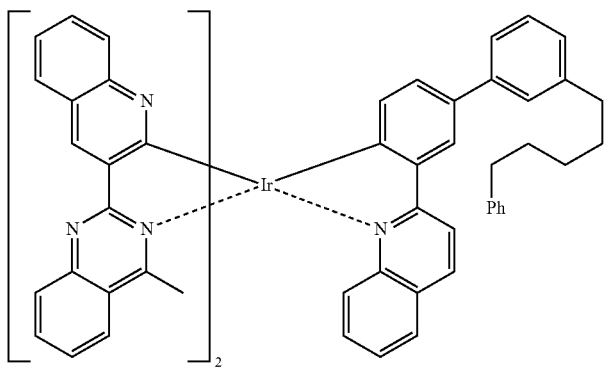

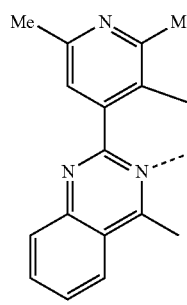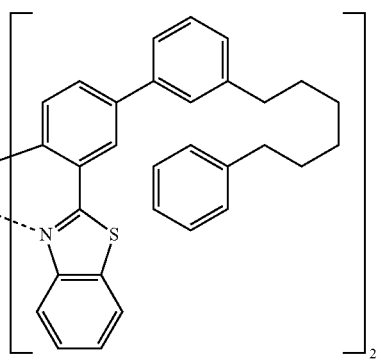
[Chem. 17]
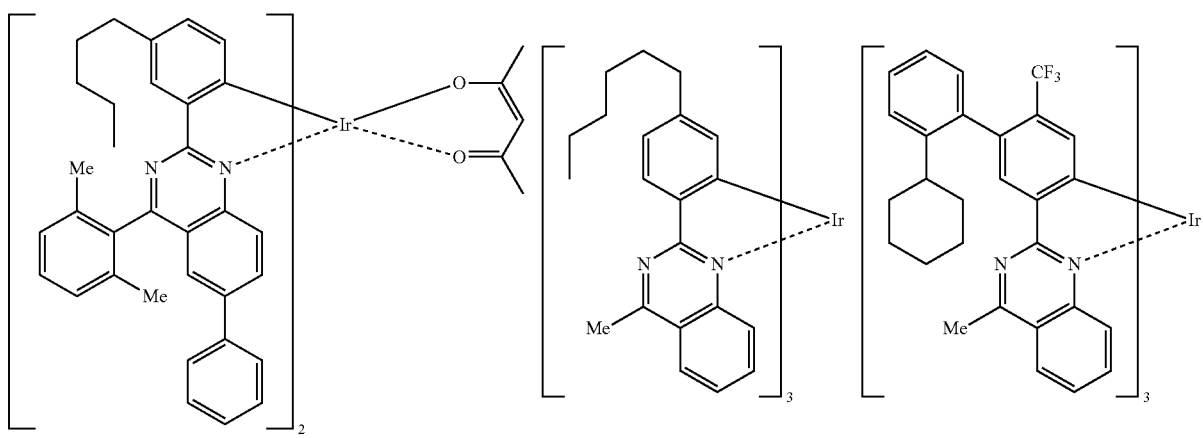
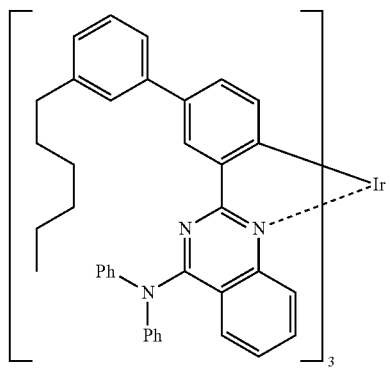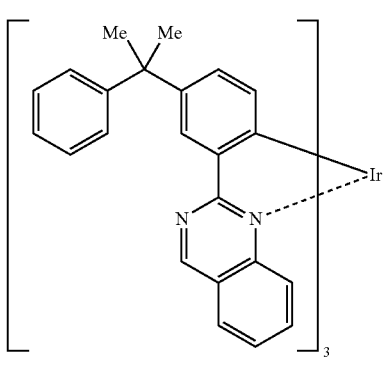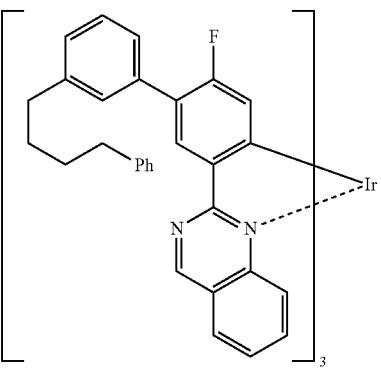
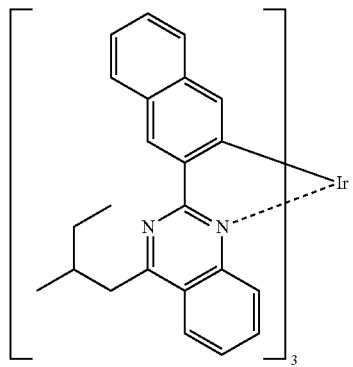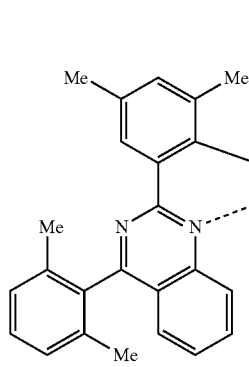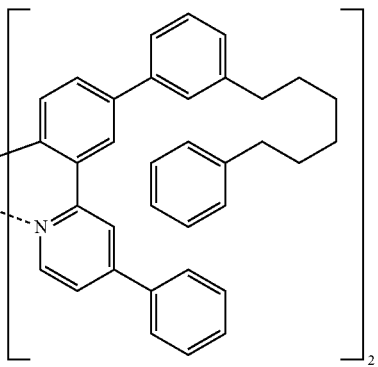

-continued
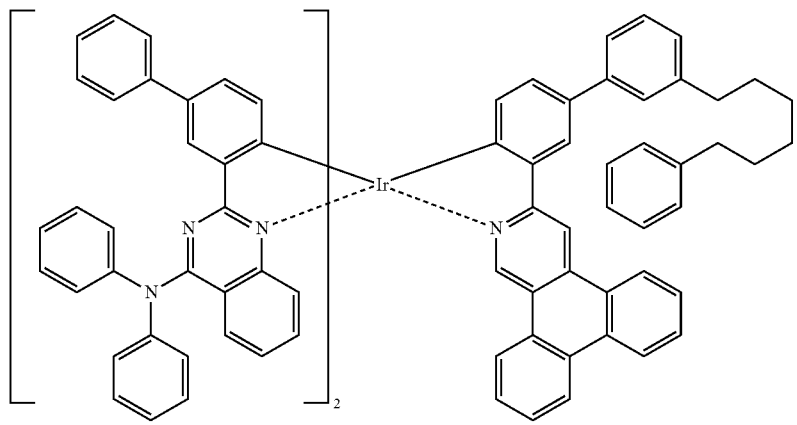
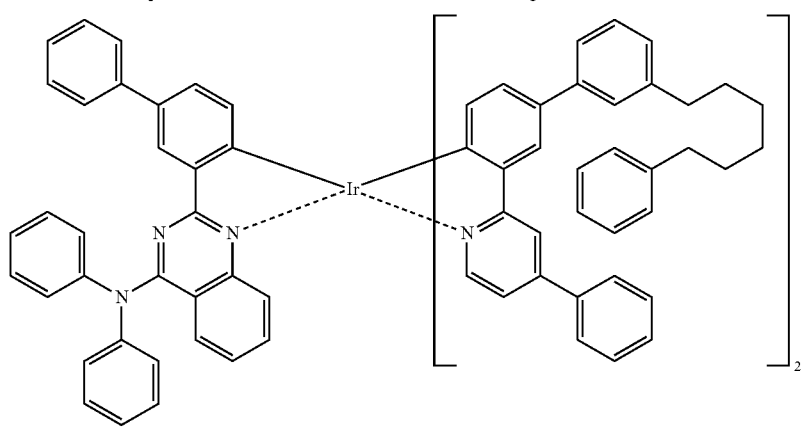
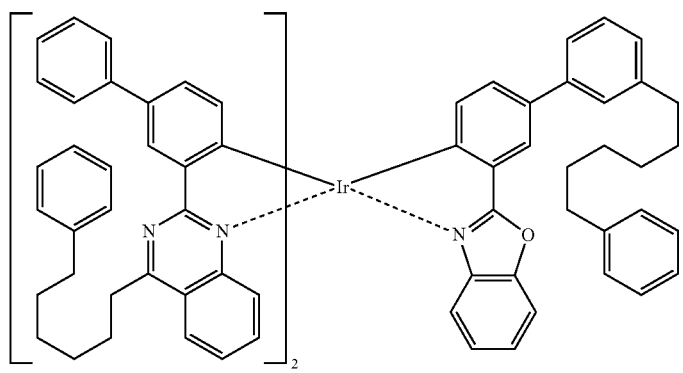
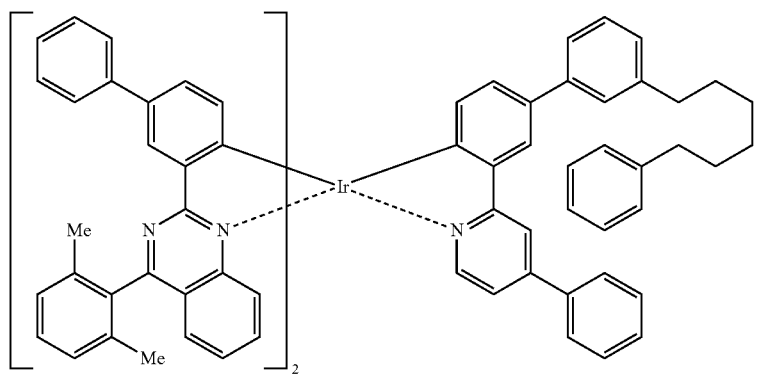

[Chem. 18]
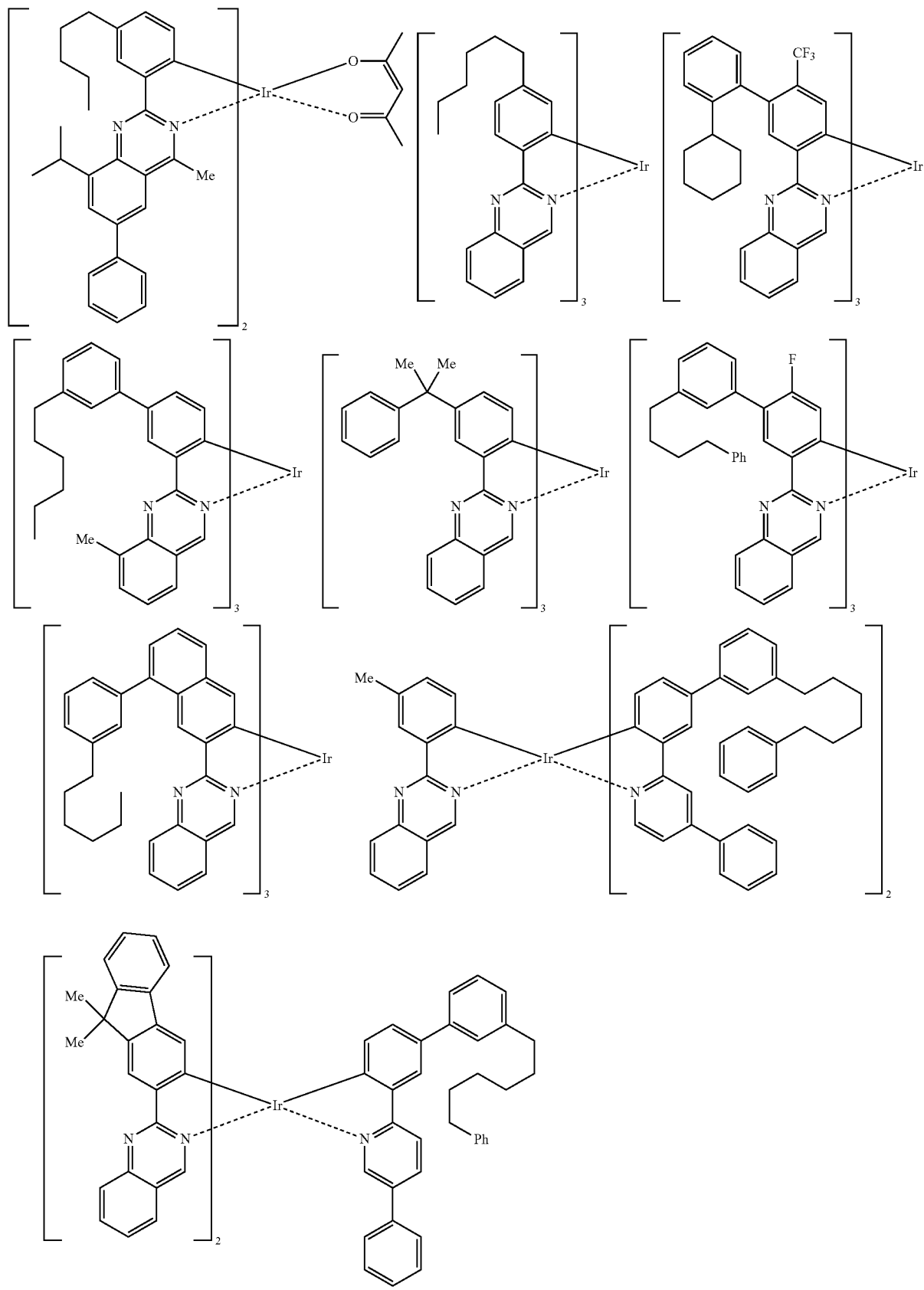

-continued
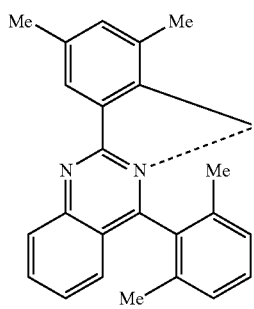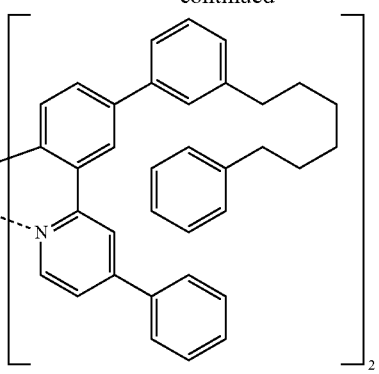
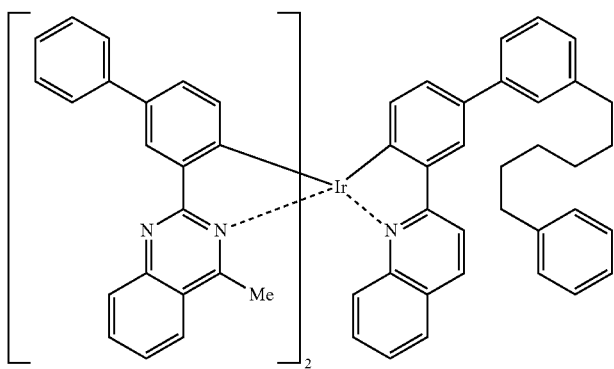
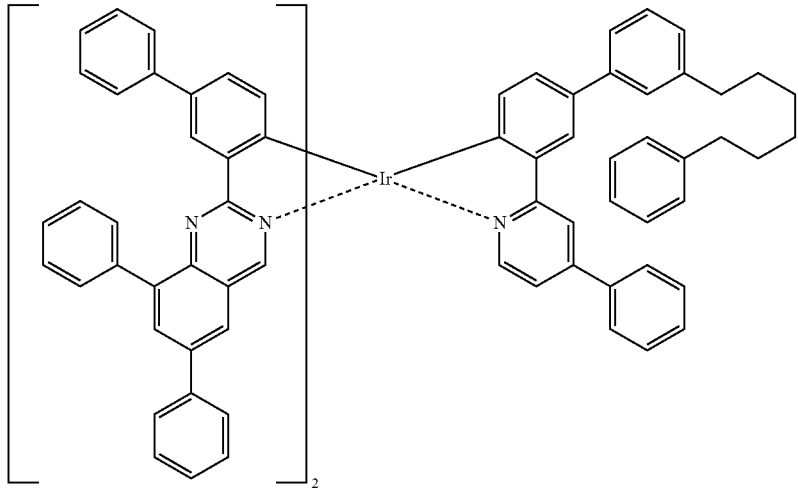
[Chem. 19]
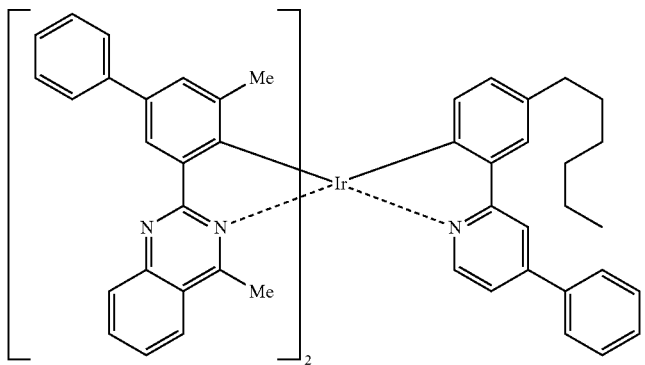

-continued
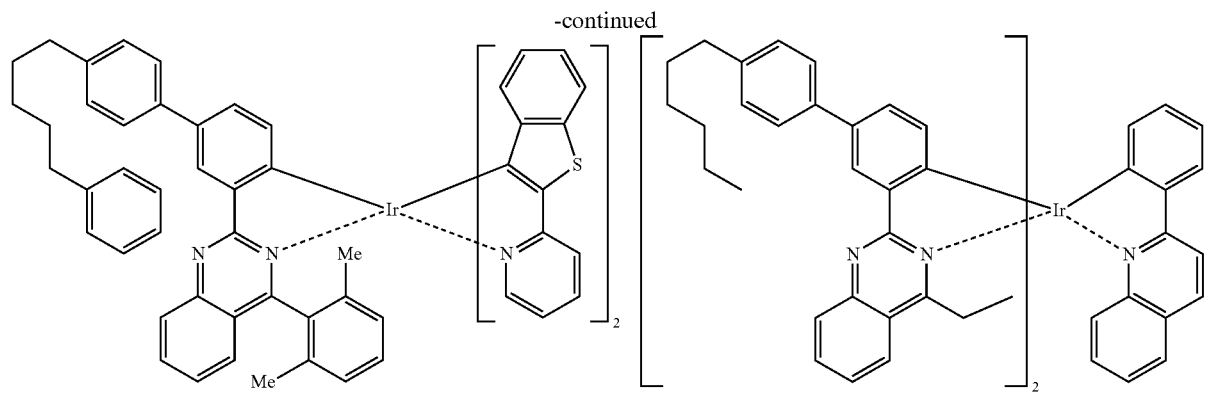
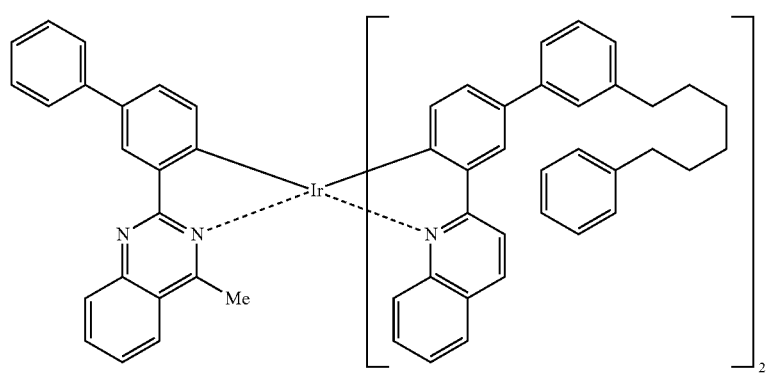
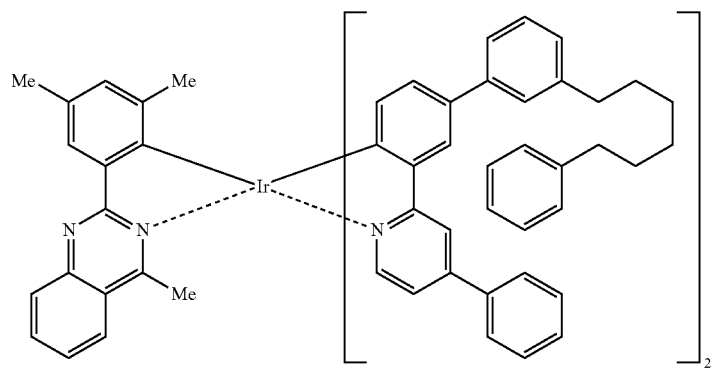
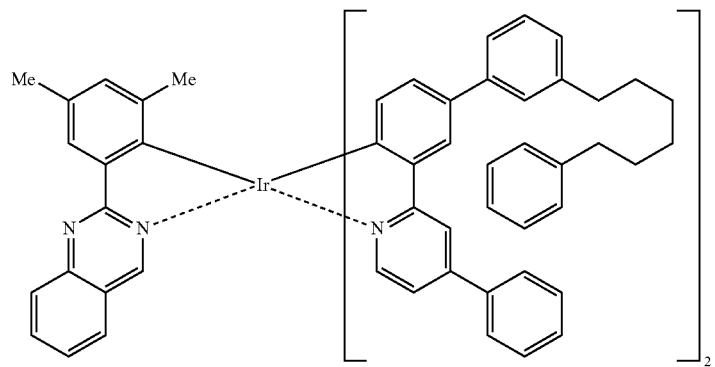

-continued
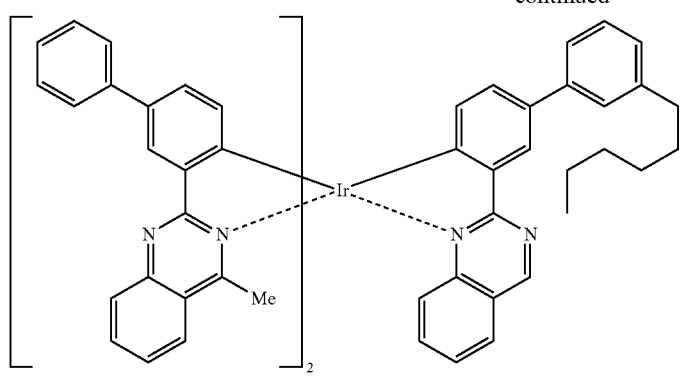
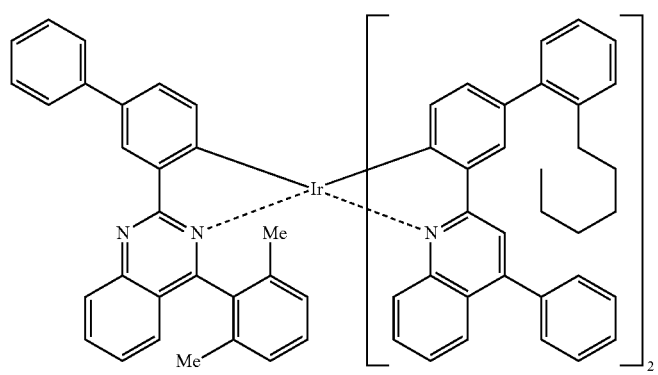
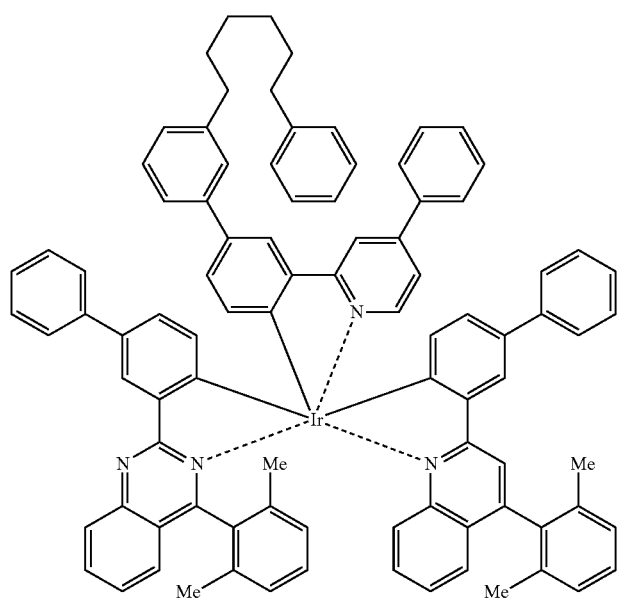

-continued
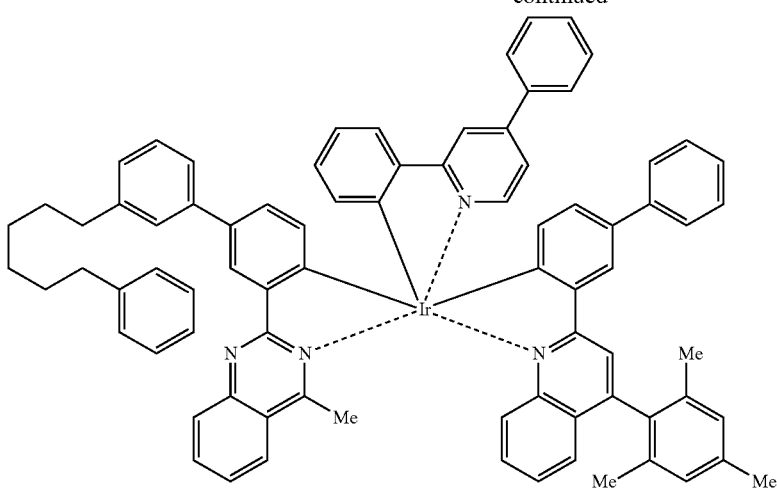
[Chem. 20]
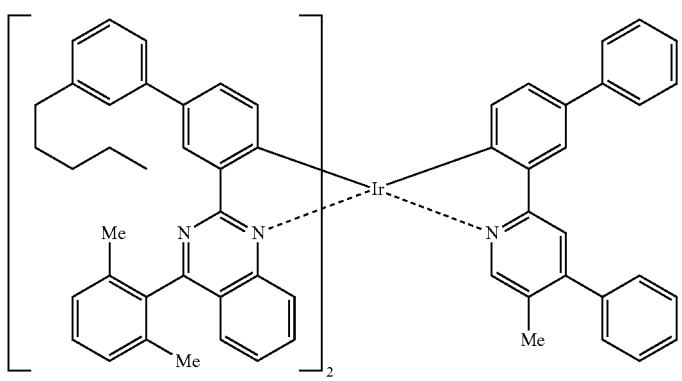
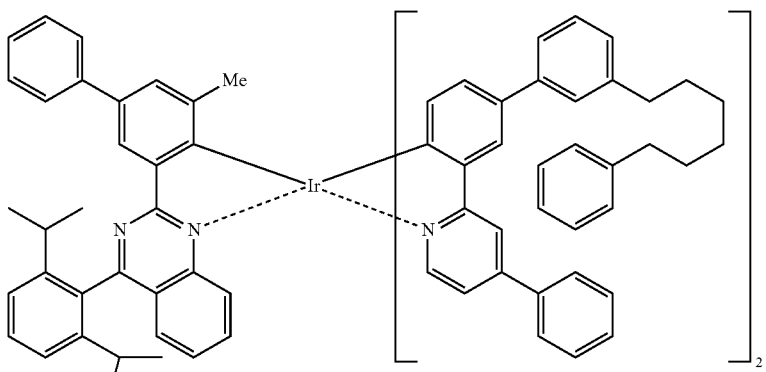
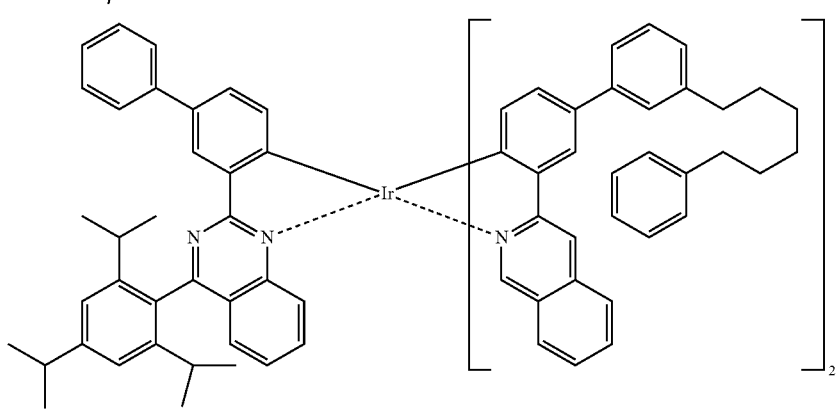

-continued
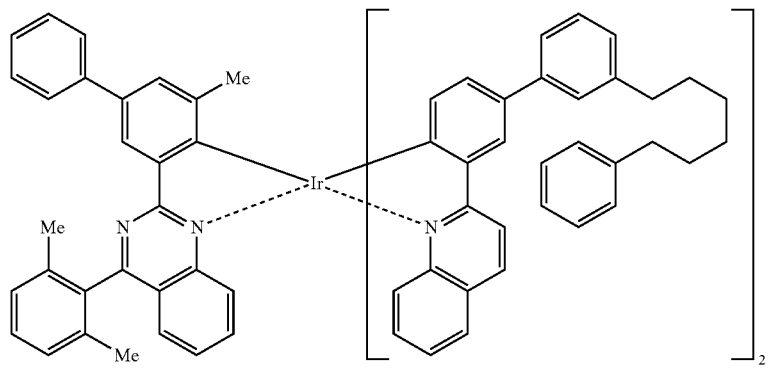
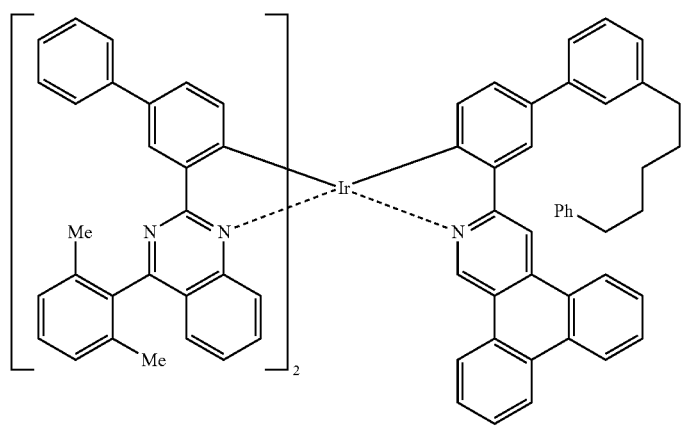
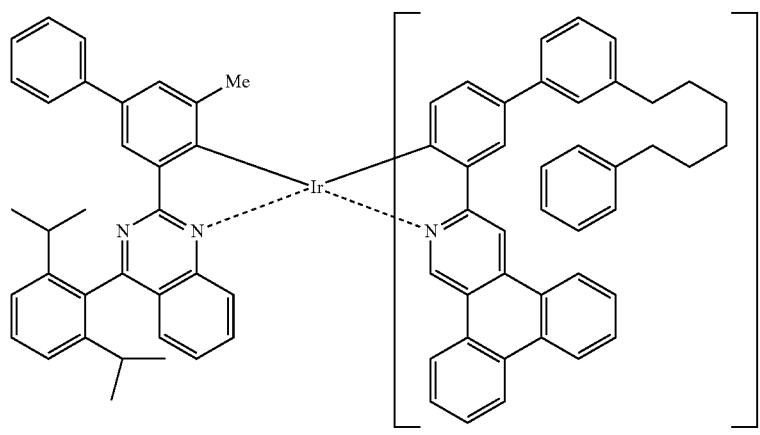

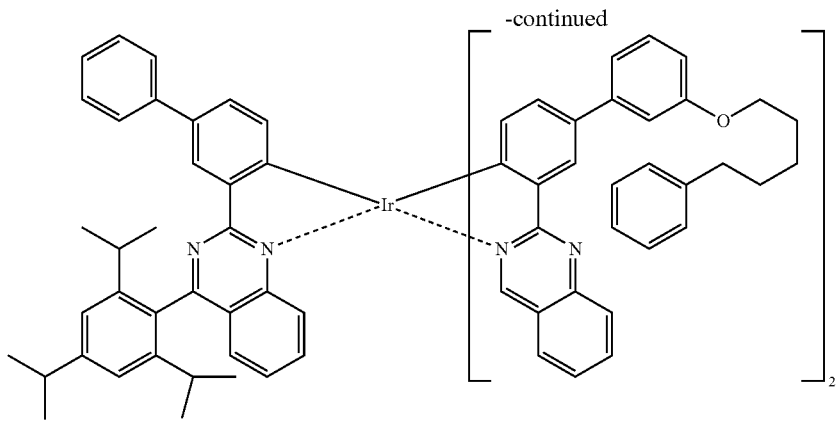

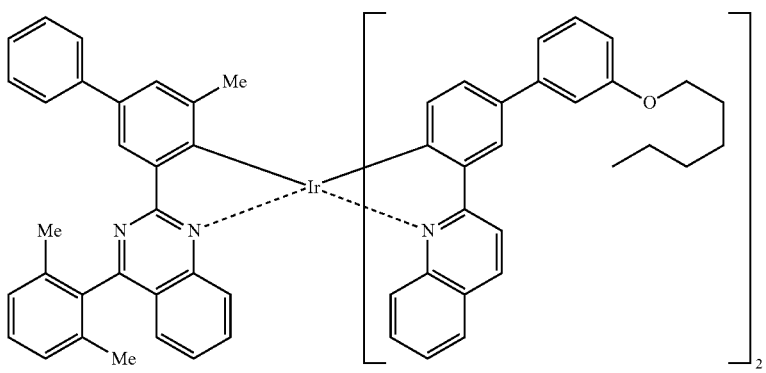

<Structural Features>

The iridium complex compound of the invention emits red light and produces an effect wherein the organic electroluminescent element produced by a coating fluid application method using a composition containing this compound has a long working life and high electrical durability. The reasons why the compound produces this effect are thought to be as follows in view of the structural features thereof.

Examples of the ligands which have been extensively investigated as the ligands of red-phosphorescence iridium complex compounds include 2-phenylquinone-based and 1-phenylisoquinoline-based ligands. Organic electroluminescent elements in which the 2-phenylquinoline-based iridium complex compound is utilized have a high luminescent efficiency and a long working life but the color of the luminescence is red which is close to orange. Meanwhile, organic electroluminescent elements in which the 1-phenylisoquinoline-based iridium complex compound is utilized emit light of a deep red color but have a low luminescent efficiency and a short working life. One of the reasons why use of the phenylisoquinoline-based compound results in a short working life is thought to be that the hydrogen atoms on the phenyl ring and the hydrogen atoms on the isoquinoline ring are twisted due to steric hindrance and this twisting lowers the stability of the complex to shorten the working life. It is hence thought that if a compound can be made to emit red light by utilizing a 2-phenylquinoline-based framework, the organic electroluminescent element utilizing this compound has a prolonged working life and enhanced electrical durability.

For shifting the wavelengths of light emitted by a luminescent material, it is necessary to lower the LUMO of the ligand. Examples of methods for lowering the LUMO include a method in which use is made of a quinazoline ring, which is formed by introducing a nitrogen atom into a quinoline ring. From the finding shown above, the present inventors found that an iridium complex compound is made to emit red light by imparting thereto a specific structure such as that represented by formula (1).

Furthermore, for enhancing solubility in an organic solvent, it is necessary 1) to increase the solvation energy of the compound in the state of having been dissolved in the solvent and 2) to increase the number of conformations which the compound can have in the solution, thereby increasing the rearrangement energy for crystallization. The present inventors diligently made investigations from these standpoints and, as a result, it was revealed that a compound has improved solubility in cases when the compound has, in the molecule, a partial structure represented by formula (2), that is, a group selected from the group consisting of alkyl groups, (hetero)aralkyl groups, alkoxy groups, (hetero)aryloxy groups, and groups each made up of two or more m-phenylene groups bonded to each other. It is thought that due to any of these substituents which is possessed by the compound, the solvation energy which the compound receives in the solution increases and the number of conformations which the compound can have becomes larger, thereby improving the solubility.

Since the iridium complex compound of the invention has high solubility in organic solvents as stated above, the composition including this compound and a solvent has high storage stability and is suitable for use in coating-fluid application processes. Furthermore, it is thought that since the compound has high solubility and, hence, the composition can be prevented from causing a decrease in luminescent efficiency or in working life due to luminescent-material agglomeration within the composition, the organic electroluminescent element containing the iridium complex compound of the invention has a long working life and high electrical durability.

As described above, the invention makes it possible to provide an iridium complex compound which emits red light and has high solubility in organic solvents, and further makes it possible to provide an organic electroluminescent element which utilizes the compound and has a long working life and high electrical durability.

<Methods for Synthesizing the Iridium Complex Compound>

The iridium complex compound of the invention can be synthesized from a ligand and an Ir compound, the ligand being capable of being synthesized, for example, by a combination of known methods.

Examples of methods for synthesizing the iridium complex compound include a method in which a tris-ligand complex is formed in one step as shown by scheme (A) and a method in which an intermediate such as a complex including two nuclear Ir atoms is formed and a tris-ligand complex is thereafter formed as shown by scheme (B). However, synthesis methods are not limited to these examples. Incidentally, in schemes (A) and (B), R represents a hydrogen atom or any substituent, and the plurality of R moieties may be the same or different.

With respect to a typical reaction, examples thereof include a method in which a metal complex is obtained by reacting 3 equivalents of a ligand with 1 equivalent of Ir(acac)$_3$ (iridium acetylacetonate complex), as shown by scheme (A).

Scheme (A)

[Chem. 21]

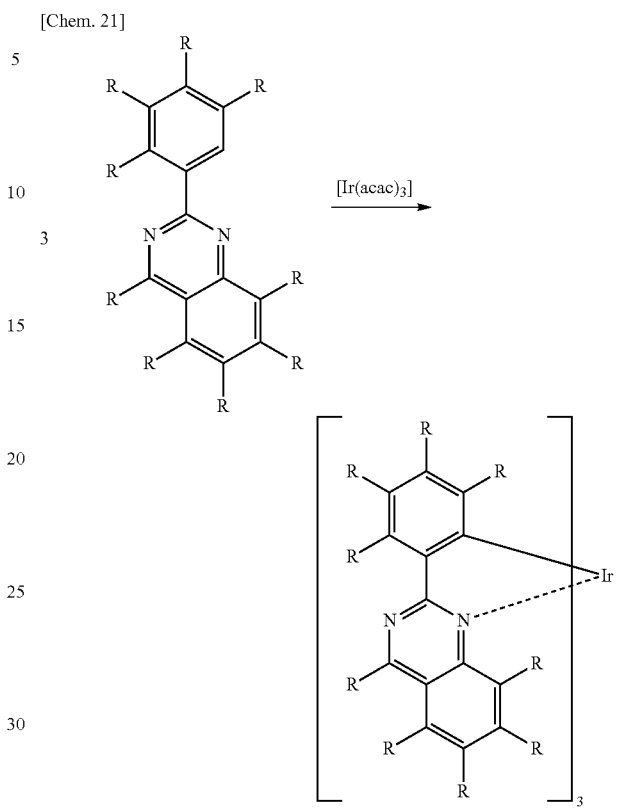

In this method, the ligand can be used in an excess amount to accelerate the reaction, or may be used in a small amount to heighten selectivity. Use may also be made of a method in which multiple kinds of ligands are used and sequentially added to form a mixed-ligand complex.

With respect to another typical reaction, examples thereof include a method in which 2 equivalents of a ligand is reacted with 1 equivalent of IrCl$_3$.xH$_2$O (iridium chloride x-hydrate) to obtain an intermediate, such as a dinuclear metal complex including two Ir atoms, and a ligand is then further reacted therewith in an amount of 1 equivalent to the Ir to obtain a metal complex, as shown by scheme (B).

Scheme (B)

[Chem. 22]

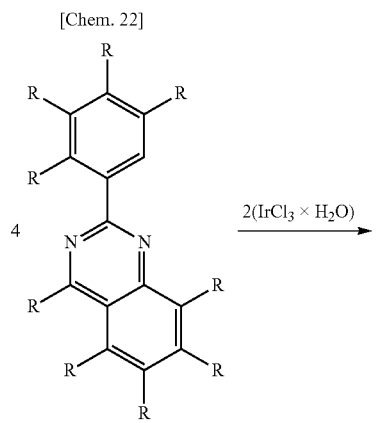

-continued

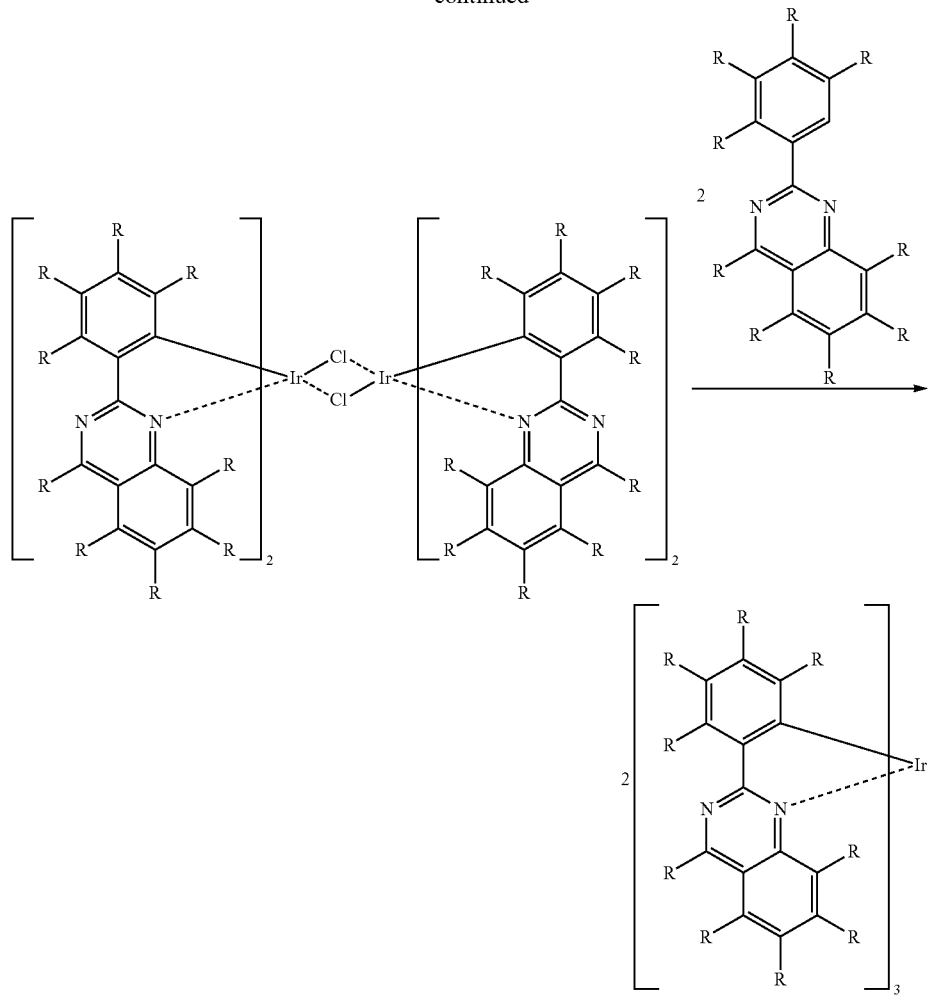

As in the case of reaction scheme (A), the actual feed ratio between the ligand(s) and the Ir compound can be adequately regulated while taking account of the efficiency and selectivity of the reaction. In the case of reaction scheme (B), a mixed-ligand complex can be easily formed by finally adding a ligand which is different from the first ligand.

As the Ir compound, use may be made of an adequate Ir compound, e.g., Ir cyclooctadienyl complex, besides the Ir(acac)$_3$ complex and IrCl$_3$.xH$_2$O complex mentioned above. A basic compound such as a carbonic acid salt or a halogen-trapping agent such as an Ag salt may also be used to accelerate the reaction.

Preferred reaction temperatures are about 50-400° C. It is more preferred to use a high temperature of 90° C. or above. The reaction may be conducted without using any solvent, or a known solvent may be used.

<Applications of the Iridium Complex Compound>

The iridium complex compound of the invention is suitable for use as a material for use in organic electroluminescent elements, i.e., as a material for organic electroluminescent elements, and is suitable also for use as a luminescent material for organic electroluminescent elements and other luminescent elements, etc.

<Composition containing the Iridium Complex Compound>

Since the iridium complex compound of the invention has excellent solubility, it is preferred to use the compound together with a solvent. The composition which includes both the iridium complex compound of the invention and a solvent (hereinafter, the composition is often referred to as "iridium-complex-compound-containing composition") is explained below.

The iridium-complex-compound-containing composition of the invention includes the iridium complex compound of the invention described above and a solvent. The iridium-complex-compound-containing composition of the invention is used usually for forming a layer or film by a wet film formation method, and it is especially preferable that the composition should be used for forming an organic layer of an organic electroluminescent element. It is especially preferable that the organic layer should be a luminescent layer.

Namely, the iridium-complex-compound-containing composition preferably is a composition for organic electroluminescent elements, and especially preferably is used as a composition for luminescent-layer formation.

The content of the iridium complex compound of the invention in the iridium-complex-compound-containing composition is usually 0.1% by weight or higher, preferably 1% by weight or higher, and is usually 99.99% by weight or less, preferably 99.9% by weight or less. By regulating the content of the iridium complex compound in the composition so as to be within that range, this composition, when used in organic-electroluminescent-element applications, can be made to give an organic electroluminescent element in which holes and electrons are efficiently injected into the luminescent layer from the adjoining layers (e.g., hole transport layer and hole blocking layer), thereby attaining a reduction in operating voltage. Incidentally, the iridium-complex-compound-containing composition may contain only one iridium complex compound of the invention or may contain two or more iridium complex compounds of the invention in combination.

In the case where the iridium-complex-compound-containing composition of the invention is used for, for example, an organic electroluminescent element, this composition can contain a charge-transporting compound to be used in the organic electroluminescent element, in particular, in the luminescent layer, besides the iridium complex compound described above and a solvent.

In the case of using the iridium-complex-compound-containing composition of the invention to form the luminescent layer of an organic electroluminescent element, it is preferable that this composition should contain the iridium complex compound of the invention as a dopant material and another charge-transporting compound as a host material.

The solvent contained in the iridium-complex-compound-containing composition of the invention is a liquid component which has volatility and is used for forming a layer including the iridium complex compound by wet-process film formation.

The solvent is not particularly limited so long as the charge-transporting compound which will be described later dissolves therein satisfactorily in order that the iridium complex compound of the invention as a solute might have high solubility therein. Preferred examples of the solvent include: alkanes such as n-decane, cyclohexane, ethylcyclohexane, decalin, and bicyclohexane; aromatic hydrocarbons such as toluene, xylene, mesitylene, phenylcyclohexane, and tetralin; halogenated aromatic hydrocarbons such as chlorobenzene, dichlorobenzene, and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic esters such as phenyl acetate, phenyl propionate, methyl benzoate, ethyl benzoate, propyl benzoate, and n-butyl benzoate; alicyclic ketones such as cyclohexanone, cyclooctanone, and fenchone; alicyclic alcohols such as cyclohexanol and cyclooctanol; aliphatic ketones such as methyl ethyl ketone and dibutyl ketone; aliphatic alcohols such as butanol and hexanol; and aliphatic ethers such as ethylene glycol dimethyl ether, ethylene glycol diethyl ether, and propylene glycol 1-monomethyl ether acetate (PGMEA). Preferred of these are alkanes and aromatic hydrocarbons. In particular, phenylcyclohexane has a viscosity and a boiling point which are preferred in wet-process film formation.

One of these solvents may be used alone, or any desired two or more thereof may be used in combination in any desired proportion.

The boiling point of the solvent is usually 80° C. or higher, preferably 100° C. or higher, more preferably 150° C. or higher, especially preferably 200° C. or higher. Meanwhile, the boiling point thereof is usually 270° C. or lower, preferably 250° C. or lower, more preferably 230° C. or lower. In case where the boiling point thereof is below that range, there is a possibility that wet-process film formation might result in reduced film formation stability due to solvent vaporization from the composition.

The content of the solvent per 100 parts by weight of the composition is preferably 10 parts by weight or larger, more preferably 50 parts by weight or larger, especially preferably 80 parts by weight or larger, and is preferably 99.95 parts by weight or less, more preferably 99.9 parts by weight or less, especially preferably 99.8 parts by weight or less.

Usually, the luminescent layer has a thickness of about 3-200 nm. However, in case where the content of the solvent is less than the lower limit, there is a possibility that this composition might have too high viscosity, resulting in a decrease in operation efficiency in film formation. Meanwhile, in case where the content thereof exceeds the upper limit, there is a tendency that the film obtained by removing the solvent after film formation cannot have a sufficient thickness, rendering the film formation difficult.

As other charge-transporting compounds which can be contained in the iridium-complex-compound-containing composition of the invention, use can be made of charge-transporting compounds that have conventionally been used as materials for organic electroluminescent elements. Examples thereof include pyridine, carbazole, naphthalene, perylene, pyrene, anthracene, chrysene, naphthacene, phenanthrene, coronene, fluoranthene, benzophenanthrene, fluorene, acetonaphthofluoranthene, coumarin, p-bis(2-phenylethenyl)benzene, and derivatives of these compounds, quinacridone derivatives, DCM (4-(dicyanomethylene)-2-methyl-6-(p-dimethylaminostyryl)-4H-pyran) compounds, benzopyran derivatives, rhodamine derivatives, benzothioxanthene derivatives, azabenzothioxanthene, fused aromatic ring compounds substituted with an arylamino group, and styryl derivatives substituted with an arylamino group.

One of these compounds may be used alone, or any desired two or more thereof may be used in combination in any desired proportion.

The content of such other charge-transporting compounds in the iridium-complex-compound-containing composition of the invention, per 100 parts by weight of the composition, is usually 1 part by weight or larger, and is usually 50 parts by weight or less, preferably 30 parts by weight or less.

Meanwhile, the content of such other charge-transporting compounds in the iridium-complex-compound-containing composition of the invention, based on the iridium complex compound of the invention contained in the iridium-complex-compound-containing composition, is usually 50% by weight or less, especially 30% by weight or less, and is usually 0.01% by weight or higher, especially 0.1% by weight or higher.

The iridium-complex-compound-containing composition of the invention may further contain other compounds besides the compounds shown above, according to need. For example, a solvent other than those shown above may be contained besides any of those solvents. Examples of such solvent include amides, such as N,N-dimethylformamide and N,N-dimethylacetamide, and dimethyl sulfoxide. One of these solvents may be used alone, or any desired two or more thereof may be used in combination in ay desired proportion.

[Organic Electroluminescent Element]

The organic electroluminescent element of the invention includes a substrate and, disposed thereover, at least an anode, a cathode, and one or more organic layers interposed between the anode and the cathode, and is characterized in that at least one of the organic layers includes the complex compound of the invention. The organic layers include a luminescent layer.

The organic layer including the complex compound of the invention more preferably is a layer formed using the composition according to the invention, and even more preferably is the layer formed by a wet film formation method. It is preferable that the layer formed by a wet film formation method should be the luminescent layer.

FIG. 1 is a schematic cross-sectional view which shows a structure example suitable for the organic electroluminescent element 10 of the invention. In FIG. 1, numeral 1 denotes a substrate, numeral 2 an anode, numeral 3 a hole injection layer, numeral 4 a hole transport layer, numeral 5 a luminescent layer, numeral 6 a hole blocking layer, numeral 7 an electron transport layer, numeral 8 an electron injection layer, and numeral 9 a cathode.

[1] Substrate

The substrate 1 serves as the support of the organic electroluminescent element, and use is made of a plate of quartz or glass, a metal plate or metal foil, a plastic film or sheet, or the like. Especially preferred are a glass plate and a plate of a transparent synthetic resin such as a polyester, polymethacrylate, polycarbonate, or polysulfone. In the case of using a synthetic-resin substrate, it is necessary to take account of gas barrier properties. In case where the substrate has too low gas barrier properties, there are cases where the organic electroluminescent element deteriorates due to the surrounding air which has passed through the substrate. Consequently, one of preferred methods is to form a dense silicon oxide film or the like on at least one surface of the synthetic-resin substrate to ensure gas barrier properties.

[2] Anode

An anode 2 is disposed on the substrate 1. The anode 2 serves to inject holes into the layer located on the luminescent-layer side (e.g., the hole injection layer 3, hole transport layer 4, or luminescent layer 5).

This anode 2 is usually constituted of a metal such as aluminum, gold, silver, nickel, palladium, or platinum, a metal oxide such as an oxide of indium and/or tin, a metal halide such as copper iodide, carbon black, a conductive polymer such as poly(3-methylthiophene), polypyrrole, or polyaniline, or the like.

The anode 2 is frequently formed usually by sputtering, vacuum deposition, etc. In the case of forming the anode using fine particles of a metal, e.g., silver, fine particles of copper iodide or the like, carbon black, fine particles of a conductive metal oxide, a fine powder of a conductive polymer, or the like, use can be made of a method in which the particles are dispersed in an adequate binder resin solution and the dispersion is applied to the substrate 1 to form an anode 2. Furthermore, in the case of a conductive polymer, use can be made of a method in which a thin film is directly formed on the substrate 1 by electrolytic polymerization or the conductive polymer is applied to the substrate 1, thereby forming an anode 2 (*Appl. Phys. Lett*, Vol. 60, p. 2711, 1992).

The anode 2 usually has a single-layer structure. However, it is possible to form the anode 2 so as to have a multilayer structure constituted of a plurality of materials.

The thickness of the anode 2 varies depending on required transparency. In the case where transparency is required, it is desirable that the visible-light transmittance should be regulated to usually 60% or higher, preferably 80% or higher. In this case, the thickness of the anode is usually 5 nm or larger, preferably 10 nm or larger, and is usually 1,000 nm or less, preferably about 500 nm or less.

In the case where the anode 2 may be opaque, this anode 2 may have any desired thickness and may be identical with the substrate 1. It is also possible to superpose a different conductive material on the anode 2.

It is preferred to subject the surface of the anode to an ultraviolet (UV)/ozone treatment or a treatment with an oxygen plasma or argon plasma for the purposes of removing any impurities adherent to the anode and regulating the ionization potential to improve hole injection properties.

[3] Hole Injection Layer

The hole injection layer 3 is a layer which transports holes from the anode 2 to the luminescent layer 5. Usually, the hole injection layer 3 is formed on the anode 2. For forming the hole injection layer 3 according to the invention, either a vacuum deposition method or a wet film formation method may be used without particular limitations. However, it is preferred to form the layer by a wet film formation method from the standpoint of diminishing dark spots.

The thickness of the hole injection layer 3 is usually 5 nm or larger, preferably 10 nm or larger, and is usually 1,000 nm or less, preferably 500 nm or less.

<Formation of Hole Injection Layer by Wet Film Formation Method>

In the case of forming a hole injection layer 3 by a wet film formation method, the hole injection layer 3 is formed usually by mixing materials for constituting the hole injection layer 3 with an appropriate solvent (solvent for hole injection layer formation) to prepare a composition for film formation (composition for hole injection layer formation), applying this composition for hole injection layer formation to the layer (usually, the anode) which is to underlie the hole injection layer 3, by an appropriate technique to form a film, and drying the film.

(Hole-Transporting Compound)

The composition for hole injection layer formation usually includes a hole-transporting compound, as a constituent material for the hole injection layer, and a solvent. Usually, the hole-transporting compound may be either a high-molecular-weight compound such as a polymer or a low-molecular-weight compound such as a monomer so long as these compounds are ones which have hole-transporting properties and are for use in the hole injection layers of organic electroluminescent elements. However, it is preferable that the hole-transporting compound should be a high-molecular-weight compound.

From the standpoint of barrier to charge injection from the anode 2 to the hole injection layer 3, a compound having an ionization potential of 4.5-6.0 eV is preferred as the hole-transporting compound.

Examples of the hole-transporting compound include aromatic amine derivatives, phthalocyanine derivatives, porphyrin derivatives, oligothiophene derivatives, polythiophene derivatives, benzylphenyl derivatives, compounds in which tertiary amines be bonded to each other through a fluorene group, hydrazone derivatives, silazane derivatives, silanamine derivatives, phosphamine derivatives, quinacridone derivatives, polyaniline derivatives, polypyrrole derivatives, polyphenylenevinylene derivatives, polythienylenevinylene derivatives, polyquinoline derivatives, polyquinoxaline derivatives, and carbon.

The term "derivative" in the invention means a conception which, in the case of, for example, an aromatic amine derivative, includes the aromatic amine itself and any compound in which the aromatic amine constitutes the main framework. The derivative may be either a polymer or a monomer.

Any one of such compounds may be contained alone as the only hole-transporting compound to be used as a material for the hole injection layer 3, or two or more of such compounds may be contained as hole-transporting compounds. In the case where two or more hole-transporting compounds are contained, the combination is not limited. It is, however, preferred to use one or more high-molecular-weight aromatic tertiary amine compounds in combination with one or more other hole-transporting compounds.

From the standpoints of non-crystallinity and visible-light transmittance, aromatic amine compounds are preferred of the compounds shown above as examples, and aromatic tertiary amine compounds are especially preferred. The aromatic tertiary amine compounds are compounds having an aromatic tertiary amine structure, and include compounds which have a group derived from an aromatic tertiary amine.

The aromatic tertiary amine compounds are not particularly limited in the kind thereof. However, from the standpoint of even luminescence due to surface-smoothing effect, a high-molecular-weight compound having a weight-average molecular weight of 1,000-1,000,000 (polymeric compound made up of consecutive repeating units) is more preferred. Preferred examples of the high-molecular-weight aromatic tertiary amine compound include high-molecular-weight compounds having a repeating unit represented by the following formula (IV).

[Chem. 23]

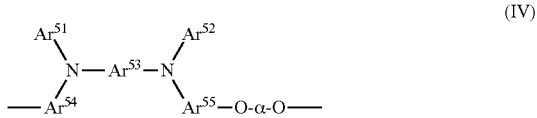

(IV)

(In formula (IV), $Ar^{51}$ to $Ar^{55}$ each independently represent an aromatic hydrocarbon group which may have a substituent or an aromatic heterocyclic group which may have a substituent. Symbol a represents a linking group selected from the following linking groups. Any two of the $Ar^{51}$ to $Ar^{55}$ groups which are bonded to the same N atom may be bonded to each other to form a ring.)
(Linking Groups)

[Chem. 24]

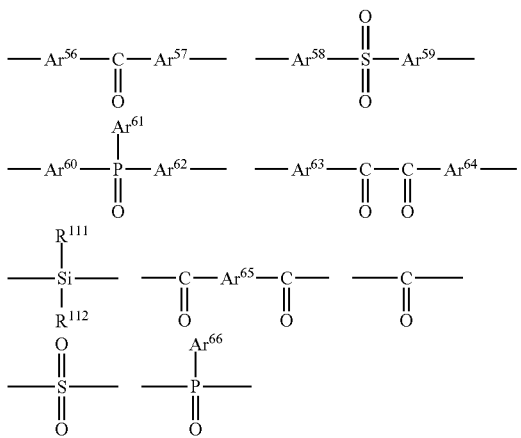

(In the formulae, $Ar^{56}$ to $Ar^{66}$ each independently represent an aromatic hydrocarbon group which may have a substituent or an aromatic heterocyclic group which may have a substituent. $R^{111}$ and $R^{112}$ each independently represent a hydrogen atom or any substituent.)

From the standpoint of the solubility, heat resistance, and hole injection/transport properties of the high-molecular-weight compound, the aromatic hydrocarbon group and aromatic heterocyclic group of $Ar^{51}$ to $Ar^{66}$ each preferably are a benzene ring, naphthalene ring, phenanthrene ring, thiophene ring, or pyridine ring which has a free valence of 2, and more preferably are a benzene ring or naphthalene ring which has a free valence of 2.

The aromatic hydrocarbon group and aromatic heterocyclic group of $Ar^{51}$ to $Ar^{66}$ may further have a substituent. The molecular weight of the substituent is usually 400 or less, preferably about 250 or less. Preferred as the substituent are alkyl groups, alkenyl groups, alkoxy groups, aromatic hydrocarbon groups, aromatic heterocyclic groups, etc.

In the case where $R^{111}$ and $R^{112}$ each are any substituent, examples of the substituent include alkyl groups, alkenyl groups, alkoxy groups, silyl group, siloxy group, aromatic hydrocarbon groups, and aromatic heterocyclic groups.

Also preferred as the hole-transporting compound is a conductive polymer (PEDOT/PSS) obtained by polymerizing 3,4-ethylenedioxythiophene in high-molecular-weight poly(styrenesulfonic acid), the conductive polymer being a derivative of polythiophene. A compound obtained by capping the ends of the polymer with a methacrylate or the like is also usable.

Furthermore, as the hole-transporting compound, use may be made of any of the compounds having an insolubilizing group which will be described later in the section "Hole Transport Layer". In the case of using the compound having an insolubilizing group, the film formation method and the like are the same.

The concentration of the hole-transporting compound in the composition for hole injection layer formation is not limited unless the effects of the invention are considerably lessened. However, from the standpoint of evenness in film thickness, the concentration thereof is usually 0.01% by weight or higher, preferably 0.1% by weight or higher, more preferably 0.5% by weight or higher, and is usually 70% by weight or less, preferably 60% by weight or less, more preferably 50% by weight or less. Too high concentrations thereof result in the possibility of unevenness in film thickness, while too low concentrations thereof result in the possibility of the occurrence of defects in the hole injection layer formed.

(Electron-Accepting Compound)

It is preferable that the composition for hole injection layer formation should contain an electron-accepting compound as a constituent material for the hole injection layer.

The electron-accepting compound preferably is a compound which has oxidizing ability and has the ability to accept one electron from the hole-transporting compound described above. Specifically, compounds having an electron affinity of 4 eV or higher are preferred, and compounds having an electron affinity of 5 eV or higher are more preferred.

Examples of such electron-accepting compounds include one or more compounds selected from the group consisting of triarylboron compounds, metal halides, Lewis acids, organic acids, onium salts, salts of arylamines with metal halides, and salts of arylamines with Lewis acids. More specific examples thereof include: high-valence inorganic compounds such as iron(III) chloride (JP-A-11-251067) and ammonium peroxodisulfate; cyano compounds such as tetracyanoethylene and aromatic boron compounds such as tris(pentafluorophenyl)borane (JP-A-2003-31365); onium salts substituted with organic groups (International Publication WO 2005/089024); fullerene derivatives; iodine; and sulfonic acid ions such as poly(styrenesulfonic acid) ions, alkylbenzenesulfonic acid ions, and camphorsulfonic acid ions.

These electron-accepting compounds oxidize the hole-transporting compound and are capable of thereby improving the electrical conductivity of the hole injection layer.

The content of the electron-accepting compound in the hole injection layer or in the composition for hole injection layer formation, based on the hole-transporting compound, is usually 0.1% by mole or higher, preferably 1% by mole or higher. However, the content thereof is usually 100% by mole or less, preferably 40% by mole or less.

(Solvent)

It is preferable that at least one of the solvent(s) of the composition for hole injection layer formation to be used in a wet film formation method should be a compound in which the constituent materials for the hole injection layer that were described above can dissolve. The boiling point of this solvent is usually 110° C. or higher, preferably 140° C. or higher, more preferably 200° C. or higher, and is usually 400° C. or lower, preferably 300° C. or lower. In case where the solvent has too low a boiling point, the composition dries at too high a rate, resulting in the possibility of impaired film quality. In case where the solvent has too high a boiling point, it is necessary to elevate the temperature used in the drying step, resulting in a possibility that this drying might adversely affect other layers and the substrate.

Examples of the solvent include ether solvents, ester solvents, aromatic hydrocarbon solvents, and amide solvents.

Examples of the ether solvents include: aliphatic ethers such as ethylene glycol dimethyl ether, ethylene glycol diethyl ether, and propylene glycol 1-monomethyl ether acetate (PGMEA); and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of the ester solvents include aromatic esters such as phenyl acetate, phenyl propionate, methyl benzoate, ethyl benzoate, propyl benzoate, and n-butyl benzoate.

Examples of the aromatic hydrocarbon solvents include toluene, xylene, phenylcyclohexane, 3-isopropylbiphenyl, 1,2,3,4-tetramethylbenzene, 1,4-diisopropylbenzene, and methylnaphthalene.

Examples of the amide solvents include N,N-dimethylformamide and N,N-dimethylacetamide.

Furthermore, dimethyl sulfoxide and the like are also usable. One of these solvents may be used alone, or any desired two or more thereof may be used in combination in any desired proportion.

(Film Formation Method)

After the composition for hole injection layer formation has been prepared, this composition is applied on the layer (usually the anode 2) which is to underlie the hole injection layer 3, and the resultant film is dried. Thus, a hole injection layer 3 can be formed.

The temperature in the application step is preferably 10° C. or higher and is preferably 50° C. or lower, from the standpoint of preventing the film from having defects due to crystal formation within the composition.

The relative humidity in the application step is not limited unless the effects of the invention are considerably lessened. However, the relative humidity is usually 0.01 ppm or higher, and is usually 80% or less.

After the application, the film of the composition for hole injection layer formation is dried usually by heating or the like. Examples of heating means usable in the heating step include clean ovens and hot plates.

With respect to the heating temperature in the heating step, it is preferred to heat the film at a temperature not lower than the boiling point of the solvent used in the composition for hole injection layer formation, unless the effects of the invention are considerably lessened. In the case where the solvent used for the hole injection layer is a mixed solvent including two or more solvents, it is preferable that at least one of the solvents should be heated at a temperature not lower than the boiling point of the solvent. When an increase in solvent boiling point is taken into account, it is preferable that the film of the composition should be heated in the heating step at a temperature which is preferably 120° C. or higher and is preferably 410° C. or lower.

In the heating step, the heating period is not limited so long as the heating temperature is not lower than the boiling point of the solvent of the composition for hole injection layer formation and so long as sufficient insolubilization of the coating film does not occur. However, the heating period is preferably 10 seconds or longer and is usually 180 minutes or shorter. In case where the heating period is too long, components of other layers tend to diffuse. In case where the heating period is too short, an inhomogeneous hole injection layer tends to be formed. The heating may be carried out in two steps.

<Formation of Hole Injection Layer by Vacuum Deposition Method>

In the case of forming the hole injection layer 3 by vacuum deposition, one or more constituent materials for the hole injection layer 3 (the hole-transporting compound and electron-accepting compound described above, etc.) are placed in one or more crucibles disposed in a vacuum vessel (in the case where two or more materials are used, the materials are placed in respective crucibles), and the vacuum vessel is evacuated to about $10^{-4}$ Pa by means of an appropriate vacuum pump. Thereafter, the crucible is heated (in the case where two or more materials are used, the respective crucibles are heated) to vaporize the material while controlling the rate of vaporization (in the case where two or more materials are used, the materials are vaporized while independently controlling the rates of vaporization thereof), to thereby form a hole injection layer 3 on the anode 2 of the substrate which has been placed so as to face the crucible(s). Incidentally, in the case of using two or more materials, it is possible to use a method in which a mixture of these materials is placed in a crucible and is heated and vaporized to form a hole injection layer 3.

The degree of vacuum during the deposition is not limited unless the effects of the invention are considerably lessened. However, the pressure during the deposition is usually $0.1 \times 10^{-6}$ Torr ($0.13 \times 10^{-4}$ Pa) or higher but is usually $9.0 \times 10^{-6}$ Torr ($12.0 \times 10^{-4}$ Pa) or less. The rate of deposition is not limited unless the effects of the invention are considerably lessened. However, the deposition rate is usually 0.1 Å/sec or higher but is usually 5.0 Å/sec or less.

[4] Hole Transport Layer

When there is a hole injection layer, the hole transport layer 4 can be formed on the hole injection layer 3. When there is no hole injection layer 3, the hole transport layer 4 can be formed on the anode 2. The organic electroluminescent element of the invention may have a configuration in which the hole transport layer has been omitted.

For forming the hole transport layer 4, either a vacuum deposition method or a wet film formation method may be used without particular limitations. However, from the standpoint of diminishing dark spots, it is preferred to form the hole transport layer 4 by a wet film formation method.

It is preferable that a material which has high hole transport properties and is capable of efficiently transporting injected holes should be used for forming the hole transport layer 4. From this standpoint, it is preferable that the material should have a low ionization potential, high transparency to visible light, high hole mobility, and excellent stability and be less apt to generate, during production or use, impurities which function as traps. Furthermore, since the hole transport layer 4 is in contact with the luminescent layer 5 in many cases, it is preferable that the material should neither quench the light emitted from the luminescent layer 5 nor form an exciplex at the interface between the hole transport layer 4 and the luminescent layer 5 to reduce the efficiency.

As such a material for the hole transport layer 4, any material which has hitherto been used as a constituent material for hole transport layers may be employed. Examples thereof include the compounds shown above as examples of the hole-transporting compound to be used in the hole injection layer 3 described above. Examples thereof further include arylamine derivatives, fluorene derivatives, Spiro derivatives, carbazole derivatives, pyridine derivatives, pyrazine derivatives, pyrimidine derivatives, triazine derivatives, quinoline derivatives, phenanthroline derivatives, phthalocyanine derivatives, porphyrin derivatives, silole derivatives, oligothiophene derivatives, fused-ring aromatic derivatives, and metal complexes.

Other examples thereof include polyvinylcarbazole derivatives, polyarylamine derivatives, polyvinyltriphenylamine derivatives, polyfluorene derivatives, polyarylene derivatives, poly(arylene ether sulfone) derivatives containing tetraphenylbenzidine, polyarylenevinylene derivatives, polysiloxane derivatives, polythiophene derivatives, and poly(p-phenylenevinylene) derivatives. These derivatives may be any of alternating copolymers, random polymers, block polymers, and graft copolymers. Furthermore, the derivatives each may be a polymer in which the main chain has been branched to have three or more ends, or may be a so-called dendrimer.

Preferred of those are polyarylamine derivatives and polyarylene derivatives.

The polyarylamine derivatives preferably are polymers which contain a repeating unit represented by the following formula (V), and especially preferably are polymers each made up of repeating units represented by the following formula (V). In this case, the polymer may be one in which the repeating units differ from each other in $Ar^a$ or $Ar^b$.

[Chem. 25]

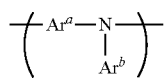

(V)

(In formula (V), $Ar^a$ and $Ar^b$ each independently represent an aromatic hydrocarbon group or aromatic heterocyclic group which may have a substituent.)

Examples of the aromatic hydrocarbon group which may have a substituent include 6-membered monocycles having a free valence of 1 or 2 or fused rings which each are composed of two to five 6-membered monocycles fused together and each have a free valence of 1 or 2, such as a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, and fluorene ring which each have a free valence of 1 or 2, and further include groups each made up of two or more such rings linked together through one or more direct bonds.

Examples of the aromatic heterocyclic group which may have a substituent include 5- or 6-membered monocycles having a free valence of 1 or 2 or fused rings which each are composed of two to four 5- or 6-membered monocycles fused together and each have a free valence of 1 or 2, such as a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, and azulene ring which each have a free valence of 1 or 2, and further include groups each made up of two or more such rings linked together through one or more direct bonds.

From the standpoints of solubility in organic solvents and heat resistance, it is preferable that $Ar^a$ and $Ar^b$ should each independently be one or more rings selected from the group consisting of a benzene ring, naphthalene ring, anthracene ring, phenanthrene ring, triphenylene ring, pyrene ring, thiophene ring, pyridine ring, and fluorene ring which each have a free valence of 1 or 2, or be a group which is made up of two or more benzene rings linked together (e.g., biphenyl (biphenylene) or terphenyl (terphenylene)).

Preferred of these are benzene, biphenyl, and fluorene which each have a free valence of 1 or 2.

Examples of the substituents which may be possessed by the aromatic hydrocarbon group and aromatic heterocyclic group represented by $Ar^a$ and $Ar^b$ include alkyl groups, alkenyl groups, alkynyl groups, alkoxy groups, (hetero)aryloxy groups, alkoxycarbonyl groups, dialkylamino groups, diarylamino groups, acyl groups, halogen atoms, haloalkyl groups, alkylthio groups, arylthio groups, silyl, siloxy, cyano, aromatic hydrocarbon ring groups, and aromatic heterocyclic groups.

Examples of the polyarylene derivatives include polymers having, as a repeating unit, an arylene group such as any of the optionally substituted aromatic hydrocarbon groups or aromatic heterocyclic groups which were shown above as examples of the $Ar^a$ and $Ar^b$ contained in formula (V). Preferred as the polyarylene derivatives are polymers having repeating units constituted of the following formula (VI) and/or the following formula (VII).

[Chem. 26]

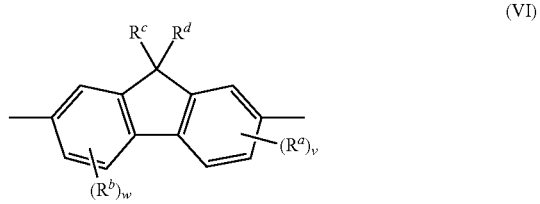

(VI)

(In formula (VI), $R^a$ to $R^d$ each independently represent an alkyl group, alkoxy group, phenylalkyl group, phenylalkoxy group, phenyl, phenoxy, alkylphenyl group, alkoxyphenyl group, alkylcarbonyl group, alkoxycarbonyl group, or carboxy. Symbols v and w each independently represent an integer of 0-3. When v or w is 2 or larger, the multiple $R^a$ or $R^b$ groups contained in the molecule may be the same or different, and any adjacent $R^a$ or $R^b$ groups may be bonded to each other to form a ring.)

[Chem. 27]

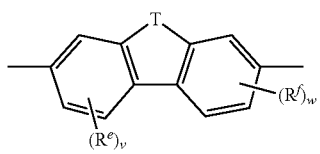

(VII)

(In formula (VII), $R^e$ and $R^f$ each independently have the same meaning as the $R^a$ to $R^d$ contained in formula (VI). Symbols v and w respectively have the same meanings as the v and w contained in formula (VI), and each independently represent an integer of 0-3. When v or w is 2 or larger, the multiple $R^e$ or $R^f$ groups contained in the molecule may be the same or different, and any adjacent $R^e$ or $R^f$ groups may be bonded to each other to form a ring. T represents an atom or a group of atoms, the atom or the group constituting a 5- or 6-membered ring.)

Examples of T include —O—, —BR—, —NR—, —SiR$_2$—, —PR—, —SR—, —CR$_2$—, or a group constituted of such atoms or groups bonded to each other. R represents a hydrogen atom or any organic group. The term "organic group" in the invention means a group which contains at least one carbon atom.

It is preferable that the polyarylene derivatives should further have a repeating unit represented by the following formula (VIII), besides the repeating units constituted of formula (VI) and/or formula (VII).

[Chem. 28]

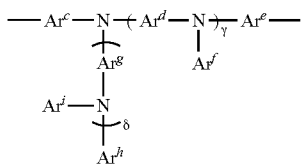

(VIII)

(In formula (VIII), $Ar^c$ to $Ar^j$ each independently represent an aromatic hydrocarbon group or an aromatic heterocyclic group which each may have a substituent. Symbols γ and δ each independently represent 0 or 1.)

Examples of $Ar^c$ to $Ar^j$ are the same as those of the $Ar^a$ and $Ar^b$ contained in formula (V).

Specific examples of formulae (VI) to (VIII) and specific examples of the polyarylene derivatives include the same examples as those shown in JP-A-2008-98619.

In the case where the hole transport layer 4 is formed by a wet film formation method, a composition for hole transport layer formation is prepared and thereafter applied to form a film thereof by a wet process and the coating film is dried by heating, in the same manner as for the formation of the hole injection layer 3.

The composition for hole transport layer formation contains a solvent besides the hole-transporting compound described above. The solvent to be used may be the same as the solvent used in the composition for hole injection layer formation. Other conditions including conditions for film formation and conditions for drying by heating may also be the same as in the formation of the hole injection layer 3. Also in the case where the hole transport layer is formed by a vacuum deposition method, the conditions for film formation, etc. may be the same as in the formation of the hole injection layer 3. The hole transport layer 4 may contain various luminescent materials, electron-transporting compounds, binder resins, applicability improvers, etc., besides the hole-transporting compound.

It is also preferable that the hole transport layer 4 should be a layer formed by insolubilizing a compound having an insolubilizing group (hereinafter often referred to as "insolubilizable compound"), from the standpoint of heat resistance or film-forming properties. The insolubilizable compound is a compound having an insolubilizing group, and is insolubilized to thereby form an insoluble polymer.

The insolubilizing group is a group which reacts by the action of heat and/or irradiation with actinic energy rays and which has the effect of making the reacted compound have reduced solubility in organic solvents or water as compared with the solubility of the unreacted compound. In the invention, it is preferable that the insolubilizing group should be a leaving group or a crosslinkable group.

The term "leaving group" means a group that is eliminated at a temperature of 70° C. or higher from the aromatic hydrocarbon ring to which the group has been bonded and that renders the compound soluble in solvents. The expression "soluble in solvents" means that the compound, in the state of having not reacted by the action of heat and/or irradiation with actinic energy rays, dissolves in toluene at ordinary temperature in an amount of 0.1% by weight or more. The solubility of the compound in toluene is preferably 0.5% by weight or higher, more preferably 1% by weight or higher.

This leaving group preferably is a group which is thermally eliminated without leaving a polar group on the aromatic hydrocarbon ring, and more preferably is a group which is thermally eliminated by means of the reverse Diels-Alder reaction. It is also preferable that the leaving group should be a group which is thermally eliminated at 100° C. or higher, and that the leaving group should be a group which is thermally eliminated at 300° C. or lower.

Examples of the crosslinkable group include: groups derived from cyclic ethers such as oxetane and epoxies; groups derived from an unsaturated double bond, such as vinyl, trifluorovinyl, styryl, acryl, methacryloyl, and cinnamoyl; and groups derived from benzocyclobutane.

The insolubilizable compound may be either a monomer, oligomer, or polymer. One insolubilizable compound may be used alone, or any desired two or more insolubilizable compounds may be used in combination in any desired proportion.

It is preferred to use, as the insolubilizable compound, a hole-transporting compound having a crosslinkable group. Examples of the hole-transporting compound include: nitrogen-containing aromatic compound derivatives such as pyridine derivatives, pyrazine derivatives, pyrimidine derivatives, triazine derivatives, quinoline derivatives, phenanthroline derivatives, carbazole derivatives, phthalocyanine derivatives, and porphyrin derivatives; triphenylamine derivatives; silole derivatives; oligothiophene derivatives; fused-ring aromatic derivatives; and metal complexes.

Preferred of these are: nitrogen-containing aromatic derivatives such as pyridine derivatives, pyrazine derivatives, pyrimidine derivatives, triazine derivatives, quinoline derivatives, phenanthroline derivatives, and carbazole derivatives; triphenylamine derivatives; silole derivatives; fused-ring aromatic derivatives; metal complexes; and the like. In particular, triphenylamine derivatives are more preferred.

For forming a hole transport layer 4 by insolubilizing the insolubilizable compound, use is usually made of a method in which the insolubilizable compound is dissolved or dispersed in a solvent to prepare a composition for hole transport layer formation and this composition is applied to form a film thereof by a wet process and insolubilized.

The composition for hole transport layer formation may further contain an applicability improver, such as a leaving agent or an antifoamer, an electron-accepting compound, a binder resin, etc.

The composition for hole transport layer formation contains the insolubilizable compound in a concentration which is usually 0.01% by weight or higher, preferably 0.05% by weight or higher, more preferably 0.1% by weight or higher, and is usually 50% by weight or less, preferably 20% by weight or less, more preferably 10% by weight or less.

The composition for hole transport layer formation which contains the insolubilizable compound in such a concentration is applied on the underlying layer (usually, the hole injection layer 3) to form a film thereof, and the insolubilizable compound is thereafter insolubilized by heating and/or irradiation with actinic energy such as light.

Conditions for the film formation, including temperature and humidity, may be the same as in the wet-process film formation for forming the hole injection layer 3. Techniques for heating after the film formation are not particularly limited. With respect to heating temperature conditions, the temperature is usually 120° C. or higher but is preferably 400° C. or lower. The period of heating is usually 1 minute or longer but is preferably 24 hours or less.

Although means for heating are not particularly limited, use may be made of a method in which the multilayer structure having the layer formed above is placed on a hot plate or heated in an oven. For example, use can be made of conditions under which the multilayer structure is heated on a hot plate at 120° C. or higher for 1 minute or longer.

In the case of insolubilization by irradiation with electromagnetic energy such as light, examples of methods therefor include: a method in which the multilayer structure is irradiated using an ultrahigh-pressure mercury lamp, high-pressure mercury lamp, or the like; or a method in which the multilayer structure is irradiated using a mask aligner or conveyor-type light irradiator which includes any of those light sources built therein.

The thickness of the hole transport layer 4 thus formed is usually 5 nm or larger, preferably 10 nm or larger, and is usually 300 nm or less, preferably 100 nm or less.

[5] Luminescent Layer

A luminescent layer 5 is disposed usually on the hole transport layer 4. The luminescent layer 5 is a layer which, between the electrodes placed in an electric field, is excited by the recombination of holes injected from the anode 2 through the hole injection layer 3 with electrons injected from the cathode 9 through the electron transport layer 7 and which thus serves as the main light-emitting source.

It is preferable that the luminescent layer 5 should contain a luminescent material (dopant) and one or more host materials. Although the luminescent layer 5 may be formed by a vacuum deposition method, it is especially preferable that the luminescent layer 5 should be a layer formed from the composition of the invention by a wet film formation method.

The term wet film formation method herein means a method in which a composition containing a solvent is applied by a wet process, e.g., spin coating, dip coating, die coating, bar coating, blade coating, roll coating, spray coating, capillary coating, ink-jet printing, screen printing, gravure printing, flexographic printing, or the like, to form a film thereof, as stated above.

The luminescent layer 5 may contain other materials and components so long as the performance of the invention is not impaired. In general, in the case of organic electroluminescent elements employing the same materials, a smaller thickness of the layers interposed between the electrodes results in an increase in the intensity of effective electric field and hence in an increase in the quantity of electric current which flows, resulting in a decrease in operating voltage. Consequently, a smaller total thickness of the layers interposed between the electrodes results in a decrease in the operating voltage of the organic electroluminescent element. However, when the total thickness thereof is too small, short-circuiting due to projections of an electrode, e.g., ITO, occurs. Some degree of thickness is therefore necessary.

In the invention, when the organic electroluminescent element has organic layers, such as the hole injection layer 3 and the electron transport layer 7 which will be described later, besides the luminescent layer 5, the total thickness of the luminescent layer 5 and the other organic layers, e.g., the hole injection layer 3 and the electron transport layer 7, is usually 30 nm or larger, preferably 50 nm or larger, more preferably 100 nm or larger, and is usually 1,000 nm or less, preferably 500 nm or less, more preferably 300 nm or less. In the case where layers other than the luminescent layer 5, such as the hole injection layer 3 and the electron injection layer 8 which will be described later, have high electrical conductivity, an increased amount of charges are injected into the luminescent layer 5. In this case, it is possible to use a method in which the operating voltage is lowered while maintaining some degree of total thickness, for example, by increasing the thickness of the hole injection layer 3 and reducing the thickness of the luminescent layer 5.

Therefore, the thickness of the luminescent layer 5 is usually 10 nm or larger, preferably 20 nm or larger, and is usually 300 nm or less, preferably 200 nm or less. In the case where the organic electroluminescent element of the invention has the luminescent layer 5 as the only layer interposed between the anode and the cathode, the thickness of this luminescent layer 5 is usually 30 nm or larger, preferably 50 nm or larger, and is usually 500 nm or less, preferably 300 nm or less.

[6] Hole Blocking Layer

A hole blocking layer 6 is superposed and formed on the luminescent layer 5 so that the hole blocking layer 6 is in contact with the cathode-side boundary of the luminescent layer 5. Especially when a phosphorescent material is used as a luminescent substance or a blue-luminescence material is used, the disposition of a hole blocking layer 6 is effective.

The hole blocking layer 6 has the function of confining holes and electrons in the luminescent layer 5 to improve the luminescent efficiency. Namely, the hole blocking layer 6 not only serves to prevent the holes which have moved from the luminescent layer 5 from reaching the electron transport layer 7 and to thereby increase the probability of recombination with electrons within the luminescent layer 5 and confine the resultant excitons in the luminescent layer 5, but also serves to efficiently transport, toward the luminescent layer 5, the electrons which have been injected from the electron transport layer 7.

Examples of the properties required of the material which constitutes the hole blocking layer 6 include: to have a high electron mobility and a low hole mobility; to have a large energy gap (difference between HOMO and LUMO); and to have a high excited triplet energy level (T1).

Examples of materials for the hole blocking layer which satisfy such requirements include metal complexes such as mixed-ligand complexes, e.g., bis(2-methyl-8-quinolinolato)(phenolato)aluminum and bis(2-methyl-8-quinolinolato)(triphenylsilanolato)aluminum, and dinuclear metal complexes, e.g., bis(2-methyl-8-quinolinolato)aluminum-μ-oxobis(2-methyl-8-quinolinolato)aluminum, styryl compounds such as distyrylbiphenyl derivatives (JP-A-11-242996), triazole derivatives such as 3-(4-biphenylyl)-4-phenyl-5-(4-tert-butylphenyl)-1,2,4-triazole (JP-A-7-41759), and phenanthroline derivatives such as bathocuproine (JP-A-10-79297).

Furthermore, the compound having at least one pyridine ring substituted at the 2-, 4-, and 6-positions which is described in International Publication WO 2005/022962 is also preferred as a hole-blocking material. The thickness of the hole blocking layer 6 is usually 0.3 nm or larger, preferably 0.5 nm or larger, and is usually 100 nm or less, preferably 50 nm or less. Although the hole blocking layer 6 also can be formed by the same method as for the hole injection layer 3, a vacuum deposition method is usually used.

[7] Electron Transport Layer

An electron transport layer 7 is disposed between the hole injection layer 6 and the electron injection layer 8 for the purpose of further improving the luminescent efficiency of the element. The electron transport layer 7 is constituted of a compound which, between the electrodes placed in an electric field, is capable of efficiently transporting, toward the luminescent layer 5, the electrons that have been injected from the cathode 9. It is necessary that the electron-transporting compound to be used for constituting the electron transport layer 7 should be a compound into which electrons can be injected at a high efficiency from the cathode 9 or electron injection layer 8 and which has a high electron mobility and is capable of efficiently transporting injected electrons.

Examples of materials which satisfy such requirements include metal complexes such as an aluminum complex of 8-hydroxyquinoline (JP-A-59-194393), metal complexes of 10-hydroxybenzo [h]quinoline, oxadiazole derivatives, distyrylbiphenyl derivatives, silole derivatives, 3- or 5-hydroxyflavone metal complexes, benzoxazole metal complexes, benzthiazole metal complexes, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N'-dicyanoanthraquinonediimine, n-type hydrogenated amorphous silicon carbide, n-type zinc sulfide, and n-type zinc selenide.

The thickness of the electron transport layer 7 is as follows. The lower limit thereof is usually about 1 nm, preferably about 5 nm, and the upper limit thereof is usually about 300 nm, preferably about 100 nm.

Although the electron transport layer 7 may be formed by a wet film formation method or a vacuum deposition method in the same manner as for the hole injection layer 3, a vacuum deposition method is usually used.

[8] Electron Injection Layer

The electron injection layer 8 serves to efficiently inject, into the luminescent layer 5, the electrons injected from the cathode 9. From the standpoint of efficient electron injection, it is preferable that the material to be used for forming the electron injection layer 8 should be a metal having a low work function, and use is made of an alkali metal such as sodium or cesium or an alkaline earth metal such as barium or calcium. It is preferable that the thickness of the electron injection layer 8 should be 0.1-5 nm.

To interpose an ultrathin insulating film (0.1-5 nm) of LiF, $MgF_2$, $Li_2O$, $Cs_2CO_3$, or the like between the cathode 9 and the electron transport layer 7 is also an effective method for improving the efficiency of the element (*Appl. Phys. Lett.*, Vol. 70, p. 152, 1997; JP-A-10-74586; *IEEE Trans. Electron. Devices*, Vol. 44, p. 1245, 1997; *SID* 04 *Digest*, p. 154). Furthermore, to dope an organic electron-transporting material represented by a nitrogen-containing heterocyclic compound, such as bathophenanthroline, or by a metal complex, such as an aluminum complex of 8-hydroxyquinoline, with an alkali metal such as sodium, potassium, cesium, lithium, or rubidium (described in JP-A-10-270171, JP-A-2002-100478, JP-A-2002-100482, etc.) is preferred because this doped material has improved electron injection/transport properties and is capable of combining these properties and excellent film quality. The thickness of the layer in this case is usually 5 nm or larger, preferably 10 nm or larger, and is usually 200 nm or less, preferably 100 nm or less.

The electron injection layer 8 may be formed by a wet film formation method or a vacuum deposition method in the same manner as for the luminescent layer 5. In the case of a vacuum deposition method, an evaporation source is placed in a crucible or metallic boat disposed in a vacuum vessel, and this vacuum vessel is evacuated to about $10^{-4}$ Pa with an appropriate vacuum pump. Thereafter, the crucible or the metallic boat is heated to vaporize the evaporation source to form an electron injection layer on the substrate placed so as to face the crucible or metallic boat.

For vacuum-depositing an alkali metal, use is made of an alkali metal dispenser obtained by filling nichrome with an alkali metal chromate and with a reducing agent. By heating this dispenser in a vacuum vessel, the alkali metal chromate is reduced and the alkali metal is vaporized. In the case where an organic electron transport material and an alkali metal are co-deposited, the procedure is as follows. The organic electron transport material is placed in a crucible disposed in a vacuum vessel, and this vacuum vessel is evacuated to about $10^{-4}$ Pa with an appropriate vacuum pump. Thereafter, each crucible and the dispenser are simultaneously heated to vaporize the materials and form an electron injection layer on the substrate disposed so as to face the crucible and the dispenser.

In this operation, the materials are co-deposited evenly along the thickness direction of the electron injection layer 8. However, there may be a concentration distribution in the film thickness direction.

[9] Cathode

The cathode 9 serves to inject electrons into the layer located on the luminescent-layer side (the electron injection layer 8 or the luminescent layer 5, etc.). The material used as the anode 2 can be used as the cathode 9. However, from the standpoint of efficient electron injection, a metal having a low work function is preferred, and use is made of an appropriate metal such as, for example, tin, magnesium, indium, calcium, aluminum, or silver or an alloy thereof. Specific examples thereof include alloy electrodes having a low work function, such as magnesium-silver alloys, magnesium-indium alloys, and aluminum-lithium alloys.

The thickness of the cathode 9 is usually the same as the anode 2.

A layer of a metal having a high work function and stable to the air may be superposed thereon for the purpose of protecting the cathode constituted of a metal having a low work function. Thus, the stability of the organic electroluminescent element can be enhanced. Metals usable for this purpose are aluminum, silver, copper, nickel, chromium, gold, platinum, etc.

[10] Other Constituent Layers

The explanations given above were mainly on elements having the layer configuration shown in FIG. 1. However, the organic electroluminescent element of the invention may have any desired layers, besides the layers explained above, between the anode 2 and the luminescent layer 5 and between the cathode 9 and the luminescent layer 5 unless the performance of the element is impaired thereby. Furthermore, any layer other than the luminescent layer 5 may be omitted.

To dispose an electron blocking layer between the hole transport layer 4 and the luminescent layer 5 for the same purpose as the hole blocking layer 6 is also effective. The electron blocking layer not only serves to prevent the electrons which have moved from the luminescent layer 5 from reaching the hole transport layer 4 and to thereby increase the probability of recombination with holes within the luminescent layer 5 and confine the resultant excitons in the luminescent layer 5, but also serves to efficiently transport, toward the luminescent layer 5, the holes which have been injected from the hole transport layer 4.

Examples of the properties required of the electron blocking layer include: to have high hole transport properties; to have a large energy gap (difference between HOMO and LUMO); and to have a high excited triplet energy level (T1). In the case where the luminescent layer 5 is formed by a wet film formation method, it is preferable that the electron blocking layer also should be formed by a wet film formation method, because this process facilitates the element production.

Consequently, it is preferable that the electron blocking layer also should have suitability for wet-process film formation. Examples of materials usable for such an electron blocking layer include copolymers of dioctylfluorene and triphenylamine which are represented by F8-TFB (International Publication WO 2004/084260).

Incidentally, the structure which is the reverse of the structure shown in FIG. 1 is possible. Namely, it possible to superpose a cathode 9, electron injection layer 8, electron transport layer 7, hole blocking layer 6, luminescent layer 5, hole transport layer 4, hole injection layer 3, and anode 2 in this order on a substrate 1. It is also possible to dispose an organic electroluminescent element of the invention between two substrates, at least one of which is highly transparent.

Furthermore, a structure constituted of a stack of stages each having the layer configuration shown in FIG. 1 (i.e., a structure composed of a plurality of stacked light-emitting units) is also possible. In this case, when a charge generation layer made of, for example, $V_2O_5$ is used in place of the interfacial layers located between the stages (i.e., between the light-emitting units) (when the anode is ITO and the cathode is aluminum, the interfacial layers are these two layers), then the barrier between the stages is reduced. This configuration is more preferred from the standpoints of luminescent efficiency and operating voltage.

The organic electroluminescent element of the invention is applicable to any of single elements, elements of a structure in which the elements have been disposed in an array arrangement, a structure in which anodes and cathodes have been disposed in an X-Y matrix arrangement, and the like.

<Display Device and Lighting Device>

The display device and lighting device of the invention employ the organic electroluminescent element of the invention described above. The display device and lighting device of the invention are not particularly limited in the type and structure thereof, and can be assembled using the organic electroluminescent element of the invention in accordance with ordinary methods.

For example, the display device and lighting device of the invention can be produced by methods such as those described in *Yūki EL Disupurei* (Ohmsha, Ltd., published on Aug. 20, 2004, written by TOKITO Shizuo, ADACHI Chihaya, and MURATA Hideyuki).

EXAMPLES

The invention will be explained below in more detail by reference to Examples. However, the invention should not be construed as being limited to the following Examples unless the invention departs from the spirit thereof. Incidentally, the various conditions and values of evaluation results which are given in the following Examples mean preferred upper-limit or lower-limit values in embodiments of the invention. Preferred ranges each may be one which is determined by a combination of the upper limit or lower limit shown above and either the value obtained in any of the following Examples or the values obtained in two or more of the following Examples.

<Synthesis of Compound (D-1) of the Invention>

(Synthesis of Intermediate 1)

[Chem. 29]

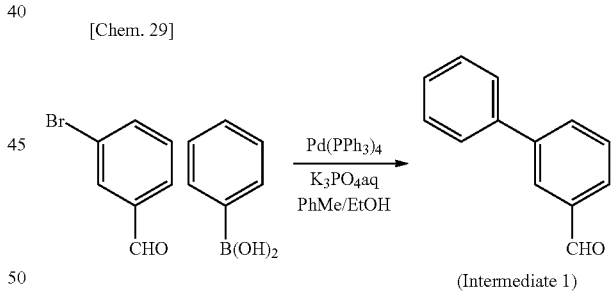

(Intermediate 1)

3-Bromobenzaldehyde (25.0 g, 0.135 mol), phenylboronic acid (17.4 g, 0.143 mol), a toluene/ethanol mixed solution (3:1, 280 mL), and an aqueous tripotassium phosphate (2.0 M, 180 mL) were introduced in this order. Thereafter, nitrogen bubbling was conducted for 60 minutes. Thereto was added Pd(PPh$_3$)$_4$ (4.12 g, 3.37 mmol). The resultant mixture was stirred for 3.5 hours while heating the mixture with refluxing. After the mixture was returned to room temperature, distilled water was added thereto and the resultant mixture was extracted with toluene. The organic layer was washed with saturated aqueous sodium chloride solution and dried with magnesium sulfate. Thereafter, the solvent was distilled off under reduced pressure. The residue was subjected to silica gel column chromatography to obtain intermediate 1 (21.0 g; yield, 85%).

(Synthesis of Intermediate 2)

[Chem. 30]

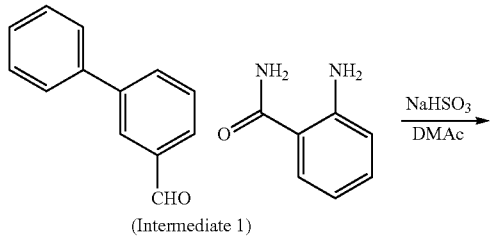

(Intermediate 2)

Intermediate 1 (20.9 g, 0.114 mol), 2-aminobenzamide (15.6 g, 0.114 mol), N,N-dimethylacetamide (DMAc) (110 mL), and NaHSO$_3$ (23.9 g, 0.230 mol) were introduced in this order, and this mixture was stirred at 120° C. for 11 hours. The resultant liquid reaction mixture was allowed to cool and then poured into 800 mL of water, and this mixture was subjected to suction filtration. The matter recovered by filtration was washed with water and ethanol and dried to thereby obtain intermediate 2 (29.9 g; yield, 87%).

(Synthesis of Intermediate 3)

[Chem. 31]

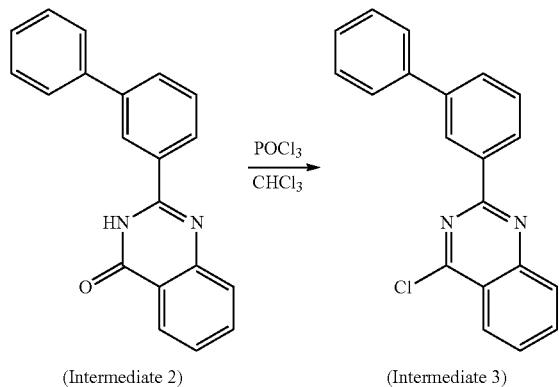

(Intermediate 2)    (Intermediate 3)

Intermediate 2 (10.9 g, 36.5 mmol) and chloroform (50 mL) were introduced in this order. Thereafter, POCl$_3$ (16 mL) was gradually added dropwise thereto. This mixture was refluxed for 4.5 hours, subsequently returned to room temperature, and then poured into ice water. The aqueous phase was made alkaline using an aqueous sodium hydroxide solution and extracted with methylene chloride, and the organic layer was dried with MgSO$_4$ and concentrated under reduced pressure. The concentrate was subjected to silica gel column chromatography to obtain intermediate 3 (10.8 g, quant.).

(Synthesis of Intermediate 4)

[Chem. 32]

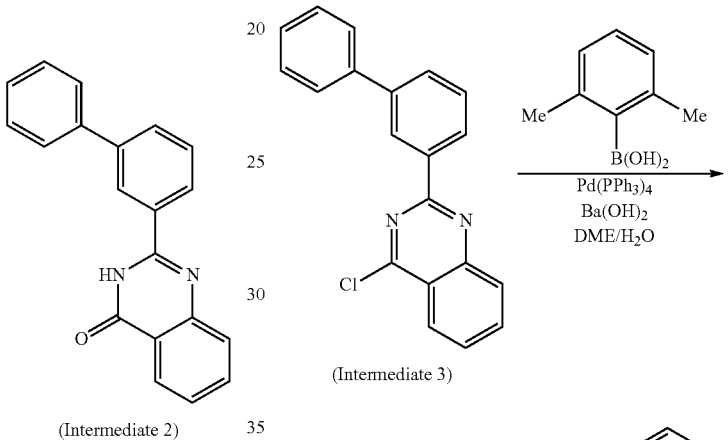

(Intermediate 3)

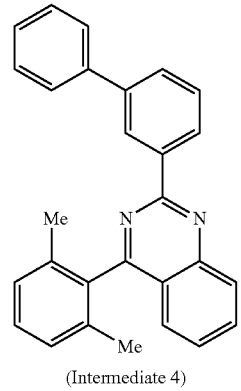

(Intermediate 4)

Intermediate 3 (10.2 g, 32.2 mmol), 2,6-dimethylphenylboronic acid (5.0 g, 33.2 mmol), dimethyl ether (DME) (110 mL), and distilled water (110 mL) were introduced in this order. Thereafter, nitrogen bubbling was conducted for 30 minutes. Thereto were added Pd(PPh$_3$)$_4$ (1.12 g, 0.969 mmol) and Ba(OH)$_2$ (20.4 g, 64.6 mmol). This mixture was heated with refluxing for 1 hour. After the reaction mixture was allowed to cool, water was added thereto and the resultant mixture was extracted with methylene chloride. The organic phase was dried with MgSO$_4$ and concentrated under reduced pressure. The concentrate was subjected to silica gel column chromatography to obtain intermediate 4 (7.75 g; yield, 62%).

(Synthesis of Intermediate 5)

[Chem. 33]

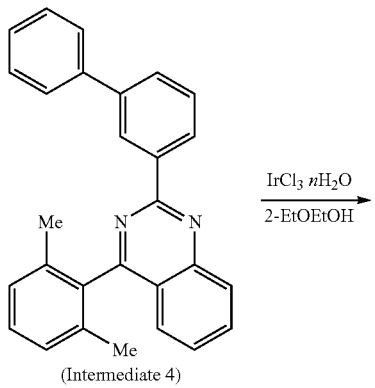

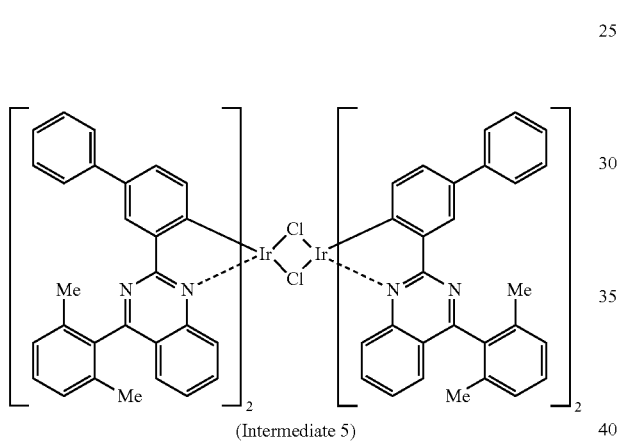

Intermediate 4 (5.4 g, 14.0 mmol), IrCl$_3$·nH$_2$O (2.47 g, 6.67 mmol), 2-EtOEtOH (55 mL), and H$_2$O (16 mL) were introduced in this order, and nitrogen bubbling was conducted for 45 minutes. The mixture was heated at 110-145° C. for 10 hours and allowed to cool. Ethanol and water were added to the liquid reaction mixture, and the resultant mixture was subjected to suction filtration. The matter recovered by filtration was washed with ethanol and dried to thereby obtain intermediate 5 (5.40 g; yield, 84%).

(Synthesis of Intermediate 11)

[Chem. 34]

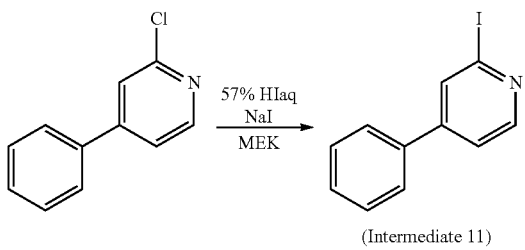

4-Phenyl-2-chloropyridine (40 g), sodium iodide (177 g), and methyl ethyl ketone (MEK) (350 mL) solution were introduced in this order, and nitrogen bubbling was conducted for 20 minutes. Thereto was added 57% aqueous hydrogen iodide solution (47.3 g). This mixture was heated with refluxing for 17 hours. After the reaction mixture was returned to room temperature, water was added thereto and the resultant mixture was extracted with methylene chloride. The organic layer was washed with saturated aqueous sodium chloride solution and dried with MgSO$_4$, and the solvent was distilled off under reduced pressure. The residue was purified by silica gel column chromatography to obtain intermediate 11 (50.8 g), which had a purity of 88%. Incidentally, the 4-phenyl-2-chloropyridine was synthesized with reference to the method described in International Publication WO 2010/094242.

(Synthesis of Intermediate 12)

[Chem. 35]

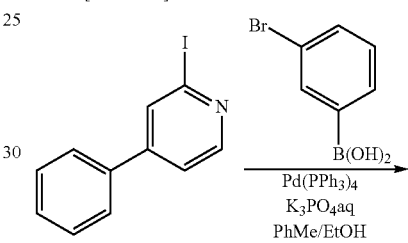

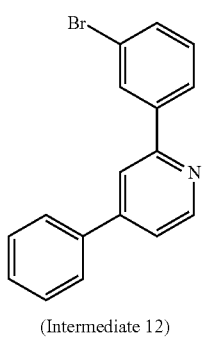

Intermediate 11 (purity, 88%; 50.8 g), 3-bromophenylboronic acid (33.2 g), toluene (232 mL), ethanol (186 mL), and an aqueous tripotassium phosphate solution (2.0 mol/L, 186 mL) were introduced in this order. Thereafter, nitrogen bubbling was conducted at 60° C. for 30 minutes. Thereto was added Pd(PPh$_3$)$_4$ (3.82 g). The resultant mixture was stirred for 3.5 hours while heating the mixture with refluxing. After the mixture was returned to room temperature, distilled water was added thereto and the resultant mixture was extracted with toluene. The organic layer was washed with saturated aqueous sodium chloride solution and dried with magnesium sulfate. Thereafter, the solvent was distilled off under reduced pressure. The residue was subjected to silica gel column chromatography to obtain intermediate 12 (31.0 g; yield, 60%). Incidentally, the 3-bromophenylboronic acid used was one manufactured by Tokyo Kasei Kogyo Co., Ltd.

(Synthesis of Intermediate 6)

[Chem. 36]

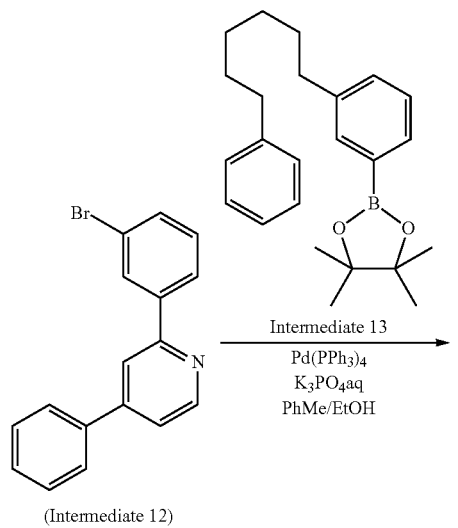

(Intermediate 12)

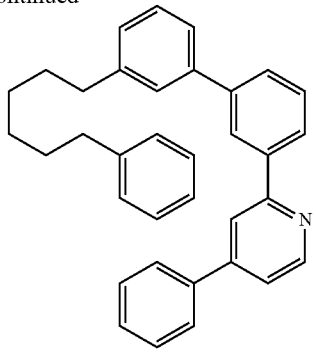

(Intermediate 6)

Intermediate 12 (25.5 g), intermediate 13 (32.9 g), toluene (127 mL), ethanol (102 mL), and an aqueous tripotassium phosphate solution (2.0 mol/L, 102 mL) were introduced in this order. Thereafter, nitrogen bubbling was conducted at 60° C. for 30 minutes. Thereto was added Pd(PPh$_3$)$_4$ (1.89 g). The resultant mixture was stirred for 3 hours while heating the mixture with refluxing. After the mixture was returned to room temperature, distilled water was added thereto and the resultant mixture was extracted with toluene. The organic layer was washed with saturated aqueous sodium chloride solution and dried with magnesium sulfate. Thereafter, the solvent was distilled off under reduced pressure. The residue was subjected to silica gel column chromatography to obtain intermediate 6 (21.7 g; yield, 56%). Incidentally, the intermediate 13 was synthesized with reference to the method described in German Patent Application Publication No. 102009023154.

(Synthesis of Compound D-1)

[Chem. 37]

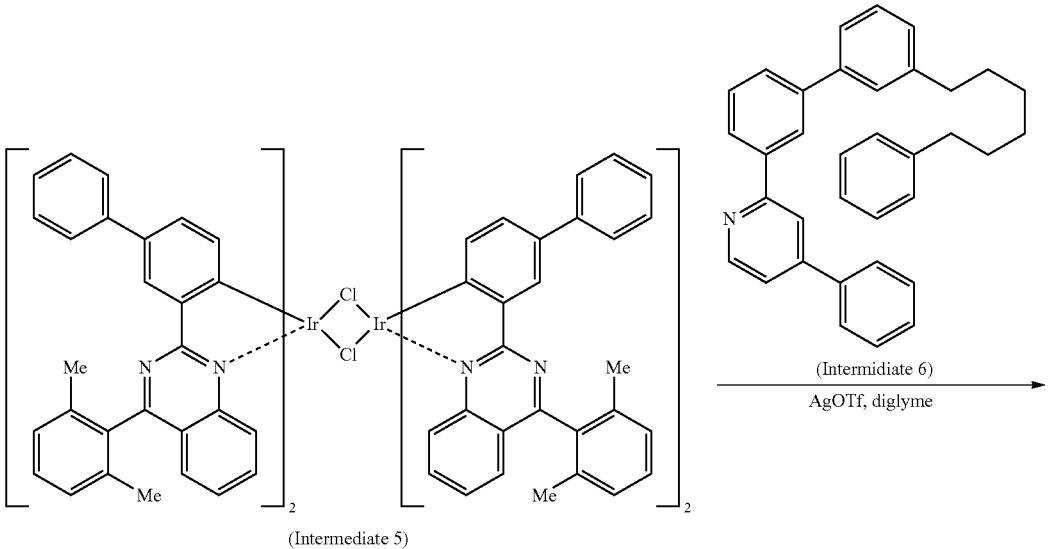

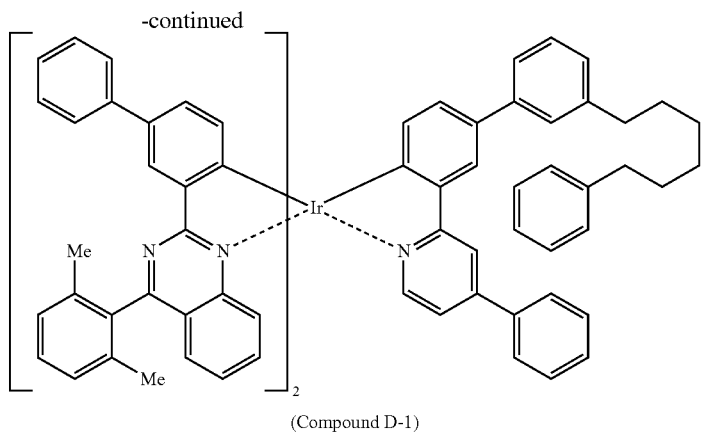

(Compound D-1)

Intermediate 5 (2.54 g, 1.27 mmol), intermediate 6 (1.19 g, 2.54 mmol), and diglyme (40 mL) were introduced in this order. Thereafter, nitrogen bubbling was conducted for 45 minutes. Thereto was added silver triflate (AgOTf) (0.78 g, 3.04 mmol). This mixture was stirred with heating at 150° C. for 1 hour. After the mixture was returned to room temperature, activated clay was added thereto and the resultant mixture was subjected to suction filtration. The filtrate was concentrated under reduced pressure. The residue was subjected to column chromatography to obtain compound D-1 (351 mg; yield, 10%).

The results of $^1$H-NMR analysis of the compound obtained are shown below.

$^1$H-NMR (CDCl$_3$, ppm); 8.72 (d, 1H), 8.67 (d, 1H), 8.13 (d, 1H), 8.04 (d, 1H), 7.96 (d, 1H), 7.80 (d, 1H), 7.70-7.64 (m, 6H), 7.55-7.02 (m, 35H), 6.90 (t, 2H), 6.79 (d, 1H), 2.64-2.56 (m, 4H), 2.17 (s, 3H), 2.11 (s, 3H), 1.97 (s, 3H), 1.82 (s, 3H), 1.65-1.59 (m, 4H), 1.38-1.36 (m, 4H).

<Synthesis of Compound (D-2) of the Invention>

[Chem. 38]

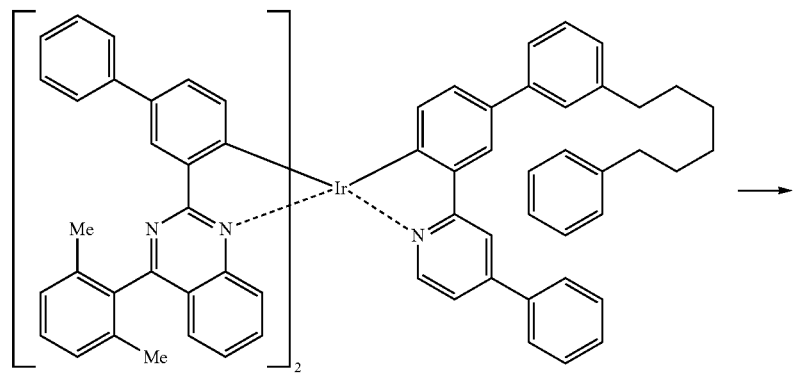

(Compound D-1)

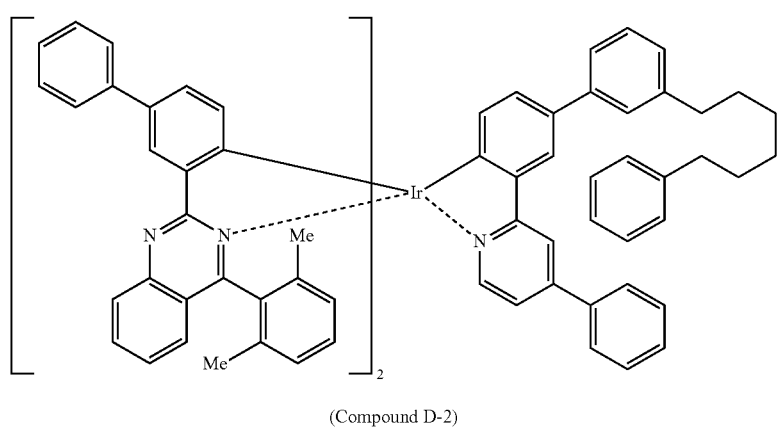

(Compound D-2)

Compound D-1 (255 mg) was dissolved in diethylene glycol monoethyl ether, and this solution was heated at 200° C. for 2 hours in a nitrogen atmosphere. After the resultant reaction mixture was returned to room temperature, toluene was added thereto. The organic phase was washed with water and an aqueous sodium chloride solution, dried with MgSO₄, and concentrated under reduced pressure. The residue was subjected to column chromatography to obtain compound D-2 (47 mg).

The results of $^1$H-NMR analysis of the compound obtained are shown below.

$^1$H-NMR (CDCl₃, ppm); 8.85 (d, 1H), 8.55 (d, 1H), 8.25-8.22 (m, 2H), 8.00 (m, 1H), 7.91-7.87 (m, 1H), 7.78-7.76 (m, 2H), 7.70-7.66 (m, 4H), 7.52-6.96 (m, 32H), 6.84 (d, 2H), 6.63 (d, 1H), 6.40 (d, 1H), 6.29 (t, 1H), 5.77 (d, 1H), 2.59-2.55 (m, 4H), 2.41 (s, 3H), 2.03 (s, 3H), 1.60-1.55 (m, 4H), 1.36-1.32 (m, 7H), 0.84 (s, 3H).

<Synthesis of Compound (D-3) of the Invention>
(Synthesis of Intermediate 7)

[Chem. 39]

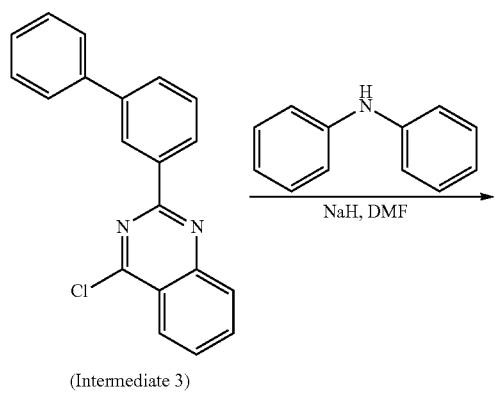

(Intermediate 3)

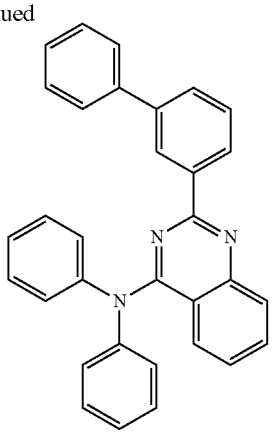

(Intermediate 7)

In a dry nitrogen atmosphere, a dehydrated-DMF (N,N-dimethylformamide) solution (50 mL) of diphenylamine (9.41 g, 55.6 mmol) was introduced into a dried flask, which was then cooled with an ice bath. A dispersion of sodium hydride in liquid paraffin (55%, 3.63 g, 83.2 mmol) was added thereto little by little, and the mixture was stirred at room temperature for 1 hour. While the mixture was being cooled using an ice bath again, a dehydrated-DMF solution (80 mL) of intermediate 3 (13.3 g, 44.5 mmol) was gradually added dropwise thereto. Thereafter, the resultant mixture was stirred at room temperature for 24 hours. Ice was gradually added thereto. After it was ascertained that the mixture had come not to froth, water and toluene were added thereto and the organic phase was separated. The organic phase was washed three times with saturated aqueous sodium chloride solution, dried with MgSO₄, and concentrated under reduced pressure. The residue was subjected to silica gel column chromatography to obtain intermediate 7 (14.8 g; yield, 59%).

(Synthesis of Intermediate 8)

[Chem. 40]

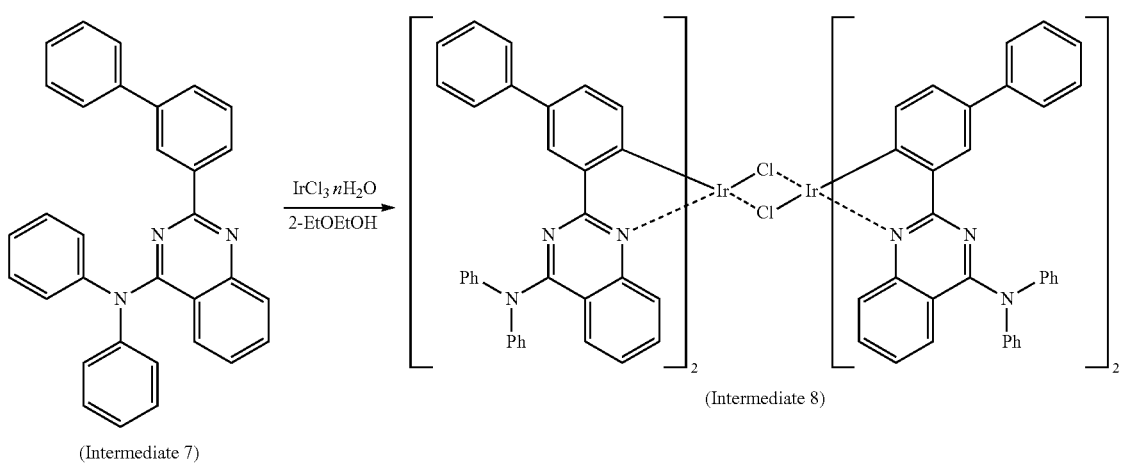

(Intermediate 7)

(Intermediate 8)

Intermediate 7 (12.0 g, 26.7 mmol), IrCl₃.nH₂O (4.70 g, 12.7 mmol), 2-EtOEtOH (120 mL), and H₂O (36 mL) were introduced in this order, and nitrogen bubbling was conducted for 45 minutes. The mixture was heated at 110-145° C. for 20 hours and allowed to cool. Methylene chloride was added to the liquid reaction mixture. Thereafter, the organic phase was washed with water and an aqueous sodium chloride solution and concentrated under reduced pressure. Ethanol was added to the residue, and the crystals precipitated were taken out by suction filtration. The matter recovered by filtration was washed with ethanol and dried to thereby obtain intermediate 8 (9.93 g; yield, 65%).

(Synthesis of Compound D-3)

Intermediate 8 (5.06 g, 2.25 mmol), intermediate 6 (4.20 g, 8.98 mmol), and diglyme (70 mL) were introduced in this order. Thereafter, nitrogen bubbling was conducted for 45 minutes. Thereto was added silver triflate (AgOTf) (1.39 g, 5.41 mmol). This mixture was stirred with heating at 150° C. for 1 hour. After the mixture was returned to room temperature, activated clay was added thereto and the resultant mixture was subjected to suction filtration. The filtrate was concentrated under reduced pressure. The residue was subjected to column chromatography to obtain compound D-3 (895 mg; yield, 13%).

The results of ¹H-NMR analysis of the compound obtained are shown below.

¹H-NMR (CDCl₃, ppm); 8.19 (s, 2H), 7.99-7.95 (m, 4H), 7.89 (d, 1H), 7.70-7.66 (m, 4H), 7.51-7.05 (m, 47H), 6.96-6.82 (m, 4H), 2.65-2.56 (m, 8H), 1.65-1.58 (m, 8H), 1.38-1.36 (m, 8H).

[Chem. 41]

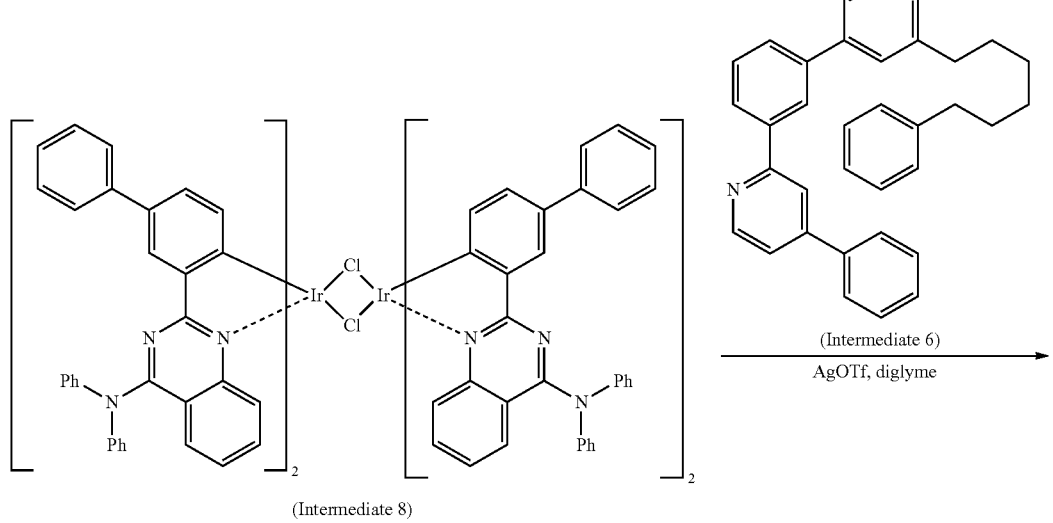

(Intermediate 8)

(Intermediate 6)
AgOTf, diglyme

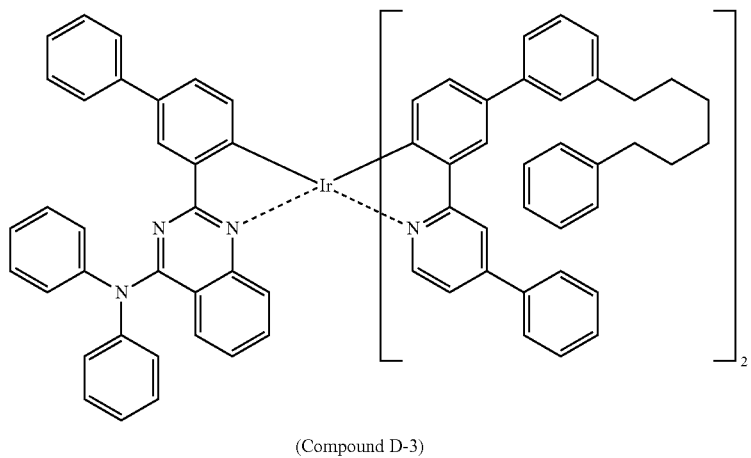

(Compound D-3)

<Synthesis of Comparative Compound D-4>

[Chem. 42]

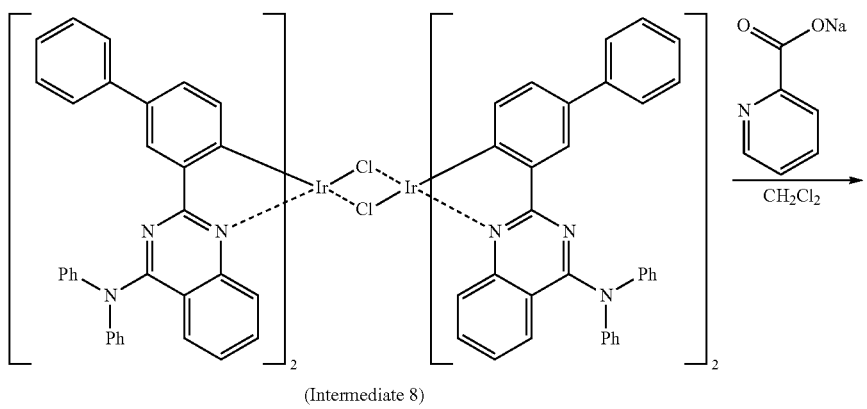

(Intermediate 8)

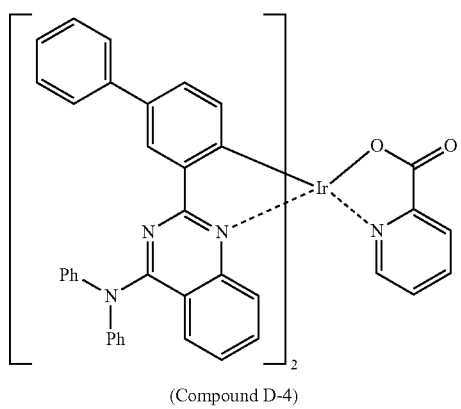

(Compound D-4)

Sodium picolinate (0.19 g, 1.33 mmol) was added to a methylene chloride solution (50 mL) of intermediate 8 (0.50 g, 0.44 mmol), and this mixture was stirred for 6 hours. After water was added thereto, the organic phase was separated, dried with MgSO$_4$, and concentrated under reduced pressure. The residue was subjected to column chromatography and crystallized with ethanol to thereby obtain compound D-4 (0.20 g; yield, 37%).

The results of $^1$H-NMR analysis of the compound obtained are shown below.

$^1$H-NMR (dimethyl sulfoxide (DMSO)-d$_6$, ppm); 8.53 (d, 1H), 8.04-7.98 (m, 2H), 7.83-7.80 (m, 1H), 7.75-7.69 (m, 2H), 7.59-7.34 (m, 30H), 7.30-7.09 (m, 8H), 7.01-6.96 (m, 2H), 6.73 (d, 1H), 6.31 (d, 1H).

<Test for Evaluating Solubility and Composition Storage Stability>

Example 1

A 1.5-mg portion of compound D-1 was weighed out and introduced into a brown sample bottle, and phenylcyclohexane was added thereto to adjust the total amount to 100 mg. The compound D-1 was completely dissolved to prepare a composition containing compound D-1 (solid concentration: 1.5% by weight). The composition prepared was placed in the dark having a room temperature of about 15-20° C., and the period required for a solid to separate out therein was measured. Whether a solid had separated out was visually ascertained using a 10-power magnifying lens. The results thereof are summarized in Table 1.

Examples 2 and 3 and Comparative Example 1

Compositions were prepared and the period required for a solid to separate out was measured, in the same manner as in Example 1, except that the iridium complex compounds shown in Table 1 were used in place of the compound D-1. The results thereof were summarized in Table 1.

Comparative Example 2

It was attempted to prepare a composition in the same manner as in Example 1, except that Ir(piq)$_3$ was used in place of the compound D-1. However, the solid matter did not dissolve completely. The results thereof are summarized in Table 1.

The structures of the compounds used are shown below together.

[Chem. 43]
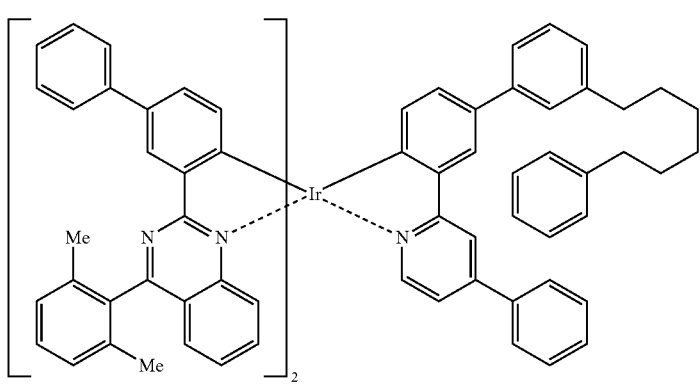
(Compound D-1)
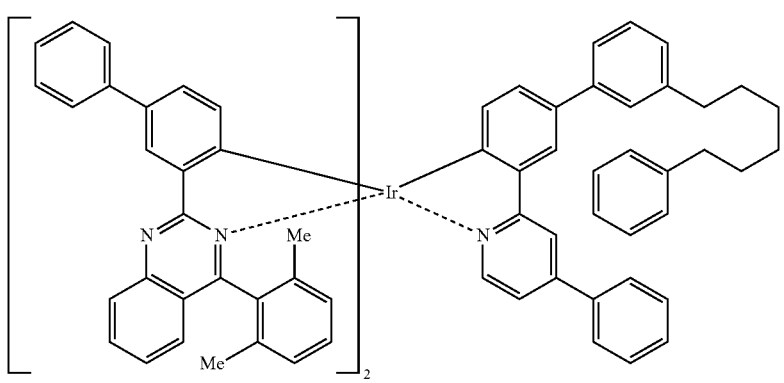
(Compound D-2)
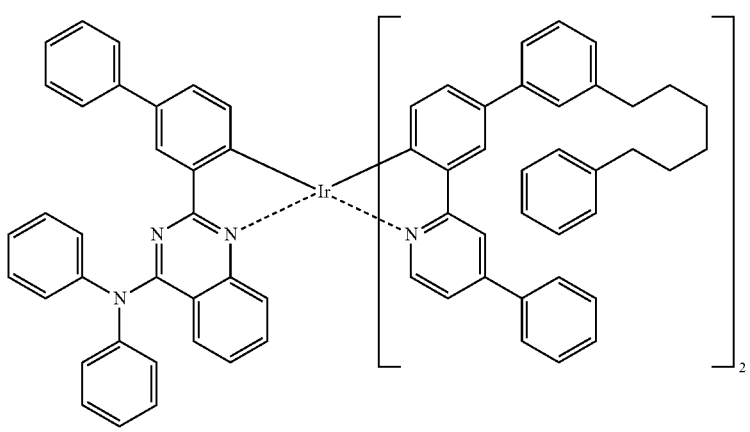
(Compound D-3)
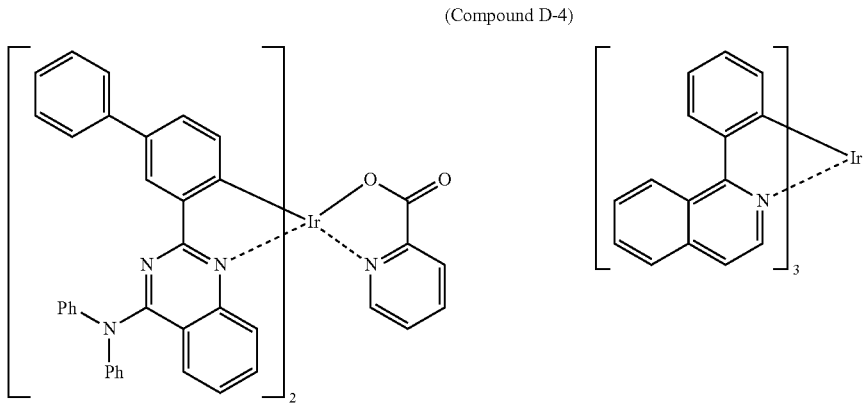
(Compound D-4)     Ir(piq)₃

TABLE 1

|  | Iridium complex compound | Solid concentration of composition | Number of days to solid separating-out |
|---|---|---|---|
| Example 1 | D-1 | 1.25 wt % | >20 days |
| Example 2 | D-2 | 1.25 wt % | >20 days |
| Example 3 | D-3 | 1.25 wt % | >20 days |
| Comparative Example 1 | D-4 | 1.25 wt % | 1 day |
| Comparative Example 2 | Ir(piq)$_3$ | solid remained | — |

As apparent from Table 1, it was understood that the iridium complex compounds of the invention have high solubility in the organic solvent, and the compositions including the iridium complex compounds and the solvent show high storage stability and are usable for producing organic electroluminescent elements by a coating fluid application method.

Example 4

An organic electroluminescent element was produced by the method shown below.

<Production of Organic Electroluminescent Element>

A substrate constituted of a glass substrate and, formed thereon, a transparent conductive film of indium-tin oxide (ITO) deposited in a thickness of 70 nm (sputtering-coated product; manufactured by Geomatec Co., Ltd.) was subjected to patterning into stripes having a width of 2 mm using an ordinary technique of photolithography and etching with hydrochloric acid. Thus, an anode was formed. The ITO substrate which had undergone the patterning was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and finally subjected to ultraviolet/ozone cleaning. This ITO functions as a transparent electrode.

Subsequently, a hole injection layer was formed by a wet film formation method under the following conditions. The high-molecular-weight compound of the following formula (PB-1), which had aromatic amino groups, the high-molecular-weight compound of the following formula (PB-2), which had aromatic amino groups, and the electron-accepting compound (A-1) of the structural formula shown below were used as materials for the hole injection layer, and spin coating was conducted under the following conditions to form an even thin film having a thickness of 40 nm.

[Chem. 44]

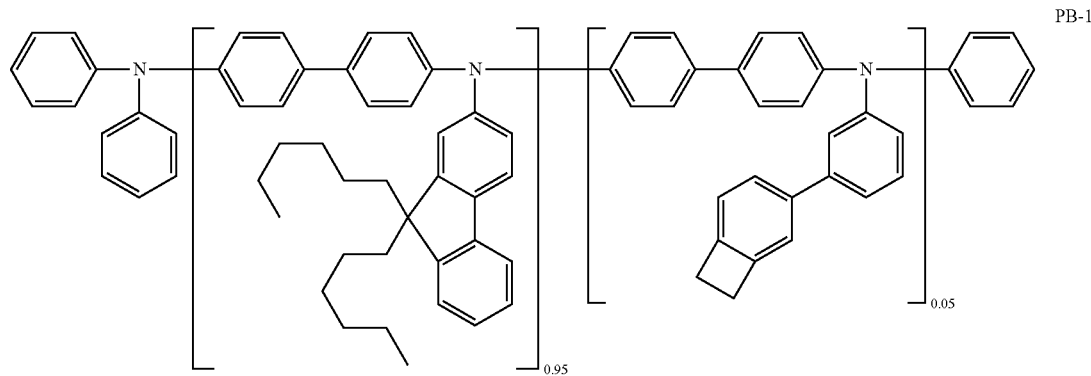

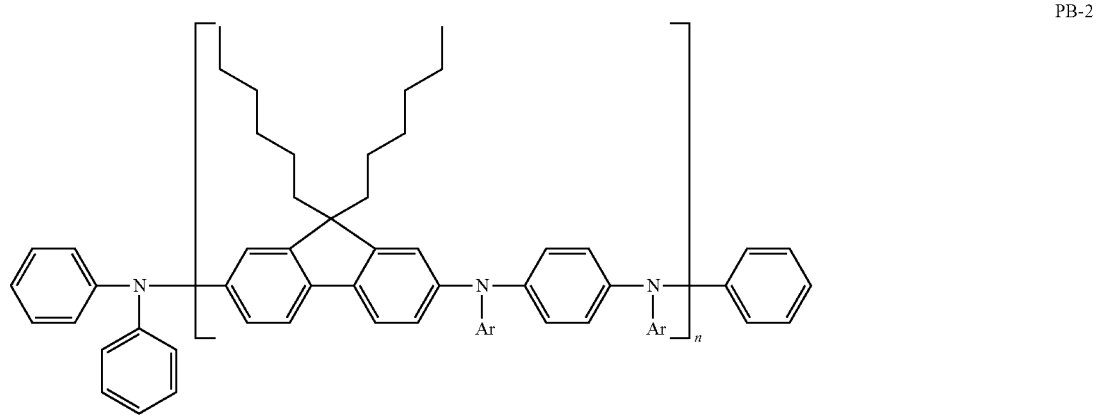

-continued

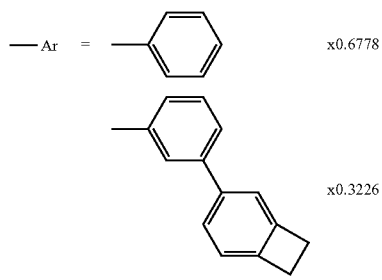

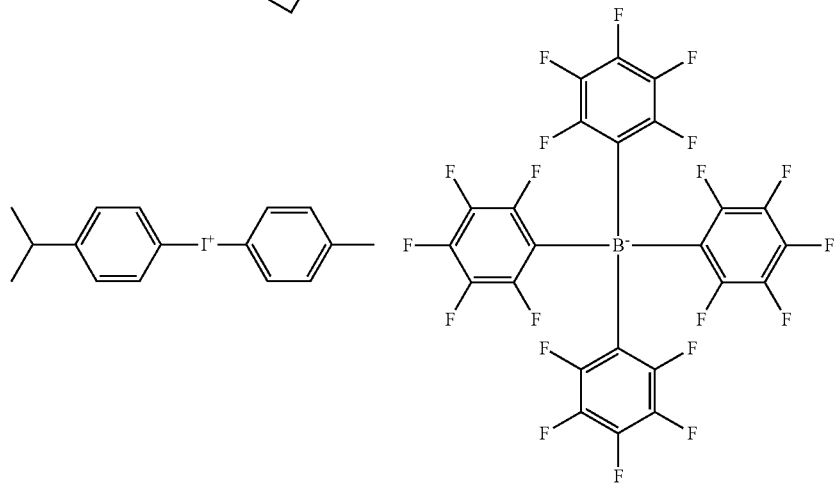

A-1

<Composition for Hole Injection Layer Formation>

| Solvent | ethyl benzoate |
|---|---|
| Concentrations in coating fluid | |
| PB-1 | 0.875% by weight |
| PB-2 | 2.625% by weight |
| A-1 | 0.525% by weight |

<Conditions for Film Formation>

| Spin coating atmosphere | in the air, 23° C. |
|---|---|
| Drying conditions | 230° C. × 60 min |

Subsequently, a hole transport layer was formed by a wet film formation method under the following conditions. A composition for organic electroluminescent elements was prepared using the high-molecular-weight compound having aromatic amino groups which was represented by the following structural formula, i.e., charge transport material (PB-3), as a material for the hole transport layer and using phenylcyclohexane as a solvent. This composition for organic electroluminescent elements was used and applied by spin coating under the following conditions to form a thin film having a thickness of 15 nm.

[Chem. 45]

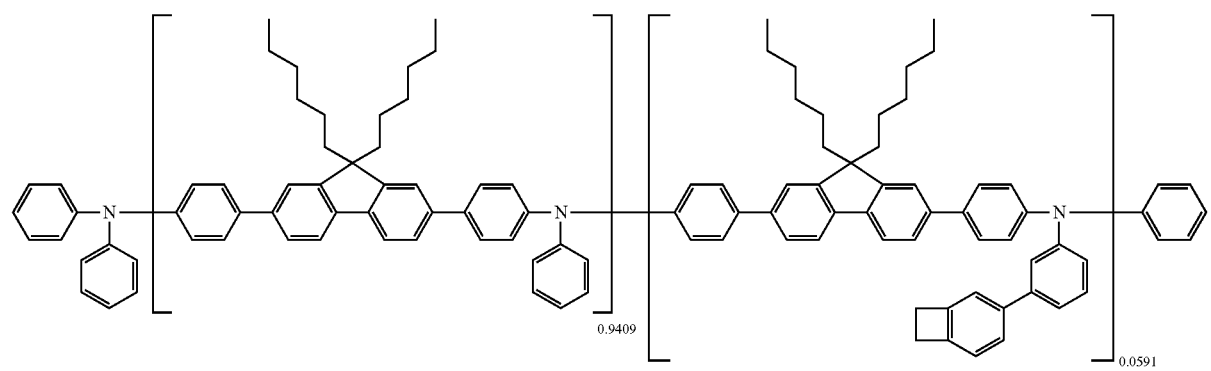

(PB-3)

<Coating Fluid for Hole Transport Layer Formation>

| Solvent | phenylcyclohexane |
|---|---|
| Concentration in coating fluid | 1.0% by weight |

<Conditions for Film Formation>

| Spin coating atmosphere | in nitrogen atmosphere |
|---|---|
| Heating conditions | 230° C., 1 hour (in nitrogen atmosphere) |

Next, a luminescent layer was formed in the following manner. The iridium-complex-compound-containing composition shown below was prepared using the organic compound (H-1) and organic compound (H-2) shown below as charge transport materials and using the iridium complex compound (D-1), which was shown above, as a luminescent material. This composition was applied on the hole transport layer by spin coating under the following conditions to obtain a luminescent layer having a thickness of 50 nm.

[Chem. 46]

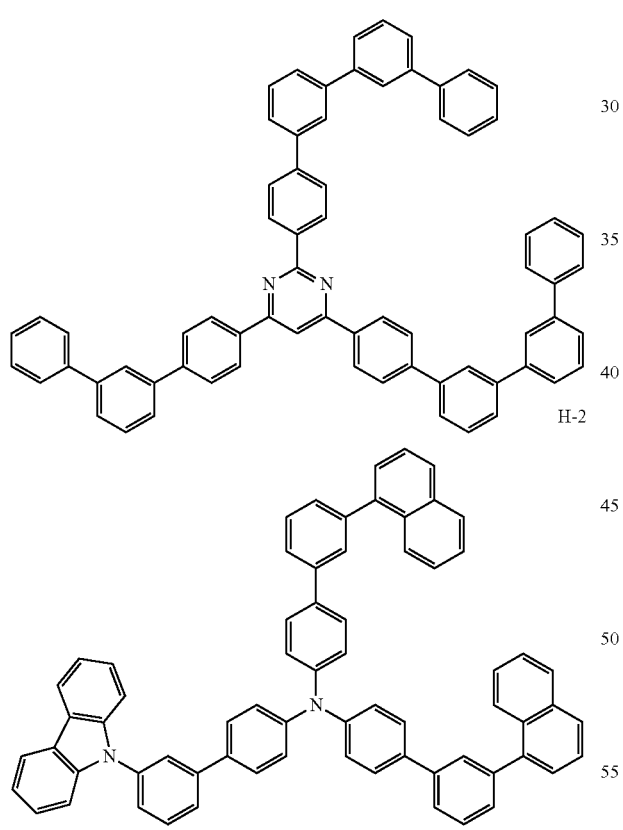

H-1

H-2

<Composition for Luminescent-Layer Formation>

| Solvent | xylene |
|---|---|
| Concentrations in composition | |
| H-1: | 1.0% by weight |
| H-2: | 3.0% by weight |
| D-1: | 0.28% by weight |

<Conditions for Spin Coating>

| Spin coating atmosphere | in dry nitrogen atmosphere, 35° C. |
|---|---|
| Drying conditions | 120° C. × 20 min (in dry nitrogen) |

The substrate on which up to the luminescent layer had been formed was transferred to a vacuum deposition apparatus, which was evacuated until the degree of vacuum within the apparatus became at least $2.0 \times 10^{-4}$ Pa. Thereafter, the organic compound (BAlq) having the structure shown below was deposited on the luminescent layer by a vacuum deposition method while regulating the deposition rate in the range of 0.8-1.2 Å/sec. Thus, a hole blocking layer having a thickness of 10 nm was obtained.

Subsequently, the organic compound (Alq$_3$) having the structure shown below was deposited on the hole blocking layer by a vacuum deposition method which regulating the deposition rate in the range of 0.8-1.2 Å/sec. Thus, an electron transport layer having a thickness of 20 nm was formed.

[Chem. 47]

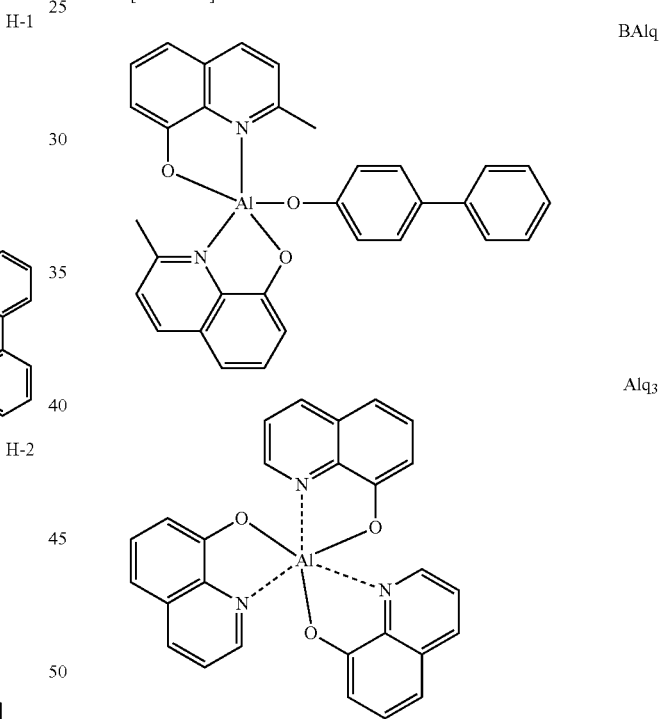

BAlq

Alq$_3$

Here, the element in which the deposition had been conducted up to the electron transport layer was temporarily taken out and disposed in another deposition apparatus. A shadow mask in the form stripes with a width of 2 mm was brought, as a mask for cathode deposition, into close contact with the element so that these stripes were perpendicular to the ITO stripes of the anode. This apparatus was evacuated until the degree of vacuum within the apparatus became at least $2.3 \times 10^{-4}$ Pa.

First, using a molybdenum boat, lithium fluoride (LiF) was deposited at a deposition rate of 0.1 Å/sec to form a film having a thickness of 0.5 nm as an electron injection layer on the electron transport layer 7. Next, aluminum was heated in the same manner by means of a molybdenum boat while regulating the deposition rate in the range of 1.0-4.9 Å/sec. Thus, an aluminum layer having a thickness of 80 nm was formed as a cathode 9. During the deposition of these two layers, the temperature of the substrate was kept at room temperature.

Subsequently, sealing was conducted in the following manner in order to prevent the element from being deteriorated by the action of atmospheric moisture, etc. during storage.

In a gloved nitrogen box, photocurable resin 30Y-437 (manufactured by ThreeBond Co., Ltd.) was applied in a width of about 1 mm to the periphery of a glass plate having a size of 23 mm×23 mm, and a moisture getter sheet (manufactured by Dynic Corp.) was disposed in a central part. The substrate which had undergone the cathode formation was laminated thereto so that the side having the deposited layers faced the desiccant sheet. Thereafter, only the region where the photocurable resin had been applied was irradiated with ultraviolet light to cure the resin.

Thus, an organic electroluminescent element which had a light-emitting area portion having a size of 2 mm×2 mm was obtained. This element emitted red light when a voltage was applied thereto, and exhibited the properties shown in Table 2. In Table 2, the period required for the initial luminance to attenuate to 80% thereof when the element was operated at a constant current density of 20 mA/cm² is shown in terms of relative value.

Examples 5 and 6 and Comparative Example 3

Organic electroluminescent elements were produced in the same manner as in Example 4, except that the iridium complex compound D-1 was replaced with the iridium complex compounds shown in Table 2. These elements emitted red light when a voltage was applied thereto, and exhibited the properties shown in Table 2. In Table 2, the period required for the initial luminance to attenuate to 80% thereof when each element was operated at a constant current density of 20 mA/cm² is shown in terms of relative value.

Comparative Example 4

It was attempted to produce an organic electroluminescent element in the same manner as in Example 4, except that the iridium complex compound D-1 was replaced with Ir(piq)$_3$. However, the solid matter did not dissolve completely when a composition for luminescent-layer formation was produced, and the element was unable to be produced.

TABLE 2

| | Iridium complex compound | Working life LT$_{80}$ in operation at 20 mA/cm² (value for Comparative Example 3 being 1) | Color of luminescence |
|---|---|---|---|
| Example 4 | D-1 | 2.6 | red |
| Example 5 | D-2 | 1.3 | red |
| Example 6 | D-3 | 2.5 | red |
| Comparative Example 3 | D-4 | 1 | red |

As apparent from Table 2, it was understood that the organic electroluminescent elements produced using iridium complex compounds of the invention by a coating fluid application method have a long working life and high electrical durability.

While the invention has been described in detail and with reference to specific embodiments thereof, it will be apparent to one skilled in the art that various changes and modifications can be made therein without departing from the spirit and scope thereof. This application is based on a Japanese patent application filed on Aug. 8, 2012 (Application No. 2012-176097) and a Japanese patent application filed on Sep. 6, 2012 (Application No. 2012-196543), the contents thereof being incorporated herein by reference.

DESCRIPTION OF THE REFERENCE NUMERALS

1 Substrate
2 Anode
3 Hole injection layer
4 Hole transport layer
5 Luminescent layer
6 Hole blocking layer
7 Electron transport layer
8 Electron injection layer
9 Cathode
10 Organic electroluminescent element

The invention claimed is:

1. An iridium complex compound represented by formula (1):

$$Ir(L^1)_m(L^2)_n(L^3)_{3-m-n} \quad (1),$$

wherein:

Ir represents an iridium atom;

L$^1$ to L$^3$ each represent an organic ligand and are bonded to the Ir;

m is an integer of 1 to 2;

n is an integer of 1 to 2, m+n being 3;

if at least one of L$^1$ to L$^3$ is present in plural number, these may be the same or different;

at least one partial structure represented by formula (2) is present in at least one of L$^1$ to L$^3$:

$$Ar^1-X \quad (2);$$

L$^1$ represents a ligand represented by formula (3-1) or (3-2);

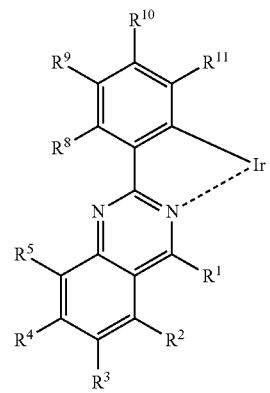

(3-1)

-continued (3-2)

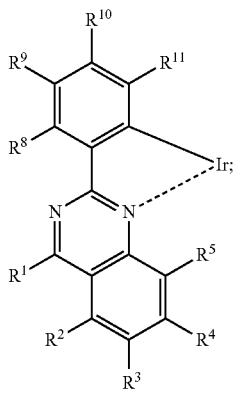

R¹ to R⁵ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, or a (hetero)aryl group having 3-12 ring carbon atoms, wherein the heteroaryl ring does not include a phosphorus atom; the groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms;

R⁸ to R¹¹ each independently represent a hydrogen atom, a fluorine atom, a chlorine atom, a bromine atom, an alkyl group having 1-20 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, or an alkylamino group having 2-20 carbon atoms, such that the groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, an arylamino group having 6-20 carbon atoms, and a (hetero)aryl group having 3-20 carbon atoms;

$L^2$ in formula (1) comprises at least one of the partial structure represented by the formula (2);

$Ar^1$ represents a phenyl group;

in at least one of the partial structure represented by formula (2), X represents an alkyl group substituted with an aryl group having 7-40 carbon atoms;

$L^2$ in formula (1) is a ligand represented by the following formula (4-1):

(4-1)

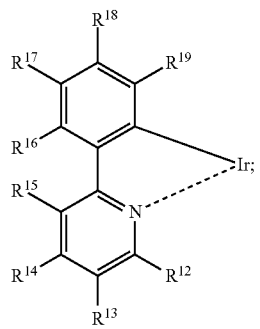

R¹² to R¹⁹ each independently represent a hydrogen atom, a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, or a (hetero)aryl group having 3-20 carbon atoms, such that the groups may be further substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, a (hetero)aryloxy group having 3-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, and a (hetero)aryl group having 3-20 carbon atoms; and the R¹² to R¹⁵ each may be bonded to any adjacent one of the R¹² to R¹⁵ and the R¹⁶ to R¹⁹ each may be bonded to any adjacent one of the R¹⁶ to R¹⁹, through an alkylene group having 3-12 carbon atoms or alkenylene group having 3-12 carbon atoms to form a ring; the R¹⁵ and the R¹⁶ may be bonded to each other through an alkylene group having 3-12 carbon atoms or alkenylene group having 3-12 carbon atoms to form a ring, such that these rings may be substituted with at least one group selected from the group consisting of a fluorine atom, a chlorine atom, a bromine atom, an alkyl group having 1-20 carbon atoms, a (hetero)aralkyl group having 7-40 carbon atoms, an alkoxy group having 1-20 carbon atoms, an alkylsilyl group in which the alkyl group has 1-20 carbon atoms, an arylsilyl group in which the aryl group has 6-20 carbon atoms, an alkylcarbonyl group having 2-20 carbon atoms, an arylcarbonyl group having 7-20 carbon atoms, an alkylamino group having 2-20 carbon atoms, and a (hetero)aryl group having 3-20 carbon atoms; and $R^{17}$ includes the partial structure represented by formula (2).

2. The iridium complex compound according to claim 1, wherein the $R^1$ represents a substituted or unsubstituted alkyl group having 1-20 carbon atoms, a substituted or unsubstituted (hetero)aralkyl group having 7-40 carbon atoms, a substituted or unsubstituted alkylamino group having 2-20 carbon atoms, a substituted or unsubstituted arylamino group having 6-20 carbon atoms, or a substituted or unsubstituted (hetero)aryl group having 3-12 ring carbon atoms, wherein the heteroaryl ring does not include a phosphorus atom.

3. The iridium complex compound according to claim 1, wherein the $R^5$ represents a substituted or unsubstituted alkyl group having 1-20 carbon atoms, a substituted or unsubstituted (hetero)aralkyl group having 7-40 carbon atoms, a substituted or unsubstituted alkylamino group having 2-20 carbon atoms, a substituted or unsubstituted arylamino group having 6-20 carbon atoms, or a substituted or unsubstituted(hetero)aryl group having 3-12 ring carbon atoms, wherein the heteroaryl ring does not include a phosphorus atom.

4. A composition, comprising the iridium complex compound of claim 1 and a solvent.

5. The iridium complex according to claim 1, wherein $L^1$ represents a ligand represented by formula (3-1).

6. The iridium complex compound according to claim 5, wherein the $R^1$ represents a substituted or unsubstituted alkyl group having 1-20 carbon atoms, a substituted or unsubstituted (hetero)aralkyl group having 7-40 carbon atoms, a substituted or unsubstituted alkylamino group having 2-20 carbon atoms, a substituted or unsubstituted arylamino group having 6-20 carbon atoms, or a substituted or unsubstituted (hetero)aryl group having 3-12 ring carbon atoms, wherein the heteroaryl ring does not include a phosphorus atom.

7. The iridium complex compound according to claim 5, wherein the $R^5$ represents a substituted or unsubstituted alkyl group having 1-20 carbon atoms, a substituted or unsubstituted (hetero)aralkyl group having 7-40 carbon atoms, a substituted or unsubstituted alkylamino group having 2-20 carbon atoms, a substituted or unsubstituted arylamino group having 6-20 carbon atoms, or a substituted or unsubstituted(hetero)aryl group having 3-12 ring carbon atoms, wherein the heteroaryl ring does not include a phosphorus atom.

8. The iridium complex according to claim 1, wherein $L^1$ represents a ligand represented by formula (3-2).

9. The iridium complex compound according to claim 8, wherein the $R^1$ represents a substituted or unsubstituted alkyl group having 1-20 carbon atoms, a substituted or unsubstituted (hetero)aralkyl group having 7-40 carbon atoms, a substituted or unsubstituted alkylamino group having 2-20 carbon atoms, a substituted or unsubstituted arylamino group having 6-20 carbon atoms, or a substituted or unsubstituted (hetero)aryl group having 3-12 ring carbon atoms, wherein the heteroaryl ring does not include a phosphorus atom.

10. The iridium complex compound according to claim 8, wherein the $R^5$ represents a substituted or unsubstituted alkyl group having 1-20 carbon atoms, a substituted or unsubstituted (hetero)aralkyl group having 7-40 carbon atoms, a substituted or unsubstituted alkylamino group having 2-20 carbon atoms, a substituted or unsubstituted arylamino group having 6-20 carbon atoms, or a substituted or unsubstituted(hetero)aryl group having 3-12 ring carbon atoms, wherein the heteroaryl ring does not include a phosphorus atom.

11. An organic electroluminescent element, comprising:
 an anode;
 a cathode; and
 at least one organic layer disposed between the anode and the cathode,
 wherein at least one of the organic layer comprises the iridium complex compound of claim 1.

12. The organic electroluminescent element according to claim 11, wherein the organic layer comprising the iridium complex compound is a layer formed using a composition comprising the iridium complex compound.

13. A display device, comprising the organic electroluminescent element according to claim 11.

14. A lighting device, comprising the organic electroluminescent element according to claim 11.

* * * * *